US009029874B2

(12) United States Patent
Horikawa et al.

(10) Patent No.: US 9,029,874 B2
(45) Date of Patent: May 12, 2015

(54) SEMICONDUCTOR DEVICE HAVING A FIRST SILICON CARBIDE SEMICONDUCTOR LAYER AND A SECOND SILICON CARBIDE SEMICONDUCTOR LAYER

(71) Applicant: Panasonic Corporation, Osaka (JP)

(72) Inventors: Nobuyuki Horikawa, Kyoto (JP); Masao Uchida, Osaka (JP); Masahiko Niwayama, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/347,593

(22) PCT Filed: Sep. 12, 2013

(86) PCT No.: PCT/JP2013/005417
§ 371 (c)(1),
(2) Date: Mar. 26, 2014

(87) PCT Pub. No.: WO2014/041808
PCT Pub. Date: Mar. 20, 2014

(65) Prior Publication Data
US 2014/0231828 A1 Aug. 21, 2014

(30) Foreign Application Priority Data

Sep. 13, 2012 (JP) .................................. 2012-201197
Sep. 13, 2012 (JP) .................................. 2012-201200

(51) Int. Cl.
*H01L 29/15* (2006.01)
*H01L 29/06* (2006.01)
(Continued)

(52) U.S. Cl.
CPC ........ *H01L 29/0696* (2013.01); *H01L 29/7828* (2013.01); *H01L 29/45* (2013.01);
(Continued)

(58) Field of Classification Search
CPC .............. H01L 27/04; H01L 29/7828; H01L 29/66068; H01L 29/45; H01L 29/0696; H01L 29/1608; H01L 29/7805; H01L 29/7827
USPC ........ 257/77, E21.41, E29.262; 438/268, 270
See application file for complete search history.

(56) References Cited

U.S. PATENT DOCUMENTS

| 5,510,641 A | 4/1996 | Yee et al. |
|---|---|---|
| 5,744,994 A | 4/1998 | Williams |

(Continued)

FOREIGN PATENT DOCUMENTS

| JP | 04-369272 A | 12/1992 |
|---|---|---|
| JP | 3412851 B2 | 6/2003 |

(Continued)

OTHER PUBLICATIONS

M. Uchida et al., "Novel SiC Power MOSFET with Integrated Unipolar Internal Inverse MOS-Channel Diode," IEDM2011, pp. 602-605.

(Continued)

*Primary Examiner* — Khiem D Nguyen
(74) *Attorney, Agent, or Firm* — McDermott Will & Emery LLP

(57) ABSTRACT

A semiconductor device includes a first cell and a second cell. Each of the first cell and the second cell includes a first silicon carbide semiconductor layer including a first region and a second region provided in the first region, a second silicon carbide semiconductor layer provided on and in contact with the first silicon carbide semiconductor layer, a first ohmic electrode in ohmic contact with the second region, and an insulating film provided on the second silicon carbide semiconductor layer. The first cell includes a gate electrode, and the second cell includes no electrode configured to control the electric potential of the second silicon carbide semiconductor layer independently of the electric potential of the first ohmic electrode.

19 Claims, 41 Drawing Sheets

(51) Int. Cl.
  H01L 29/78    (2006.01)
  H01L 29/66    (2006.01)
  H01L 29/16    (2006.01)
  H01L 21/82    (2006.01)
  H01L 27/06    (2006.01)
  H01L 29/45    (2006.01)

(52) U.S. Cl.
  CPC ...... *H01L29/66068* (2013.01); *H01L 29/1608* (2013.01); *H01L 21/8213* (2013.01); *H01L 27/0605* (2013.01); *H01L 27/0629* (2013.01)

(56) References Cited

U.S. PATENT DOCUMENTS

| | | | |
|---|---|---|---|
| 8,049,223 B2 * | 11/2011 | Shimizu et al. | 257/77 |
| 2002/0070395 A1 | 6/2002 | Hasegawa | |
| 2003/0042537 A1 | 3/2003 | Nakamura et al. | |
| 2008/0121993 A1 | 5/2008 | Hefner et al. | |
| 2008/0217721 A1 | 9/2008 | Hamerski et al. | |
| 2008/0265260 A1 | 10/2008 | Kitabatake et al. | |
| 2012/0057386 A1 | 3/2012 | Adachi et al. | |
| 2012/0146055 A1 * | 6/2012 | Mitani et al. | 257/77 |
| 2012/0153303 A1 * | 6/2012 | Uchida | 257/77 |
| 2012/0161157 A1 * | 6/2012 | Inoue et al. | 257/77 |
| 2012/0193702 A1 * | 8/2012 | Machida et al. | 257/329 |
| 2012/0205670 A1 * | 8/2012 | Kudou et al. | 257/77 |
| 2012/0286290 A1 | 11/2012 | Uchida | |

FOREIGN PATENT DOCUMENTS

| | | |
|---|---|---|
| JP | 2008-017237 A | 1/2008 |
| JP | 5015361 B2 | 6/2012 |
| WO | 2010/125819 A1 | 11/2010 |

OTHER PUBLICATIONS

Masao Uchida et al., "SiC Power MOSFET with Integrated Unipolar MOS-Channel Diode (DioMOS)," IEDM2011, with English Translation.

International Search Report issued with International Application No. PCT/JP2013/005417 with Date of mailing Oct. 29, 2013, with English Translation.

* cited by examiner

FIG.22
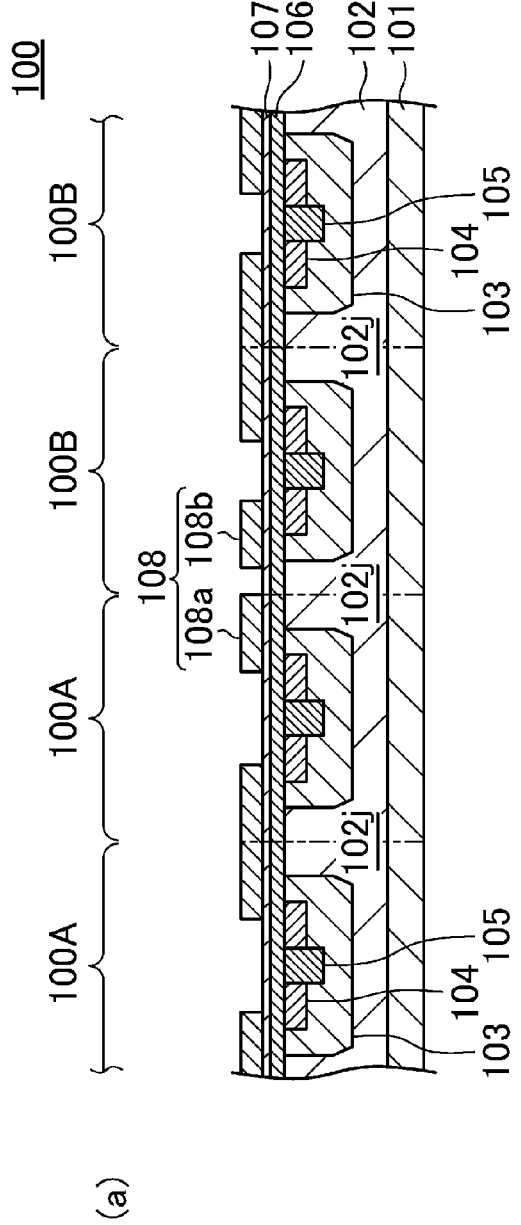
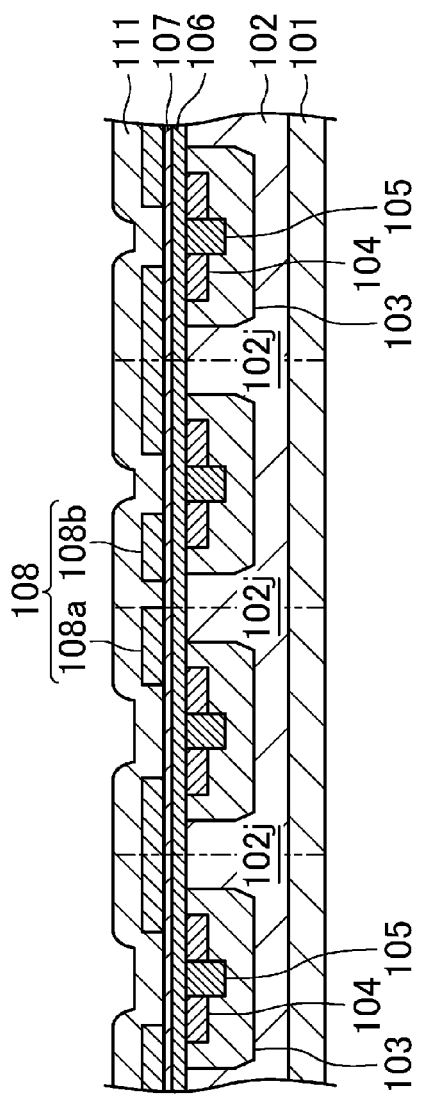

FIG. 23
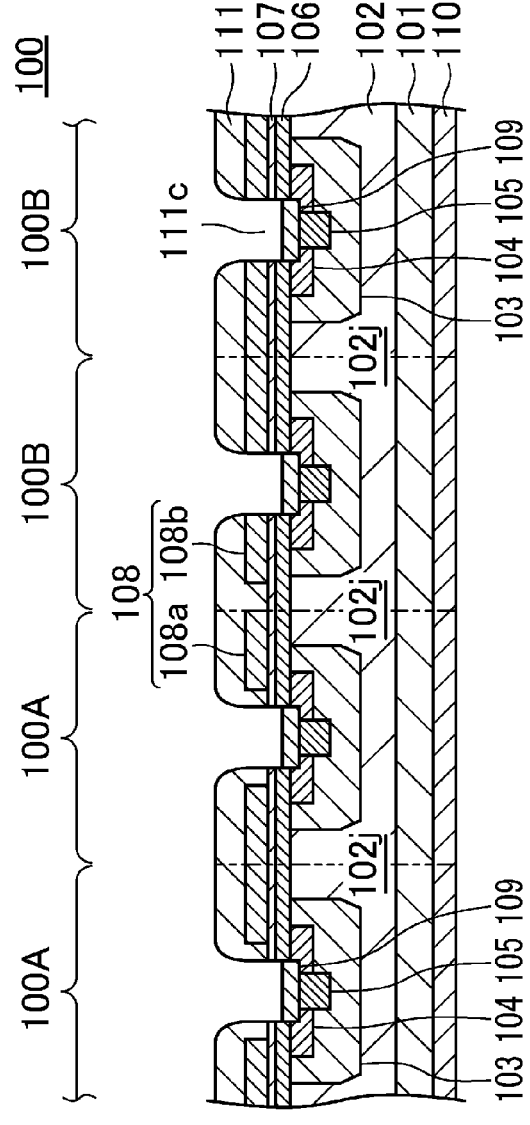
(a)
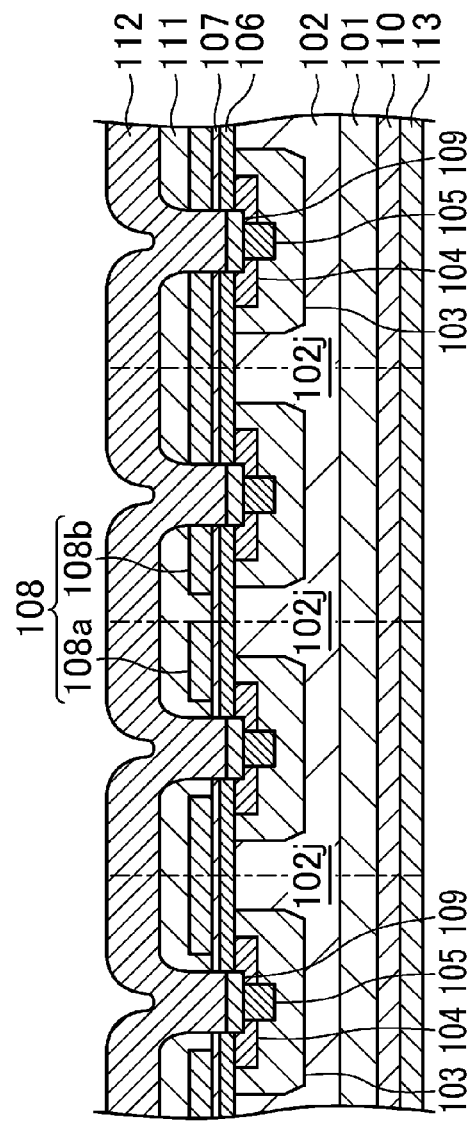
(b)

FIG.44
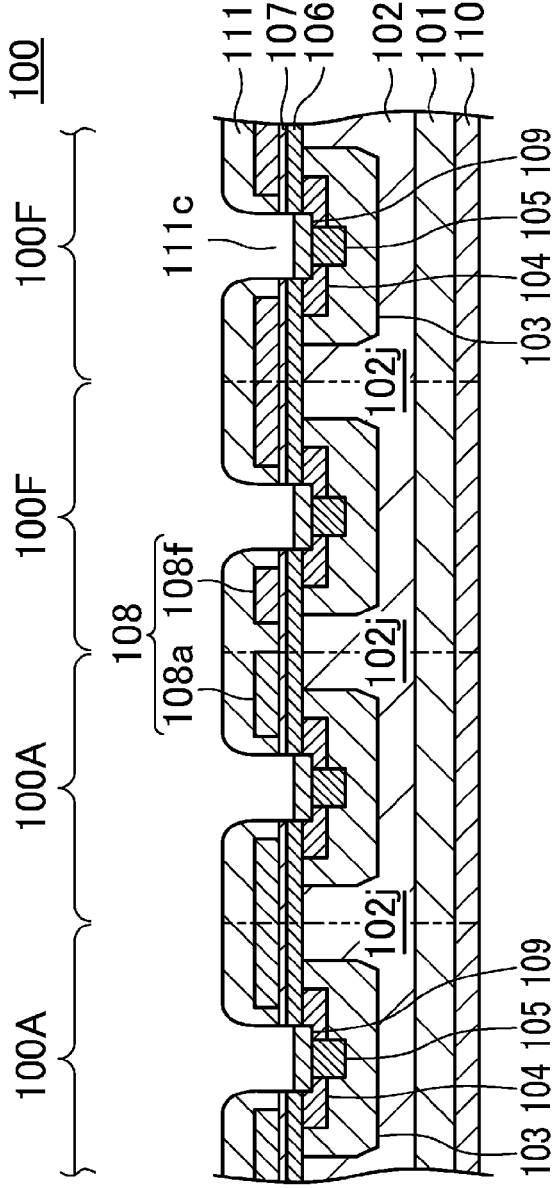
(a)
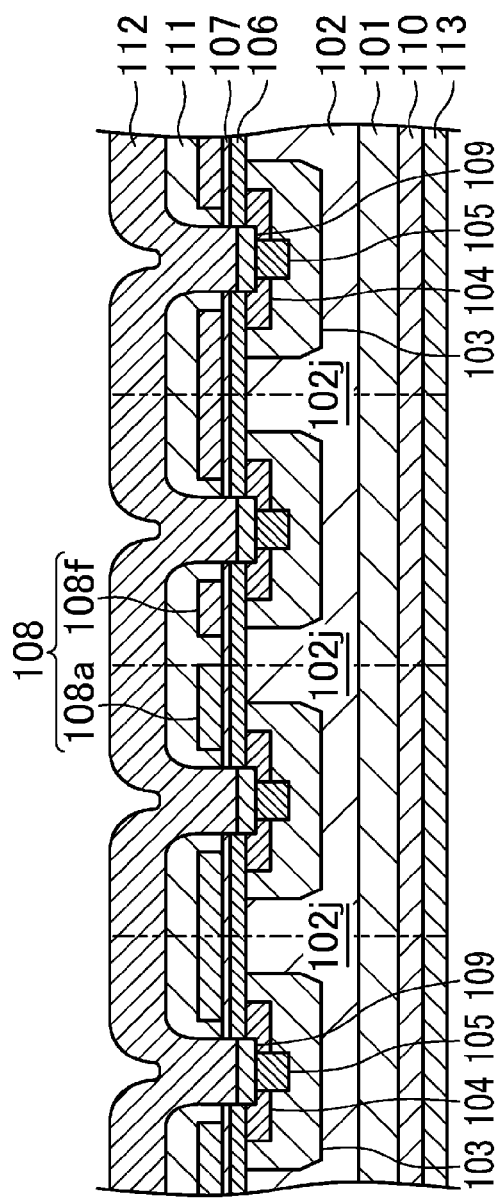
(b)

SEMICONDUCTOR DEVICE HAVING A FIRST SILICON CARBIDE SEMICONDUCTOR LAYER AND A SECOND SILICON CARBIDE SEMICONDUCTOR LAYER

RELATED APPLICATIONS

This application is a national phase application of the U.S. National Phase under 35 U.S.C. §371 of International Application No. PCT/JP2013/005417, filed on Sep. 12, 2013, which in turn claims the benefit of Japanese Application No. 2012-201197, filed on Sep. 13, 2012 and Japanese Application No. 2012-201200, filed on Sep. 13, 2012, the disclosures of which Applications are incorporated by reference herein.

TECHNICAL FIELD

The present invention relates to semiconductor devices, and specifically to a silicon carbide semiconductor device.

BACKGROUND ART

Silicon carbide (SiC) is a high-hardness semiconductor material having a greater band gap than silicon (Si), and has been applied to various semiconductor devices including power elements, hostile-environment elements, high temperature operating elements, and high frequency elements. Among them, application to the power elements including switching elements and rectifier elements has drawn attention.

Metal-Insulator-semiconductor field-effect transistor (MISFET) is generally used as a power element. There is a case where a reflux current has to be allowed to flow in an inverter circuit, etc. when a power element is in an OFF state. In the case of a Si semiconductor, a body diode can be used as a path through which the reflux current is allowed to flow. However, when a forward current flows to a pn junction of a power element using SiC, stacking faults increases due to dislocations at the bottom of a substrate, which is a known problem unique to SiC (e.g., Patent Document 1). Therefore, it is difficult to use the body diode of the power element using SiC as a path of the reflux current, and thus a Schottky diode using SiC is generally externally attached to the MISFET in anti-parallel. However, when the Schottky diode is externally attached, the number of members increases, which also increases the area of the device. Moreover, even when the Schottky diode is externally attached, the power element using SiC may degrades if a reflux current flows through the body diode for any reason.

Thus, inventors of the present application have considered that a channel structure of a power element using SiC is optimized to form a portion functioning as a diode in a channel portion, thereby allowing a current to flow from a source to a drain without energizing a body diode (e.g., see Patent Document 2).

CITATION LIST

Patent Document

[Patent Document 1] Japanese Unexamined Patent Publication No. 2008-17237
[Patent Document 2] International Patent Publication No. WO 2010/125819

SUMMARY OF THE INVENTION

Technical Problem

However, in general, in order to prevent false turn-on, a negative bias is applied to the gate of a power element so that the power element is in an OFF state. Therefore, a path of a reflux current is required to allow a large current to flow from the source to the drain also when the negative bias is applied to the gate. However, when the conventional power element using SiC is in an OFF state by the negative gate bias, a current flowing from the source to the drain is reduced.

It is an object of the present disclosure to provide a semiconductor device using SiC in which the above-discussed problems are solved and even when the semiconductor device is in an OFF state by the negative gate bias, the reduction in a current flowing from the source to the drain can be limited to a lesser degree.

Solution to the Problem

An aspect of a semiconductor device of the present disclosure includes: a first cell; and a second cell, wherein each of the first cell and the second cell includes a first silicon carbide semiconductor layer of a first conductivity type, a first region of a second conductivity type provided in the first silicon carbide semiconductor layer, a second region of the first conductivity type provided in the first region, a second silicon carbide semiconductor layer which is provided on and in contact with the first silicon carbide semiconductor layer and is in contact with the first region and the second region, a first ohmic electrode which is in ohmic contact with the second region, and an insulating film provided on the second silicon carbide semiconductor layer, the first cell includes a gate electrode on the second silicon carbide semiconductor layer with the insulating film provided between the second silicon carbide semiconductor layer and the gate electrode, and the second cell includes no electrode configured to control an electric potential of the second silicon carbide semiconductor layer independently of an electric potential of the first ohmic electrode.

Advantages of the Invention

According to the semiconductor device of the present disclosure, even when the semiconductor device is in an OFF state by the negative gate bias, the reduction in a current flowing from the source to the drain can be limited to a lesser degree.

BRIEF DESCRIPTION OF THE DRAWINGS

FIGS. 22(a) and 22(b) are cross-sectional views illustrating steps in the method for fabricating the semiconductor device according to the first embodiment in a sequential order.

FIGS. 23(a) and 23(b) are cross-sectional view illustrating steps in the method for fabricating the semiconductor device according to the first embodiment in a sequential order.

FIG. 44(a) and FIG. 44(b) are cross-sectional views illustrating steps in the method for fabricating the semiconductor device according to the second embodiment.

DESCRIPTION OF EMBODIMENTS

Figure 1:
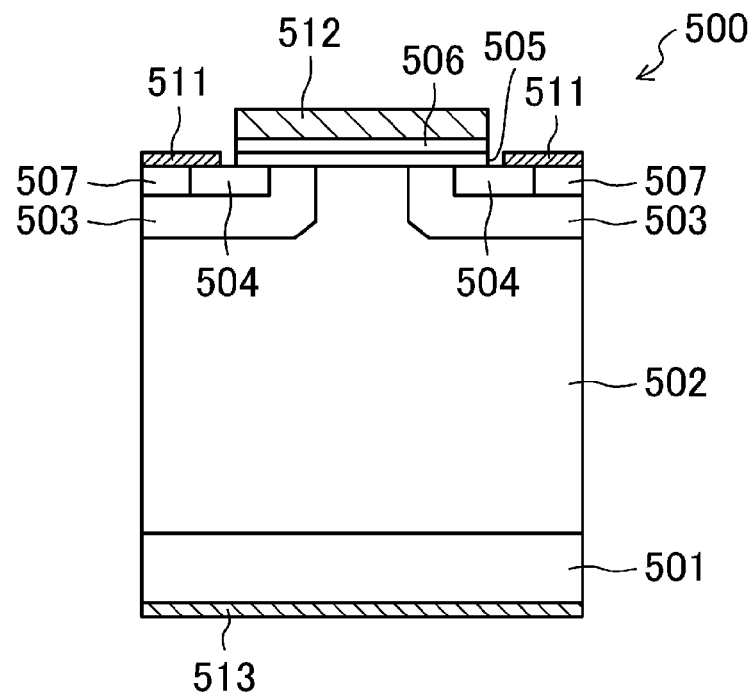
FIG. 1 is a cross-sectional view illustrating a semiconductor device whose diode characteristic has been considered.

An example in which a first conductivity type is an n type, and a second conductivity type is a p type will be described hereinafter. However, the first conductivity type may be the p type, and the second conductivity type may be the n type. Moreover, to indicate the relative concentration of impurities, the sign "+" or "−" is used on the right of "n" or "p." For example, "n$^+$" is higher in concentration of an n-type impurity than "n," and "n$^−$" is lower in concentration of the n-type impurity than "n."

The expression "electrically connected" hereinafter means a state in which when an electric potential is applied to one member, the electric potential of the other member becomes substantially equal to the electric potential of the one member. This expression includes, for example, a state in which two conductive members are in contact with each other, a state in which two conductive members are connected to each other via another conductive member, and a state in which two members separated from each other by a space or an insulative member are connected to each other by, for example, an interconnect.

In the present disclosure, the expression that A is provided "on" B includes both a configuration in which a member is provided between A and B and a configuration in which A and B are in contact with each other.

First, it will be described how the present inventors arrived at the semiconductor device of the present disclosure. When a body diode of a MISFET using SiC (hereinafter referred to as a SiC-FET) is used as a path for a reflux current, a current flows in a forward direction through the body diode serving as a pn junction. However, when the forward current flows through the pn junction of the SiC, stacking faults increase due to dislocations at the bottom of a substrate. Therefore, when the body diode of the SiC-FET is used as a path for the reflux current, the stacking faults at the pn junction increase, so that the degradation of the degree of crystallinity of the SiC-FET progresses. When the degradation of the degree of crystallinity of the SiC-FET progresses, an on-state voltage of the body diode may increase. Moreover, in the case where the body diode is used as a freewheeling diode, a reverse recovery current flows due to bipolar operation of the pn junction diode when the diode transitions from an ON state to an OFF state. The reverse recovery current causes recovery loss and also reduces the switching rate of the SiC-FET.

As described above, in the SiC-FET, energizing the body diode may induce element degradation due to an increase in recovery loss and an increase in stacking fault. Therefore, it is difficult to use the body diode of the SiC-FET as a freewheeling diode.

The present inventors found that a SiC-FET is operated as a diode allowing a current to flow from a source electrode to a drain electrode via a channel region by applying a voltage which is higher than or equal to 0 V and is lower than a threshold voltage Vth with reference to the electric potential of the source electrode to a gate electrode.

Specifically, as illustrated in FIG. 1, a semiconductor device 500 includes an $n^+$-type semiconductor substrate 501 made of silicon carbide, an $n^-$-type first silicon carbide semiconductor layer 502 on the $n^+$-type semiconductor substrate 501, and a p-type body region 503 in the first silicon carbide semiconductor layer 502. In the body region 503, an $n^+$-type source region 504 and a $p^+$-type contact region 507 are provided. A source electrode 511 is provided to extend on both the source region 504 and the contact region 507. A channel layer 505 is provided to extend on both the body region 503 and the source region 504. A gate electrode 512 is provided on the channel layer 505 with a gate insulating film 506 provided between the gate electrode 512 and the channel layer 505. A drain electrode 513 is provided on an opposite surface (back face) of the semiconductor substrate 501 to a surface thereof which is in contact with the first silicon carbide semiconductor layer 502.

For example, a voltage Vgs applied to the gate electrode 512 is set to 20 V with reference to the source electrode 511, and a voltage Vds applied to the drain electrode 513 is set to be a positive voltage with reference to the source electrode 511. In this case, the semiconductor device 500 serves as a transistor and is in the ON state. On the other hand, when the voltage Vgs is set to 0 V, and the voltage Vds is set to be a negative voltage, the semiconductor device 500 functions as a unipolar diode.

Figure 2:
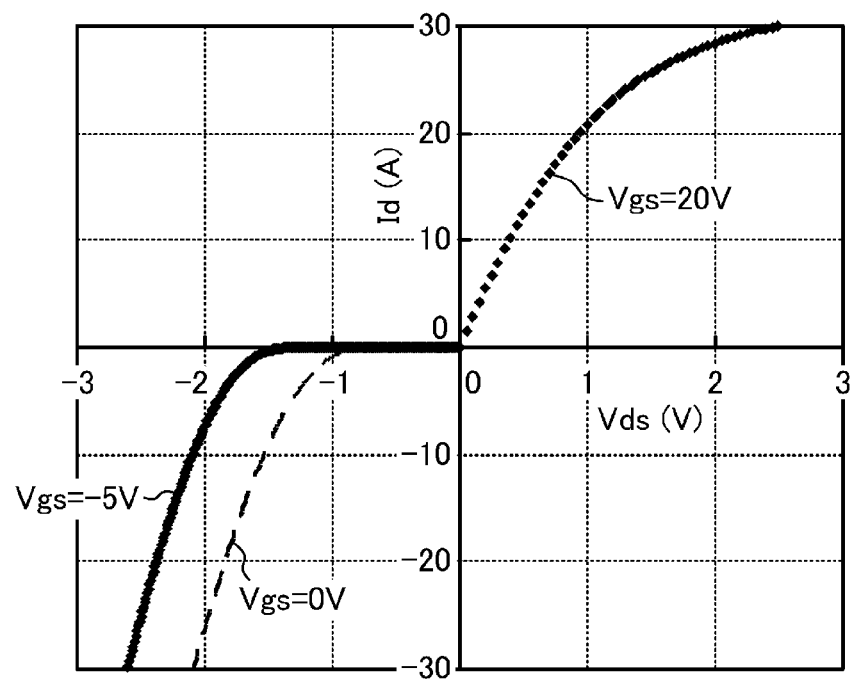
FIG. 2 is a graph illustrating the voltage-current characteristic of the semiconductor device of FIG. 1.

FIG. 2 shows a basic current-voltage characteristic of the semiconductor device 500. As illustrated by the dots in the upper right quadrant of FIG. 2, when the voltage Vgs is 20 V, and the voltage Vds is positive, the semiconductor device 500 operates as a transistor. As illustrated by the broken line in the lower left quadrant of FIG. 2, when the voltage Vgs is 0 V, and the voltage Vds is negative, the semiconductor device 500 operates as a diode.

Between the p-type body region 503 and the $n^-$-type first silicon carbide semiconductor layer 502, a parasitic body diode including a pn junction exists. However, a turn-on voltage of the pn junction diode (a voltage when a current of 1 mA flows) at a room temperature is about 2.5 V. Thus, the characteristic shown in FIG. 2 is not that of the body diode of the semiconductor device 500, but is that of the unipolar diode which allows a current to flow through the n-type channel layer 505. Thus, the semiconductor device 500 does not allow a current to flow to the body diode, but allows a reflux current to flow from the source electrode to the drain electrode, and thus has a possibility that an externally provided freewheeling diode can be omitted.

However, as illustrated by the solid line in the lower left quadrant of FIG. 2, when the voltage Vgs is set to −5 V, a current Ids flowing from the source electrode 511 to the drain electrode 513 decreases. When the voltage Vgs is set to be a negative voltage in order to prevent false turn-on, it is desirable to limit the reduction in on-state current of the diode to a lesser degree as compared to the semiconductor device 500.

In order to limit the reduction in on-state current of the diode to a lesser degree in the case where the semiconductor device is in an OFF state by the negative gate bias, the semiconductor device of the present embodiment has the following configuration.

A first example semiconductor device includes: a first cell; and a second cell, wherein each of the first cell and the second cell includes a first silicon carbide semiconductor layer of a first conductivity type, a first region of a second conductivity type provided in the first silicon carbide semiconductor layer, a second region of the first conductivity type provided in the first region, a second silicon carbide semiconductor layer which is provided on and in contact with the first silicon carbide semiconductor layer and is in contact with the first region and the second region, a first ohmic electrode which is in ohmic contact with the second region, and an insulating film provided on the second silicon carbide semiconductor layer, the first cell includes a gate electrode on the second silicon carbide semiconductor layer with the insulating film provided between the second silicon carbide semiconductor layer and the gate electrode, and the second cell includes no electrode configured to control an electric potential of the second silicon carbide semiconductor layer independently of an electric potential of the first ohmic electrode.

In the first example semiconductor device, each of the first cell and the second cell may further include an interlayer insulating film provided on the second silicon carbide semiconductor layer, and an upper electrode provided on the interlayer insulating film, and the upper electrode may be electrically connected to the first ohmic electrode.

In the first semiconductor device, each of the first cell and the second cell may further include a conductive film provided on the second silicon carbide semiconductor layer with the insulating film provided between the second silicon carbide semiconductor layer and the conductive film, the conductive film of the first cell may be the gate electrode, the conductive film of the second cell may be insulated from the gate electrode and electrically connected to the first ohmic electrode of the second cell, and the first ohmic electrode of the first cell may be electrically connected to the first ohmic electrode of the second cell.

In the first example semiconductor device of claim, the conductive film of the second cell may be in contact with the upper electrode.

In this case, the upper electrode may include a contact portion which passes through the interlayer insulating film and is in contact with the first ohmic electrode, and the conductive film of the second cell may be in contact with the contact portion.

Moreover, the second cell may include a silicide layer in at least part of an upper surface of the conductive film, the silicide layer may surround the contact portion, and in the second cell, part of the contact portion above the conductive film may have a larger width than part of the contact portion below the conductive film, and the part of the contact portion above the conductive film may be in contact with the silicide layer.

The first example semiconductor device may further include: a third cell, wherein the third cell includes a first silicon carbide semiconductor layer, a first region, a second region, a second silicon carbide semiconductor layer, a first ohmic electrode, an insulating film, and a conductive film provided on the second silicon carbide semiconductor layer with the insulating film provided between the second silicon carbide semiconductor layer and the conductive film, and the conductive film of the third cell may be in contact with the conductive film of the second cell, may be separated from the gate electrode, and does not need to be in contact with the upper electrode.

The first example semiconductor device may further include: a fourth cell provided between the first cell and the second cell, wherein the fourth cell may include a first silicon carbide semiconductor layer, a first region, a second silicon carbide semiconductor layer, an insulating film, and a conductive film provided on the second silicon carbide semiconductor layer with the insulating film provided between the second silicon carbide semiconductor layer and the conductive film, and the conductive film of the fourth cell may be electrically connected to the conductive film of the second cell, may be separated from the gate electrode, and may be in contact with the upper electrode.

In this case, the first region of the fourth cell may be integrated with the first region of the second cell adjacent to the fourth cell.

The first example semiconductor device may further include: a fifth cell provided between the first cell and the fourth cell, wherein the fifth cell may include a first silicon carbide semiconductor layer, a second silicon carbide semiconductor layer, and an insulating film, and no conductive film may be provided between the insulating film of the fifth cell and the upper electrode.

In this case, the fourth cell may include the first region, and the fifth cell may include a first region, and the first region of the fifth cell may be integrated with the first region of the fourth cell adjacent to the fifth cell.

In the first example semiconductor device, the conductive film of the second cell does not need to be in contact with the upper electrode.

In the first example semiconductor device, each of the first cell and the second cell may further include a conductive film provided on the second silicon carbide semiconductor layer with the insulating film provided between the second silicon carbide semiconductor layer and the conductive film, the conductive film of the first cell may be the gate electrode, and the conductive film of the second cell may be insulated from the gate electrode and the first ohmic electrode of the second cell.

In this case, a sixth cell may be further provided between the first cell and the second cell, and the sixth cell may include a first silicon carbide semiconductor layer including a first region and a second region, a second silicon carbide semiconductor layer, a first ohmic electrode, and an insulating film, and no conductive film may be provided between the second silicon carbide semiconductor layer of the sixth cell and the upper electrode.

In the first example semiconductor device, no conductive film needs to be provided between the second silicon carbide semiconductor layer and the interlayer insulating film of the second cell.

In the first example semiconductor device, each of the first cell and the second cell may further include a conductive film provided on the second silicon carbide semiconductor layer with the insulating film provided between the second silicon carbide semiconductor layer and the conductive film, the conductive film of the first cell may be the gate electrode, the conductive film of the second cell may be insulated from the gate electrode and is electrically connected to the first ohmic electrode of the second cell, and the first ohmic electrode of the first cell may be electrically connected to the first ohmic electrode of the second cell.

The first example semiconductor device may have a configuration in which a second ohmic electrode facing the first ohmic electrode across the first silicon carbide semiconductor layer is further provided, wherein letting Vds be an electric potential applied to the second ohmic electrode with reference to the first ohmic electrode, Vgs be a voltage applied to the gate electrode with reference to the first ohmic electrode, and Vth be a threshold voltage of the gate electrode, then the threshold voltage Vth is higher than 0 V, and when the voltage Vgs is less than the threshold voltage Vth, and the voltage Vds is less than 0 V, gradually reducing the voltage Vds allows a current to flow from the first ohmic electrode to the second ohmic electrode via the second silicon carbide semiconductor layer before the current starts flowing from the first region to the first silicon carbide semiconductor layer in each of the first cell and the second cell.

In this case, a configuration may be possible in which when the voltage Vgs is greater than or equal to the threshold voltage Vth, and the voltage Vds is greater than 0, a current flows from the second ohmic electrode to the first ohmic electrode in the first cell, and no current flows in the second cell.

A second example semiconductor device includes: a first cell; and a second cell, wherein each of the first cell and the second cell includes a first silicon carbide semiconductor layer of a first conductivity type, a first region of a second conductivity type provided in the first silicon carbide semiconductor layer, a second region of the first conductivity type provided in the first region, a second silicon carbide semiconductor layer which is provided on and in contact with the first silicon carbide semiconductor layer and is in contact with the first region and the second region, a conductive film on the second silicon carbide semiconductor layer with an insulating film provided between the second silicon carbide semiconductor layer and the conductive film, and a first ohmic electrode which is in ohmic contact with the second region, the conductive film of the first cell is separated from the first ohmic electrode of the first cell and serves as a gate electrode, the conductive film of the second cell is insulated from the conductive film of the first cell and is electrically connected to the first ohmic electrode of the second cell, and the first ohmic electrode of the first cell is electrically connected to the first ohmic electrode of the second cell.

The second example semiconductor device may have a configuration in which a second ohmic electrode facing the first ohmic electrode across the first silicon carbide layer is further provided, wherein letting Vds be an electric potential applied to the second ohmic electrode with reference to the first ohmic electrode, Vgs be a voltage applied to the gate electrode with reference to the first ohmic electrode, and Vth be a threshold voltage of the gate electrode, where Vth>0 V, and when the voltage Vgs is less than the threshold voltage Vth, and the voltage Vds is less than 0 V, then gradually reducing the voltage Vds allows a current to flow from the first ohmic electrode to the second ohmic electrode via the second silicon carbide semiconductor layer before the current starts flowing from the first region to the first silicon carbide semiconductor layer.

The second example semiconductor device may have a configuration in which an upper electrode are further provided on the conductive film with an interlayer insulating film provided between the conductive film and the upper electrode, wherein the upper electrode includes a contact portion which passes through the interlayer insulating film and is connected to the first ohmic electrode, and the conductive film of the second cell is in contact with the upper electrode.

In this case, the second cell may include a silicide layer in at least part of an upper surface of the conductive film, the silicide layer may surround the contact portion, a part of the contact portion of the second cell above the upper surface of the conductive film may have a larger width than a part of the contact portion below the upper surface of the conductive film, and the part above the upper surface of the conductive film may be in contact with the silicide layer.

The second example semiconductor device may have a configuration in which a third cell is further provided between the first cell and the second cell, wherein the third cell includes a first silicon carbide semiconductor layer, a first region, a second region, a second silicon carbide semiconductor layer, a conductive film, and a first ohmic electrode, and the conductive film of the third cell is in contact with the conductive film of the second cell, is separated from the conductive film of the first cell and is not in contact with the upper electrode.

The second example semiconductor device may have a configuration in which a fourth cell is further provided between the first cell and the second cell, wherein the upper electrode is provided on the conductive film with the interlayer insulating film provided between the conductive film and the upper electrode and is connected to the first ohmic electrode, the fourth cell includes a first silicon carbide semiconductor layer, a first region, a second silicon carbide semiconductor layer, and a conductive film, and the conductive film of the fourth cell is electrically connected to the conductive film of the second cell, is isolated from the conductive film of the first cell, and is connected to the upper electrode.

In this case, the first region of the fourth cell may be integrated with the first region of the second cell adjacent to the fourth cell.

The second example semiconductor device may have a configuration in which a fifth cell is further provided between the first cell and the fourth cell, wherein the fifth cell includes no conductive film.

In this case, the fifth cell may have a first region which is integrated with the first region of the fourth cell adjacent to the fifth cell.

The second example semiconductor device may have a configuration in which the conductive film of the second cell is not in contact with the upper electrode.

A third example semiconductor device includes: a first cell; a second cell; and an upper electrode, wherein each of the first cell and the second cell includes a first silicon carbide semiconductor layer of a first conductivity type, a first region of a second conductivity type provided in the first silicon carbide semiconductor layer, a second region of the first conductivity type provided in the first region, a second silicon carbide semiconductor layer which is provided on and in contact with the first silicon carbide semiconductor layer and is in contact with the first region and the second region, and a first ohmic electrode in ohmic contact with the second region, and the upper electrode is provided on the second silicon carbide semiconductor layer with at least an interlayer insulating film provided between the second silicon carbide semiconductor layer and the upper electrode, the upper electrode being electrically connected to the first ohmic electrode, wherein the first cell includes, between the second silicon carbide semiconductor layer and the interlayer insulating film, a gate electrode on the second silicon carbide semiconductor layer with the insulating film provided between the second silicon carbide semiconductor layer and the gate electrode, and the second cell includes no gate electrode between the second silicon carbide semiconductor layer and the interlayer insulating film.

In the third example semiconductor device, each of the first cell and the second cell may include, between the second silicon carbide semiconductor layer and the interlayer insulating film, a conductive film on the second silicon carbide semiconductor layer with the insulating film provided between the second silicon carbide semiconductor layer and the conductive film, the conductive film of the first cell may be the gate electrode, and the conductive film of the second cell may be isolated from the gate electrode.

In the third example semiconductor device, the second cell does not need to include the conductive film between the second silicon carbide semiconductor layer and the interlayer insulating film.

The third example semiconductor device may further include a third cell between the first cell and the second cell, wherein the third cell may include a first silicon carbide semiconductor layer, a first region, a second region, a second silicon carbide semiconductor layer, and a first ohmic electrode, each of the first cell and the second cell may include, between the second silicon carbide semiconductor layer and the interlayer insulating film, the conductive film on the second silicon carbide semiconductor layer with the insulating film provided between the second silicon carbide semiconductor layer and the conductive film, the third cell does not need to include a conductive film between the second silicon carbide semiconductor layer and an interlayer insulating film of the third cell, the conductive film of the first cell may be the gate electrode, and the conductive film of the second cell may be insulated from the gate electrode.

The second example semiconductor device may have a configuration in which a second ohmic electrode facing the second silicon carbide semiconductor layer across the first silicon carbide semiconductor layer is further provided, wherein letting Vds be an electric potential applied to the second ohmic electrode with reference to the first ohmic electrode, Vgs be a voltage applied to the gate electrode with reference to the first ohmic electrode, and Vth be a threshold voltage of the gate electrode, where Vth>0 V, and when the voltage Vgs is less than the threshold voltage Vth, and the voltage Vds is less than 0 V, then gradually reducing the voltage Vds allows a current to flow from the first ohmic electrode to the second ohmic electrode via the second silicon carbide semiconductor layer before the current starts flowing from the first region to the first silicon carbide semiconductor layer.

First Embodiment

Figure 3:
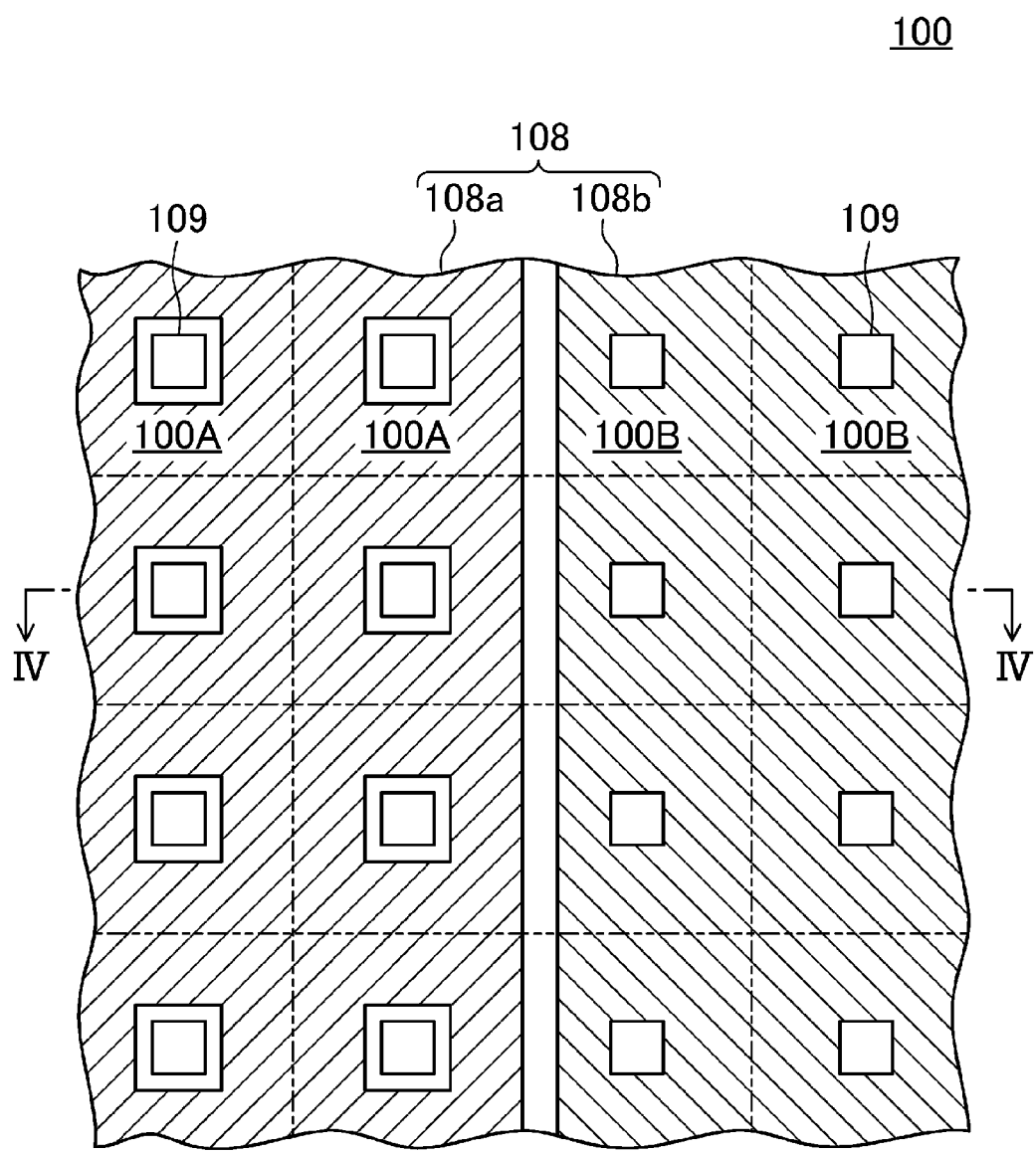
FIG. 3 is a plan view illustrating a semiconductor device according to a first embodiment.
Figure 4:
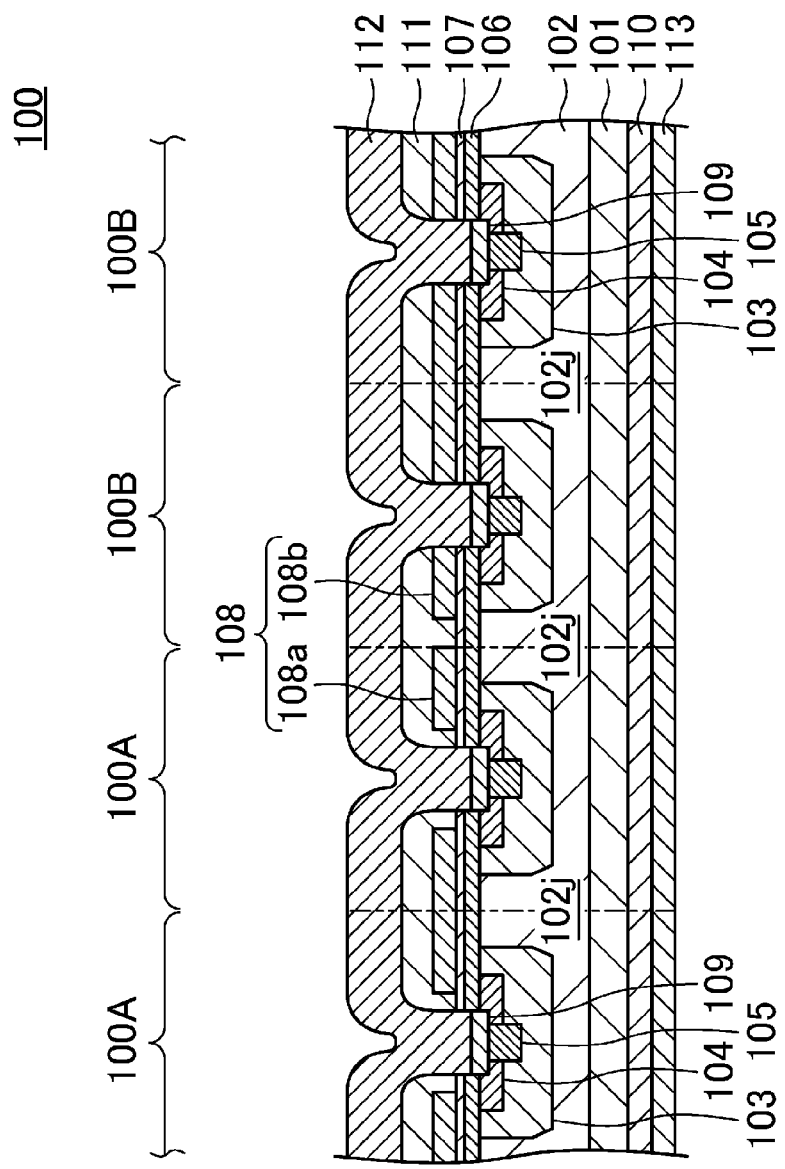
FIG. 4 is a cross-sectional view along the line IV-IV of FIG. 3.

With reference to the drawings, a semiconductor device of a first embodiment will be described further in detail. In the following drawings, there are cases where the thickness of each layer is not to actual scale. FIG. 3 shows a plan configuration of a semiconductor device 100 of the present embodiment. FIG. 4 shows a cross-sectional configuration along the line IV-IV of FIG. 3. In FIG. 3, an upper electrode and an interlayer insulating layer are omitted. In FIG. 3, eight first cells 100A and eight second cells 100B are shown. However, the number of the first cells 100A and the number of the second cells 100B may be arbitrarily changed. The number of the first cells 100A may be different from the number of the second cells 100B. In FIG. 3, the first cells 100A and the second cells 100B are arranged in a two-dimensional matrix, but other arrangements are possible. For example, the first cells 100A and the second cells 100B may be arranged in a single row.

As illustrated in FIGS. 3 and 4, the semiconductor device 100 of the present embodiment includes the first cells 100A and the second cells 100B. Each first cell 100A functions as a transistor, and each second cell 100B functions as a diode.

More specifically, an n+-type semiconductor substrate 101 made of SiC has a first face (surface) and a second face (back face) opposite to the first face. An n−-type first silicon carbide semiconductor layer 102 is provided on the first face (surface) of the semiconductor substrate 101. The first silicon carbide semiconductor layer 102 may be an epitaxially grown layer.

P-type first regions 103 are provided in an upper portion of the first silicon carbide semiconductor layer 102. Each first region 103 functions as a body region. The term "body region" generally refers to a semiconductor region which is located under a channel layer and has a conductivity type opposite to the channel layer. The first region 103 is formed by implanting an impurity in the n−-type first silicon carbide semiconductor layer 102. The first region 103 is shallower than the first silicon carbide semiconductor layer 102 and is surrounded by the first silicon carbide semiconductor layer 102. The first region 103 is a region which contains an n-type impurity and a p-type impurity, and in which the concentration of the p-type impurity is higher than that of the n-type impurity. The impurity concentration of the first region 103 may vary in a direction vertical to the semiconductor substrate 101 or may be uniform.

A second region 104 serving as an n+-type impurity diffusion region is provided in an upper portion of each first region 103. The second region 104 is shallower than the first region 103 and is surrounded by the first region 103.

A p+-type contact region 105 is provided in each first region 103 to pass through the first region 103. First ohmic electrodes 109 are each provided to extend on both the contact region 105 and the second region 104. Each first ohmic electrode 109 is in ohmic contact with the contact region 105 and the second region 104. The contact region 105 is provided to facilitate the ohmic contact between the first ohmic electrode 109 and the first region 103. Thus, when the impurity concentration of the first region 103 is sufficiently high, and an ohmic contact between the first region 103 and the first ohmic electrode 109 can be easily formed, the contact region 105 does not need to be provided, and the first ohmic electrode 109 may be directly in contact with the first region 103. For example, a contact trench exposing the first region 103 may be formed in the second region 104, and the first ohmic electrode 109 may be provided in the contact trench. Alternatively, a region exposing the first region 103 may be left in forming the second region 104 so that the first region 103 is in contact with the first ohmic electrode 109.

A portion of the first silicon carbide semiconductor layer 102 in which a first region 103 is not formed is a drift region, and a portion of the drift region which is adjacent to the first region 103 is referred to as a JFET region 102j for simplicity of description. When a plurality of first cells 100A and second cells 100B are adjacent to each other, portions each of which is located between the first regions 103 adjacent to each other are JFET regions 102j. Each JFET region 102j may have an impurity concentration equal to the impurity concentration of other portions of the drift region, or an n-type impurity may be implanted by ion implantation or the like so that the impurity concentration of the JFET region 102j is higher than that of other portions of the drift region. When the impurity concentration of the JFET region 102j is higher than that of other portions of the drift region, the resistance value of the JFET region 102j can be reduced. Note that the term "JFET region" represents a structure for the sake of convenience, but does not mean that the region can perform on/off operation as a JFET.

When an impurity is implanted in the JFET region 102j, the implantation depth may be set to be greater than the depth of the first region 103. The implantation depth of the JFET region 102j represents a depth at which the impurity concentration of the JFET region 102j is equal to the impurity concentration of other portions of the drift region.

On the first silicon carbide semiconductor layer 102, a second silicon carbide semiconductor layer 106 containing an n-type impurity is provided in contact with the first silicon carbide semiconductor layer 102. Openings exposing the first ohmic electrodes 109 are formed in the second silicon carbide semiconductor layer 106. The second silicon carbide semiconductor layer 106 extends at least on the JFET region 102j, the first region 103, and the second region 104. The second silicon carbide semiconductor layer 106 functions as a channel layer. The second silicon carbide semiconductor layer 106 may be formed by epitaxial growth. The impurity concentration of the second silicon carbide semiconductor layer 106 may be mainly controlled by a flow of a doping gas in the epitaxial growth. The impurity concentration of the second silicon carbide semiconductor layer 106 may vary in a direction vertical to the semiconductor substrate 101 or may be uniform.

An insulating film 107 is provided on and in contact with the second silicon carbide semiconductor layer 106. A conductive film 108 is selectively provided on and in contact with the insulating film 107. An upper electrode (source pad) 112 is provided on the conductive film 108 with an interlayer insulating film 111 provided between the conductive film 108 and the upper electrode 112. The upper electrode 112 is in contact with and electrically connected to the first ohmic electrode 109 in each of contact holes formed in the interlayer insulating film 111. A second ohmic electrode 110 is provided on the entire second face (back face) of the semiconductor substrate 101. A back electrode 113 is provided on an entire surface of the second ohmic electrode 110 opposite a surface of the second ohmic electrode 110 in contact with the semiconductor substrate 101.

Each first cell 100A includes a first semiconductor element serving as a MISFET having a freewheeling diode. In the first semiconductor element, the first ohmic electrode 109 functions as a source electrode, and the second ohmic electrode 110 functions as a drain electrode.

In the first cell 100A, the second silicon carbide semiconductor layer 106 is in contact with the drift region of the first silicon carbide semiconductor layer 102, the first region 103, and the second region 104. The second silicon carbide semiconductor layer 106 functions as a channel through which a current flows between the first ohmic electrode (source electrode) 109 and the second ohmic electrode (drain electrode) 110.

A portion of the insulating film 107 formed in the first cell 100A is a gate insulating film, and a portion of the conductive film 108 formed in the first cell 100A is a gate electrode 108a. The gate electrode 108a is electrically connected to a gate pad (not shown). The channel can be switched between an energized state and a shutdown state by applying a voltage to the gate electrode 108a. Thus, the insulating film 107 serving as a gate insulating film and the gate electrode 108a may be formed on at least a portion of the second silicon carbide semiconductor layer 106 which will be the channel. Specifically, the insulating film 107 and the gate electrode 108a may extend on the drift region, the first region 103, and the second region 104.

Each second cell 100B includes a second semiconductor element which functions as a diode. In the second cell 100B, a portion 108b of the conductive film 108 formed in the second cell 100B is physically separated and electrically insulated from the portion serving as the gate electrode 108a formed in the first cell 100A. Moreover, the portion 108b is in contact with the upper electrode 112 and is electrically connected to the first ohmic electrode 109. Therefore, the portion 108b has an electric potential substantially equal to the electric potential of the first ohmic electrode 109. Thus, potential can be applied to a surface of a portion of the second silicon carbide semiconductor layer 106 extending on the drift region, the first region 103, and the second region 104 (an interface between the second silicon carbide semiconductor layer 106 and the insulating film 107), so that the second semiconductor element functions as a unipolar diode (channel diode) which will be described later. The portion 108b is hereinafter referred to as a first control electrode 108b. A silicide layer may be formed in a portion of the first control electrode 108b which is in contact with the upper electrode 112.

The gate electrode 108a is isolated from the first ohmic electrode 109, and the electric potential of the second silicon carbide semiconductor layer 106 serving as a channel can be purposely changed by applying any electric potential independent of the electric potential of the first ohmic electrode 109. Therefore, the gate electrode 108a is an electrode which controls the electric potential of the second silicon carbide semiconductor layer 106 serving as a channel independently of the electric potential of the first ohmic electrode 109. On the other hand, the first control electrode 108b is electrically connected to the first ohmic electrode 109, and thus the electric potential of the first control electrode 108b is substantially equal to that of the first ohmic electrode 109. Therefore, the first control electrode 108b is not independent of the electric potential of the first ohmic electrode 109, and thus the first control electrode 108b is an electrode which cannot control the electric potential of the second silicon carbide semiconductor layer 106 independently of the electric potential of the first ohmic electrode 109. The phrase "control the electric potential" means that the electric potential is purposely changed. This phrase includes neither the case where the electric potential is fixed at a constant electric potential nor the case where the electric potential cannot be purposely changed.

In the present embodiment, the term "gate electrode" means an electrode capable of controlling the electric potential at an interface between the channel layer and the gate insulating film. Moreover, the term "gate insulating film" means an insulating film provided between the gate electrode and the channel layer. Furthermore, the term "control electrode" means an electrode which is insulated from gate electrodes of other cells and is electrically connected to the first ohmic electrode. The control electrode may be electrically connected to the first ohmic electrode via a connection electrode. No channel layer is provided under the connection electrode.

In FIGS. 3 and 4, in the second cell 100B adjacent to the first cell 100A, a region in which the first control electrode 108b is not formed is formed in a portion of the second cell 100B adjacent to the first cell 100A. With this configuration, the first control electrode 108b is physically separated and electrically insulated from the gate electrode 108a.

Figure 5:
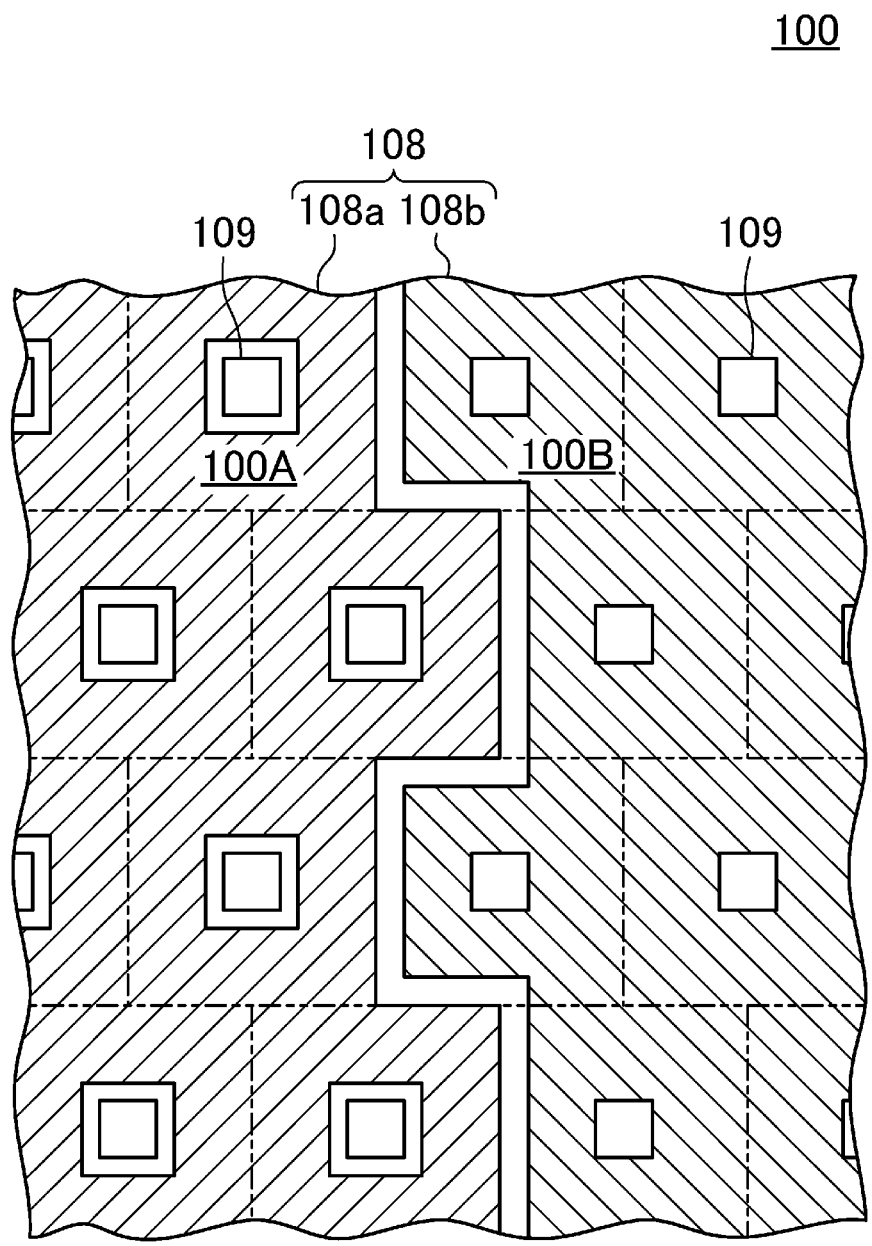
FIG. 5 is a plan view illustrating a variation of the semiconductor device according to the first embodiment.
Figure 6:
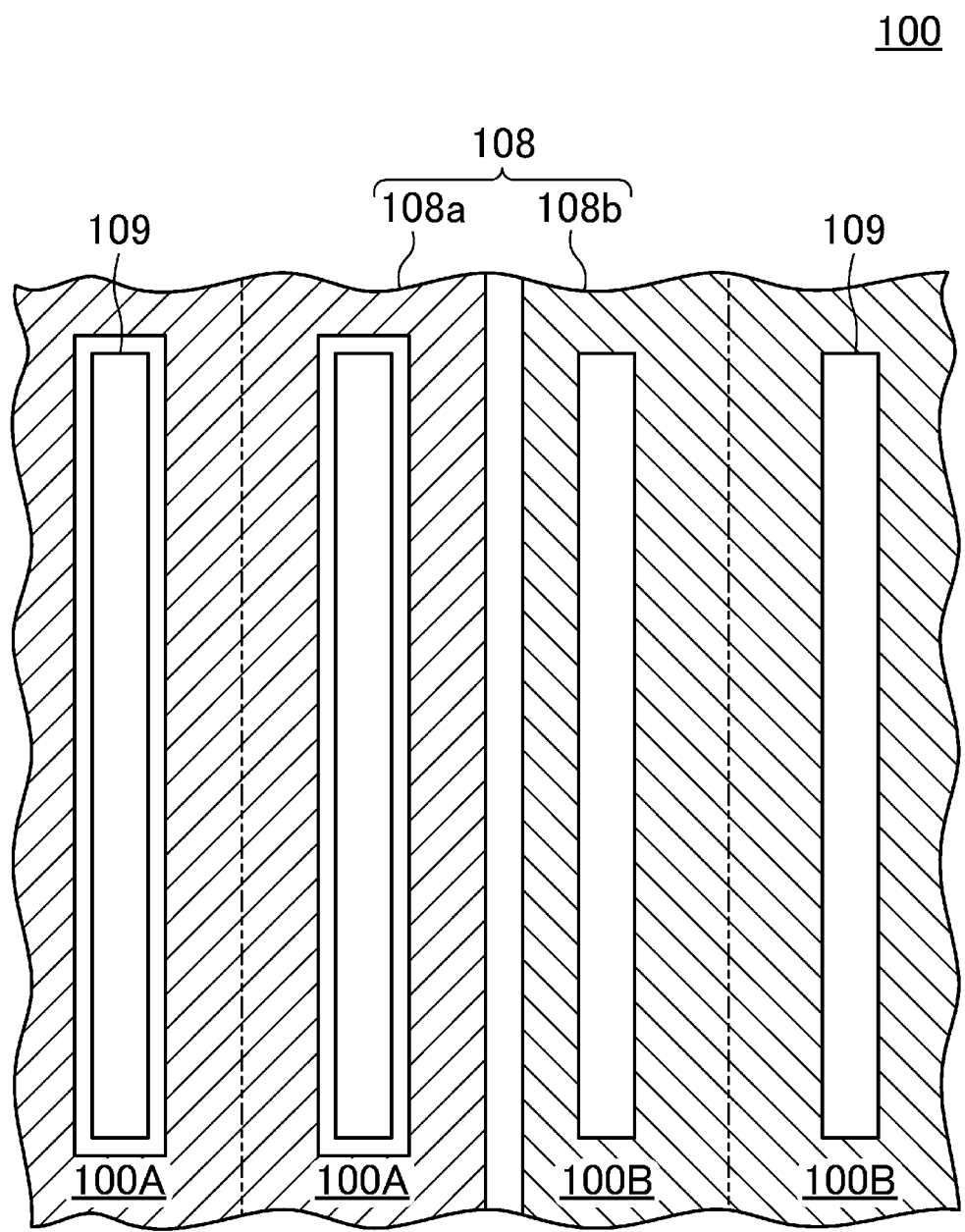
FIG. 6 is a plan view illustrating a variation of the semiconductor device according to the first embodiment.

In FIG. 3, an example in which the first cells 100A and the second cells 100B are arranged in a square lattice pattern. However, as illustrated in FIG. 5, the first cells 100A and the second cells 100B may be offset by a half cycle. Although examples in which the first cells 100A and the second cells 100B have a square shape have been shown in FIGS. 3 and 5, the first cells 100A and the second cells 100B may have a rectangular shape as illustrated in FIG. 6. Alternatively, the first cells 100A and the second cells 100B may have a polygonal shape such as a hexagonal shape.

Figure 7:
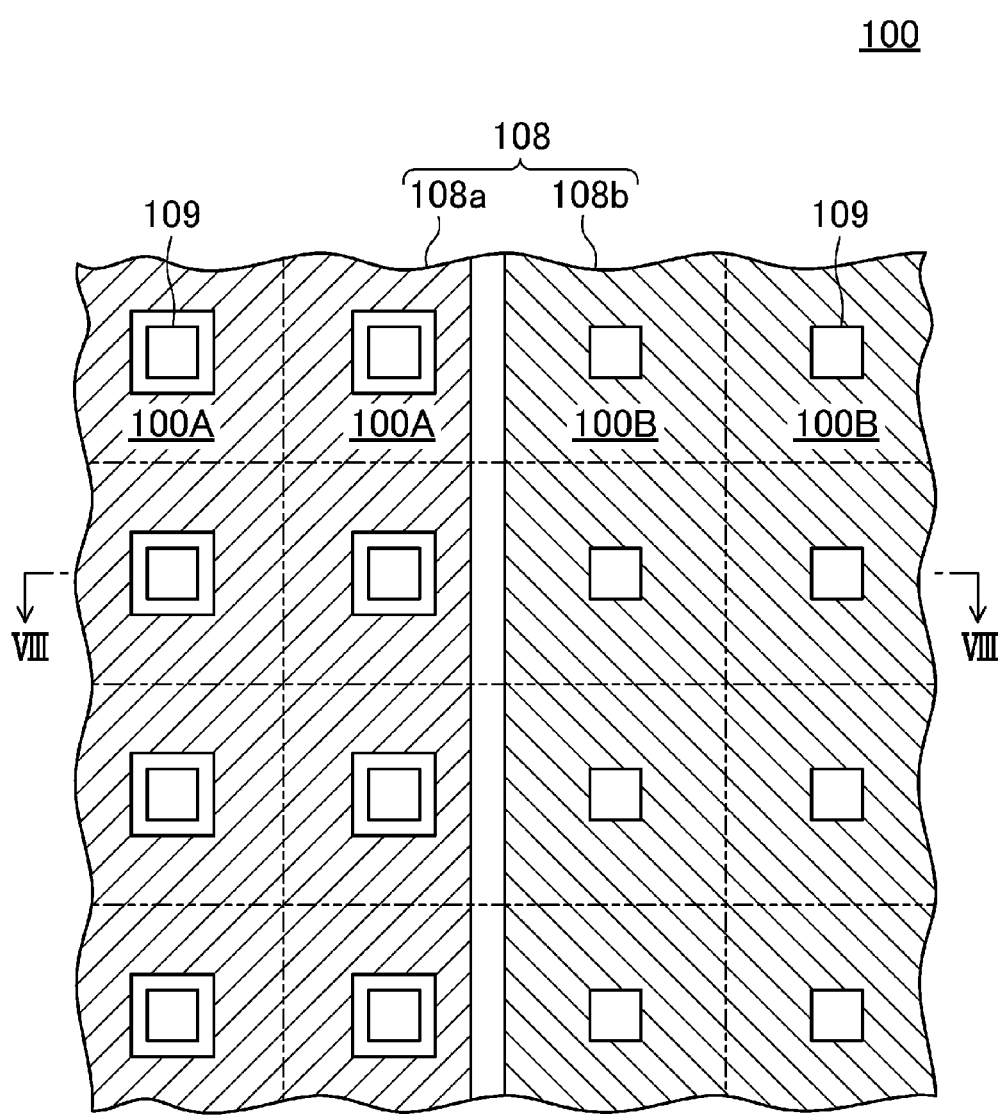
FIG. 7 is a plan view illustrating a variation of the semiconductor device according to the first embodiment.
Figure 8:
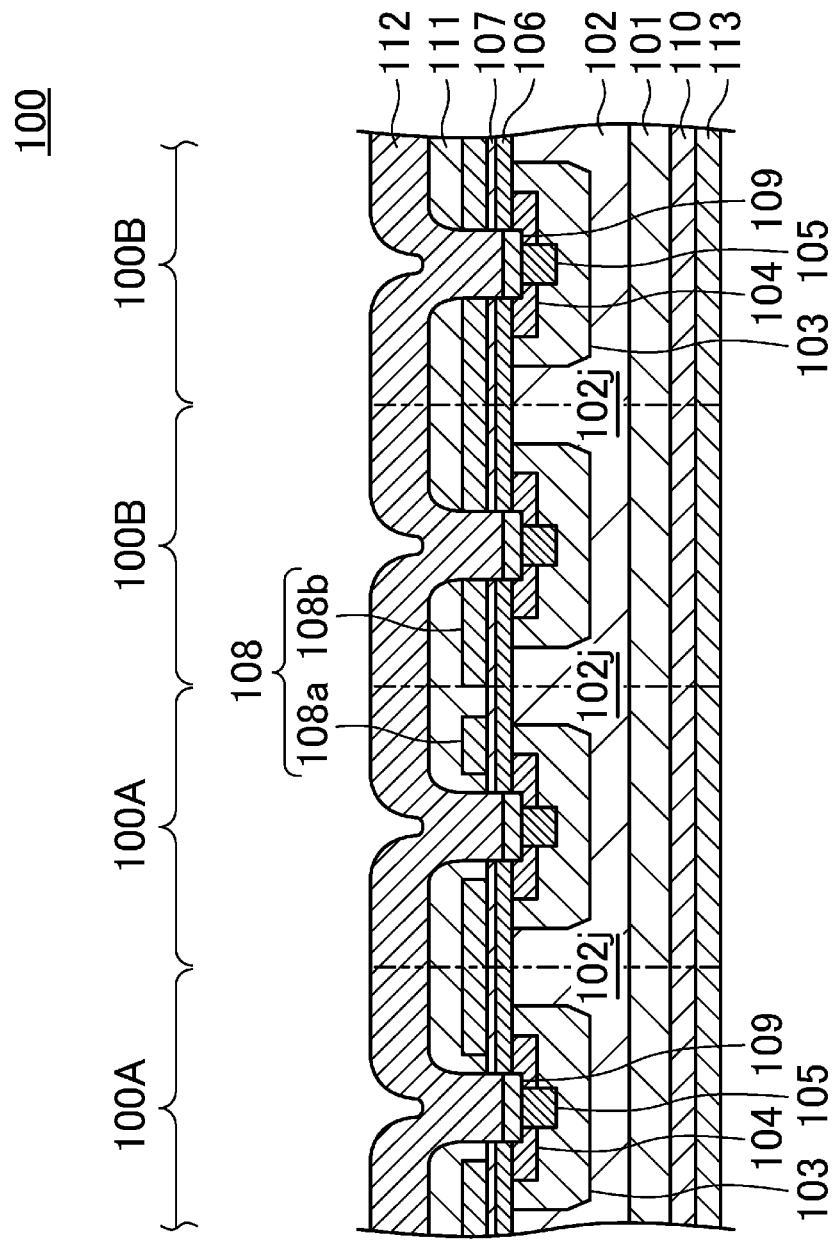
FIG. 8 is a cross-sectional view along the line VIII-VIII of FIG. 7.

As illustrated in FIGS. 7 and 8, in a first cell 100A adjacent to a second cell 100B, a region in which a gate electrode 108a is not formed may be formed in a portion adjacent to the second cell 100B. In this case, in the first cell 100A adjacent to the second cell 100B, the area of the gate electrode 108a is slightly smaller than in other first cells 100A.

Figure 9:
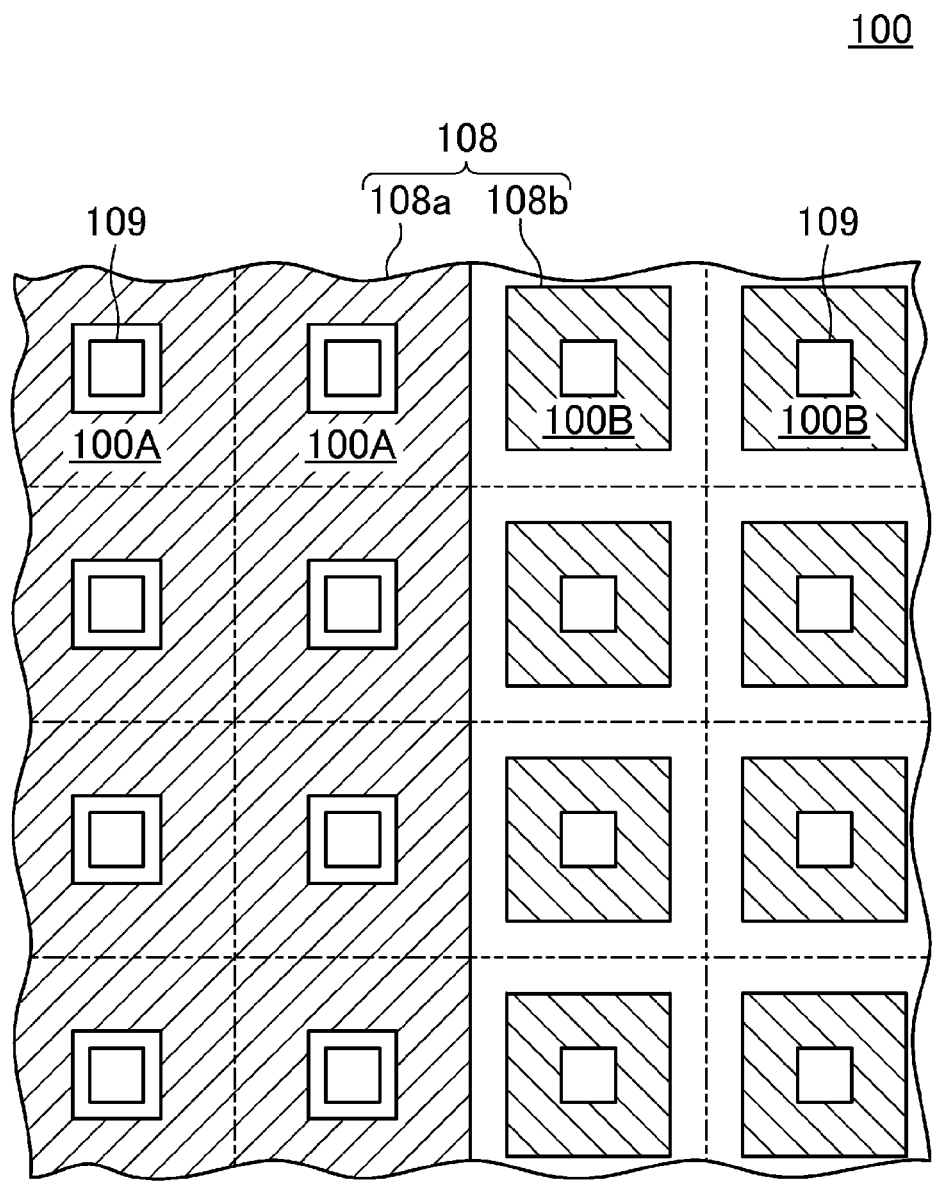
FIG. 9 is a plan view illustrating a variation of the semiconductor device according to the first embodiment.

The first control electrodes 108b do not need to be physically connected to each other between the plurality of second cells 100B. Therefore, as illustrated in FIG. 9, part of first control electrodes 108b may be removed from outer edge portions of all second cells 100B so that the first control electrodes 108b is physically separated from each other.

Figure 10:
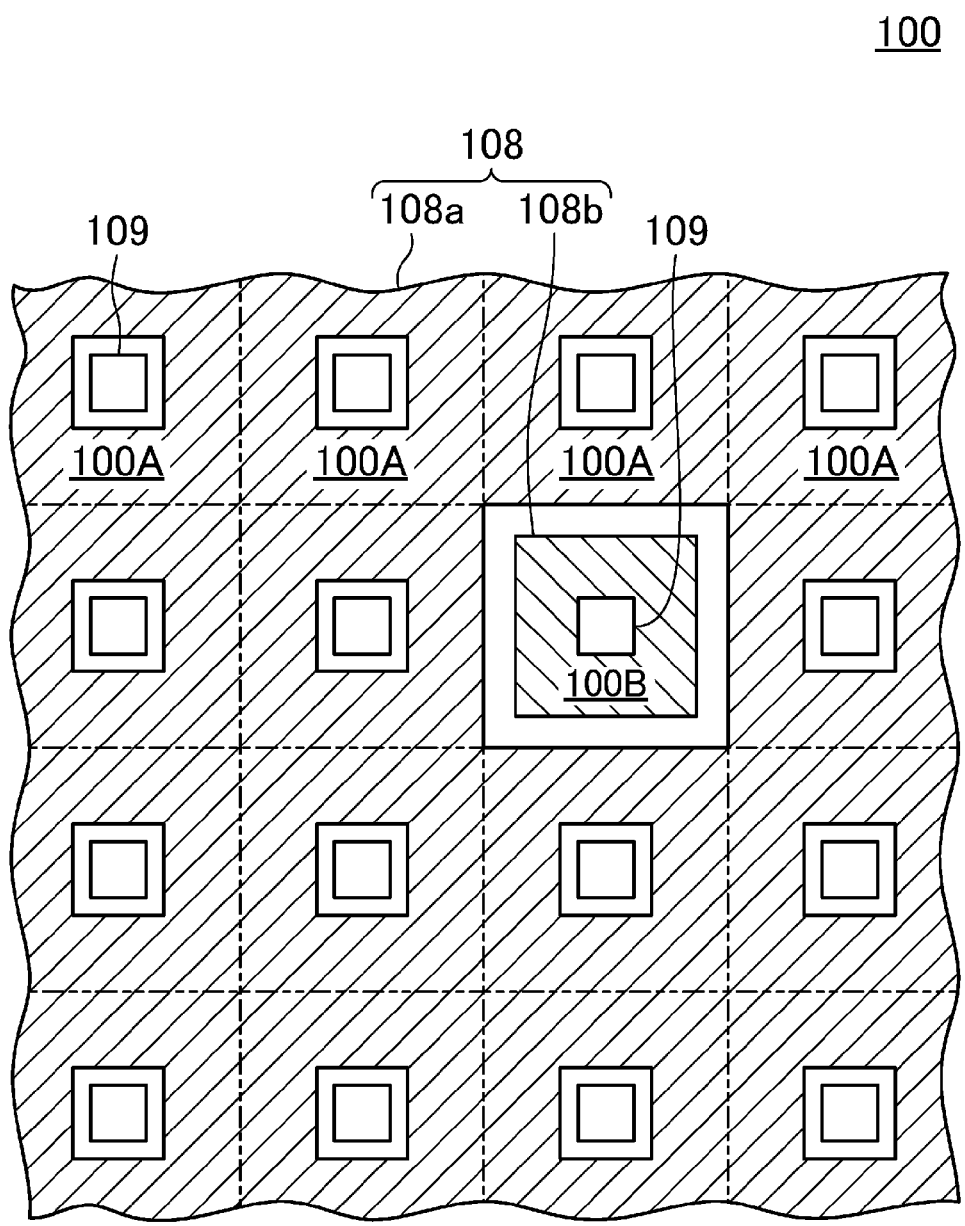
FIG. 10 is a plan view illustrating a variation of the semiconductor device according to the first embodiment.
Figure 11:
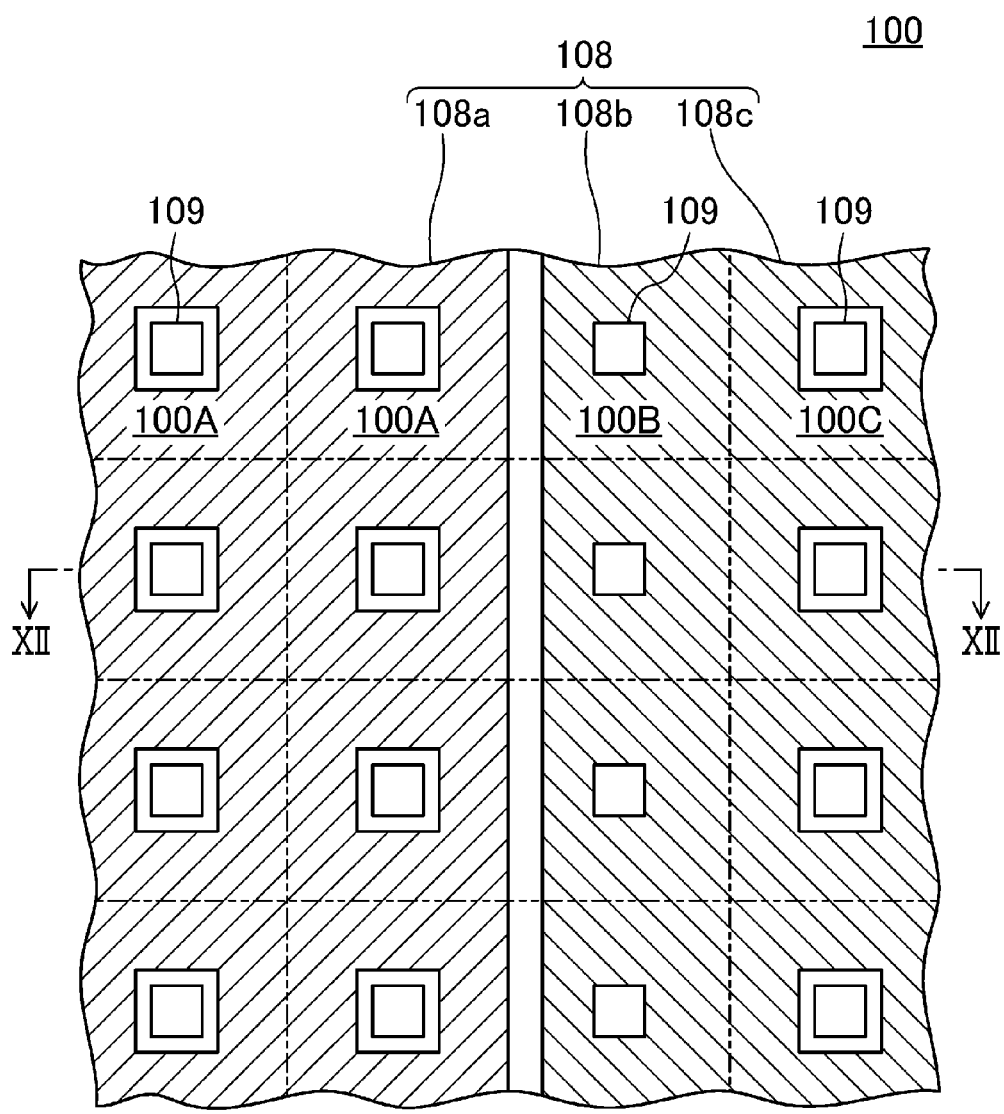
FIG. 11 is a plan view illustrating a variation of the semiconductor device according to the first embodiment.

In this case, as illustrated in FIG. 10, a second cell 100B may be surrounded by first cells 100A. Also with this configuration, a second semiconductor element provided in the second cell 100B functions as a unipolar channel diode. A first cell 100A may be surrounded by second cells 100B.

Figure 12:
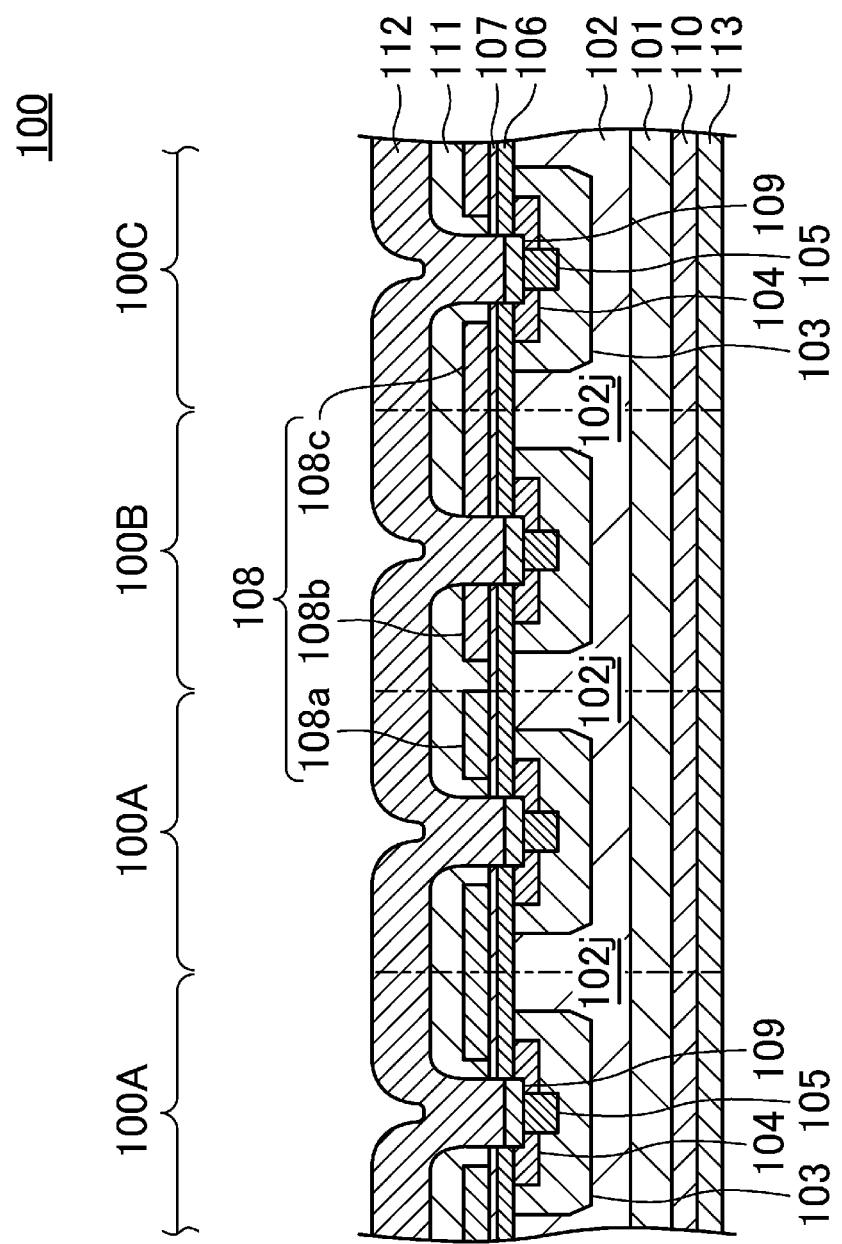
FIG. 12 is a cross-sectional view along the line XII-XII of FIG. 11.
Figure 13:
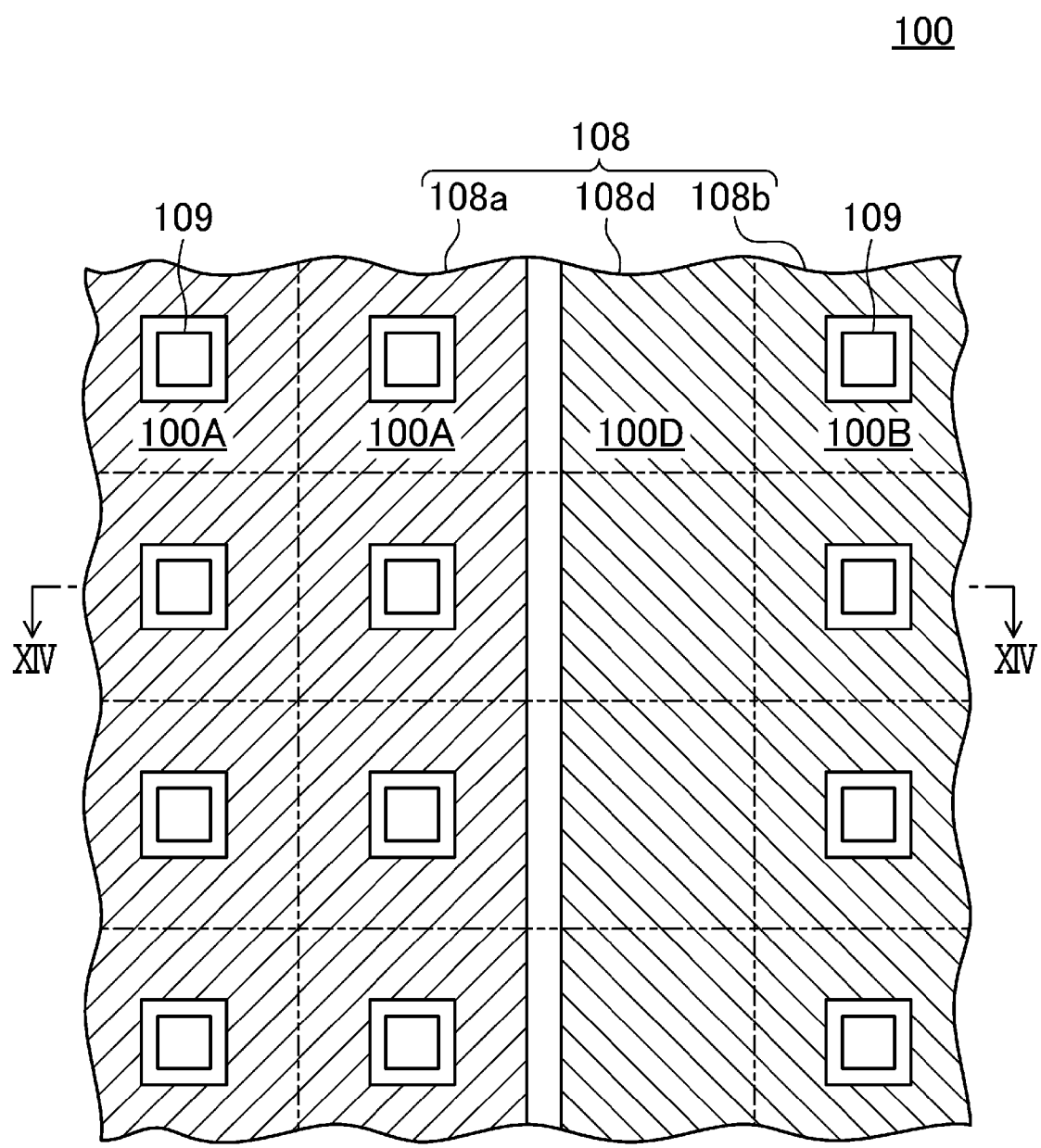
FIG. 13 is a plan view illustrating a variation of the semiconductor device according to the first embodiment.

When a conductive film 108 provided on a channel of a cell is electrically insulated from a gate electrode 108a and is electrically connected to a first ohmic electrode 109, such a cell can function as a channel diode. Therefore, a third cell 100C as illustrated in FIGS. 12 and 13 may be provided. A portion 108c of the conductive film 108 formed in the third cell 100C is not in contact with the upper electrode 112. The portion 108c is physically separated and electrically insulated from the gate electrode 108a. However, the portion 108c is in contact with the first control electrode 108b, which is a portion of the conductive film 108 formed in the second cell 100B. Thus, the portion 108c is electrically connected to a first ohmic electrode 109 of the third cell 100C via the first control electrode 108b and the upper electrode 112. Therefore, the portion 108c of the conductive film 108 formed in the third cell 100C is a second control electrode 108c, and thus a third semiconductor element provided in the third cell 100C also functions as a channel diode. The electric potential of the second control electrode 108c is substantially equal to that of the first ohmic electrode 109 of the third cell 100C. Thus, the second control electrode 108c does not control the electric potential of a second silicon carbide semiconductor layer 106 independently of the electric potential of the first ohmic electrode 109 of the third cell 100C. Although an example in which the second cell 100B is adjacent to the first cell 100A has been described, the position of the second cell 100B is not limited. At least one second cell 100B may be provided.

Figure 14:
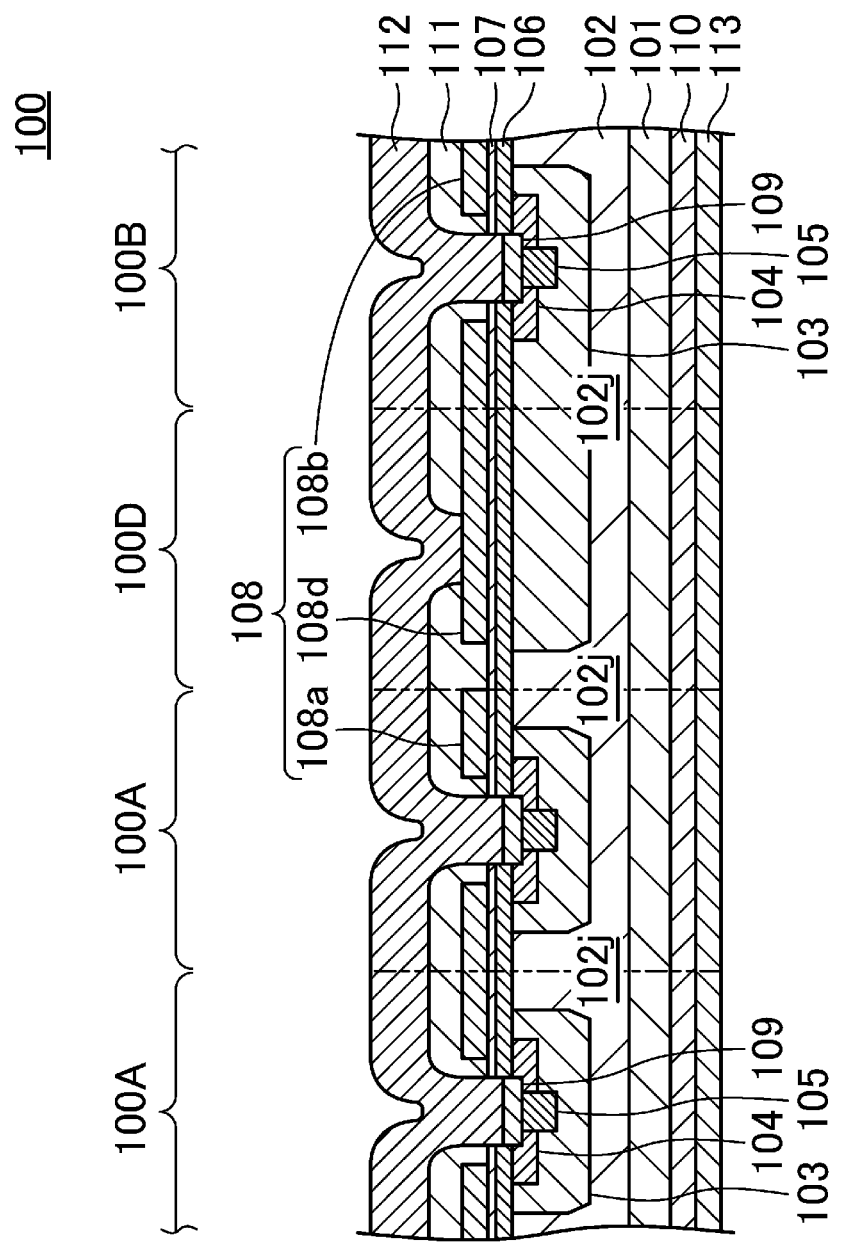
FIG. 14 is a cross-sectional view along the line XIV-XIV of FIG. 13.

Alternatively, a configuration as illustrated in FIGS. 13 and 14 may be possible. As illustrated in FIGS. 13 and 14, a fourth cell 100D is provided between the second cell 100B and the first cell 100A. The fourth cell 100D includes a first region 103 integrated with the first region 103 of the second cell 100B but includes neither a second region 104 nor a first ohmic electrode 109. In the fourth cell 100D, the first region 103 can be provided from the point of view of a breakdown voltage. With this configuration, a desirable breakdown voltage (e.g., 1 kV or higher) can be ensured. Note that if a necessary breakdown voltage can be ensured, it is not necessary to provide the first region 103 in the fourth cell 100D. The first region 103 of the fourth cell 100D is integrated with the first region 103 of the second cell 100B, which can prevent the electric potential of the first region 103 in the fourth cell 100D from floating.

In FIG. 14, the first control electrode 108b provided in the second cell 100B is spaced apart from and is not in contact with the upper electrode 112. A portion 108d of the conductive film 108 provided in the fourth cell 100D is in contact with the first control electrode 108b provided in the second cell 100B and is physically separated and insulated from the gate electrode 108a provided in the first cell 100A. On the other hand, in a contact hole formed in the interlayer insulating film 111, the portion 108d is in contact with the upper electrode 112 and is electrically connected to the first ohmic electrode 109 provided in the second cell 100B. Therefore, the first control electrode 108b provided in the second cell 100B is electrically connected to the first ohmic electrode 109 of the second cell 100B via the portion 108d provided in the fourth cell 100D and the upper electrode 112. Thus, the second semiconductor element provided in the second cell 100B functions as a channel diode. The portion 108d is hereinafter referred to as a connection electrode 108d. The electric potential of the connection electrode 108d is substantially equal to the electric potential of the first ohmic electrode 109 of the second cell 100B. Therefore, the connection electrode 108d does not control the electric potential of a second silicon carbide semiconductor layer 106 independently of the electric potential of the first ohmic electrode 109 of the second cell 100B.

With the configuration illustrated in FIGS. 13 and 14, physical connection between the connection electrode 108d of the conductive film 108 provided in the fourth cell 100D and the upper electrode 112 can be improved, which can reduce defective conduction, etc. A silicide layer may be provided in a portion of the connection electrode 108d which is in contact with the upper electrode 112. Since the fourth cell 100D operates neither as a transistor nor as a diode, reducing the size of the connection electrode 108d affects neither the characteristic as a transistor nor the characteristic as a diode. Therefore, it is possible to increase the distance between the connection electrode 108d and the gate electrode 108a. For example, when a cell is about 10-μm square, it is possible to ensure a distance of about 1 μm between the connection electrode 108d and the gate electrode 108a, and it is possible to further reduce short circuits between the gate electrode 108a and the first ohmic electrode 109 of the second cell 100B.

In FIGS. 13 and 14, the first control electrode 108b of the conductive film 108 provided in the second cell 100B is not in contact with the upper electrode 112, but in at least some of second cells 100B, first control electrodes 108b may be in contact with upper electrodes 112. Although an example in which the first region 103 provided in the fourth cell 100D is integrated with the first region 103 provided in the second cell 100B has been described, the first region 103 provided in the fourth cell 100D may be integrated with the first region 103 provided in the first cell 100A. When the first region 103 provided in the fourth cell 100D is integrated with the first region 103 provided in the second cell 100B, the number of cells functioning as transistors can be increased compared to when the first region 103 provided in the fourth cell 100D is integrated with the first region 103 provided in the first cell 100A.

Figure 15:
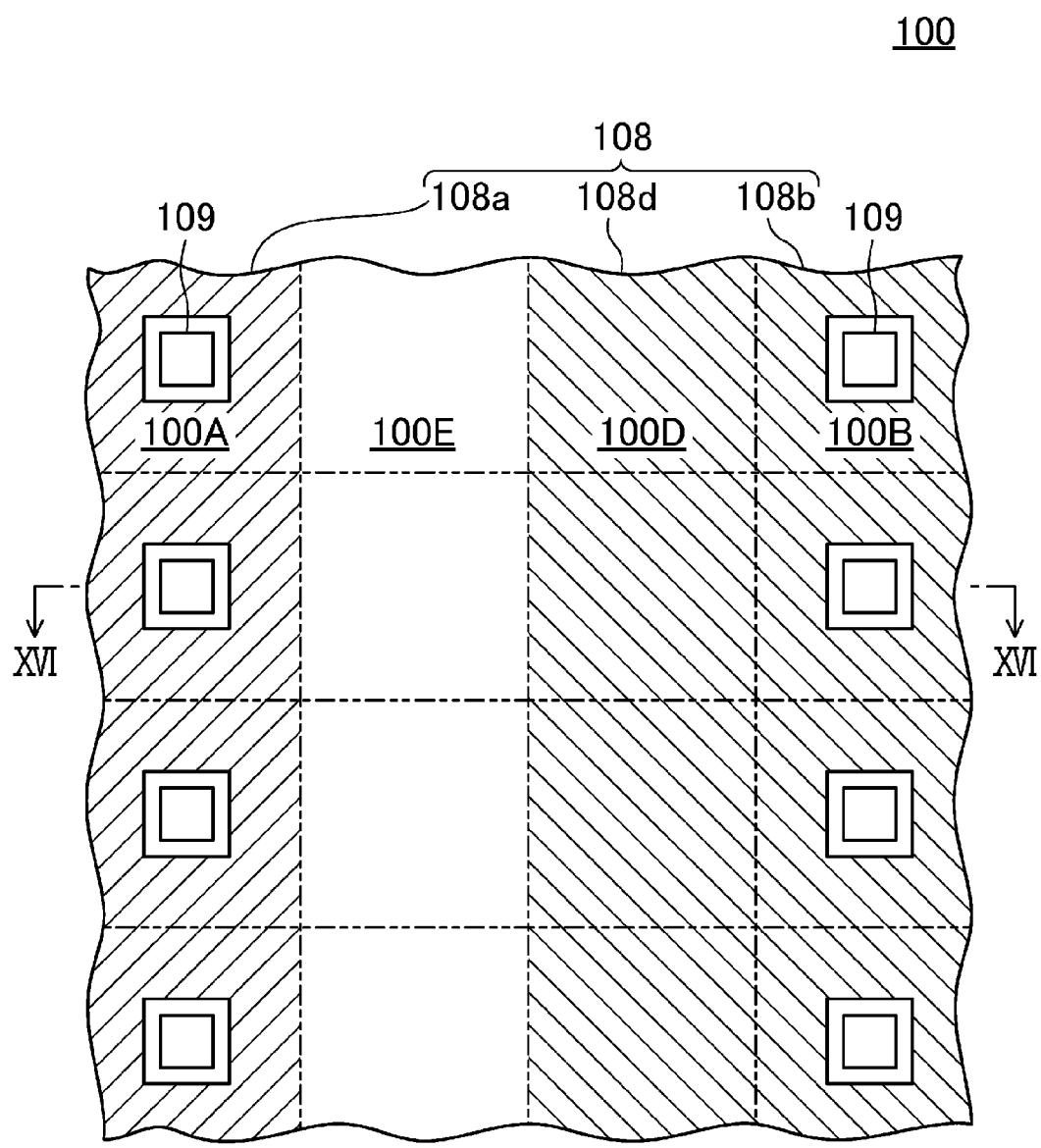
FIG. 15 is a plan view illustrating a variation of the semiconductor device according to the first embodiment.
Figure 16:
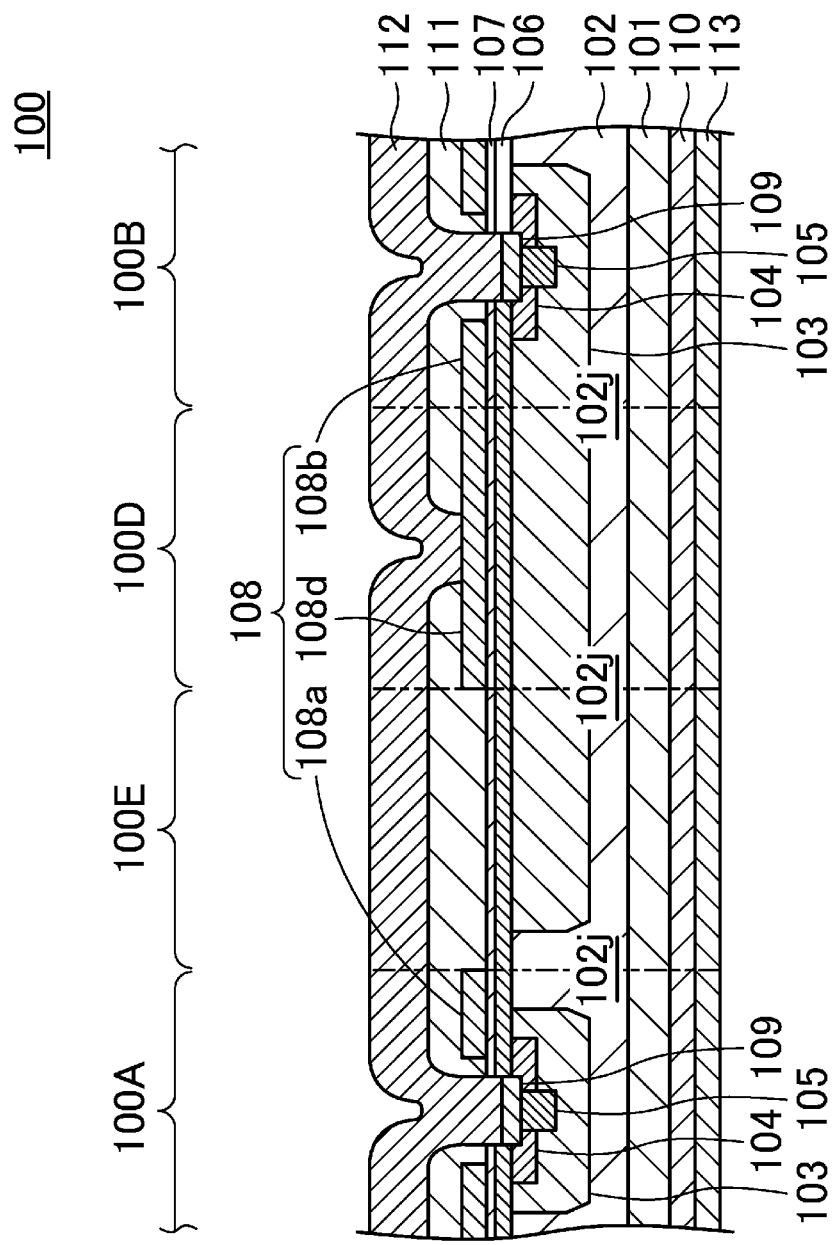
FIG. 16 is a cross-sectional view along the line XVI-XVI of FIG. 15.

As illustrated in FIGS. 15 and 16, a fifth cell 100E may be provided between the fourth cell 100D and the first cell 100A. The fifth cell 100E has a first region 103 integrated with the first regions 103 of the fourth cell 100D and the second cell 100B. In the fifth cell 100E, the first region 103 can be provided from the point of view of a breakdown voltage. With this configuration, a desirable breakdown voltage (e.g., 1 kV or higher) can be ensured. Note that if a required breakdown voltage can be ensured, the first region 103 does not need to be provided in the fifth cell 100E, and the first region 103 does not need to be provided in the fourth cell 100D. The first region 103 of the fifth cell 100E is integrated with the first regions 103 of the fourth cell 100D and the second cell 100B, which can prevent the electric potential of the first region 103 in the fifth cell 100E from floating.

No conductive film 108 is provided in the fifth cell 100E. Therefore, it is possible to ensure a distance, which corresponds to one cell, from the connection electrode 108d of the conductive film 108 provided in the fourth cell 100D and the first control electrode 108b of the conductive film 108 provided in the second cell 100B to the gate electrode 108a. For example, when a cell is about 10-μm square, it is possible to ensure a distance of about 10 μm from the connection electrode 108d and the first control electrode 108b to the gate electrode 108a. With this configuration, it is possible to ensure a reduction in short circuit from the connection electrode 108d and the first control electrode 108b to the gate electrode 108a.

In FIGS. 15 and 16, the first control electrode 108b of the conductive film 108 provided in the second cell 100B is not in contact with the upper electrode 112, but in at least some of second cells 100B, first control electrodes 108b may be in contact with upper electrodes 112. In this case, the fourth cell 100D does not need to be provided. Although an example in which the first region 103 provided in the fifth cell 100E is integrated with the first region 103 provided in the second cell 100B has been described, the first region 103 provided in the fifth cell 100E may be integrated with the first region 103 provided in the first cell 100A. When the first region 103 provided in the fifth cell 100E is integrated with the first region 103 provided in the second cell 100B, the number of cells functioning as transistors can be increased compared to when the first region 103 provided in the fifth cell 100E is integrated with the first region 103 provided in the first cell 100A.

Although an example in which the gate electrodes 108a of the conductive film 108 formed in the first cells 100A are integrated with each other has been described, the gate electrodes 108a may be electrically connected to each other. Thus, gate electrodes 108a physically separated from and independent of each other may be formed, and the gate electrodes 108a may be electrically connected to each other via gate interconnects, etc.

The first semiconductor element formed in the first cell 100A includes the first ohmic electrode (source electrode) 109 electrically connected to the second silicon carbide semiconductor layer 106, the second ohmic electrode (drain electrode) 110, and the gate electrode 108a configured to control a current flowing through the second silicon carbide semiconductor layer 106, and functions as a MISFET. When a voltage Vgs applied to the gate electrode 108a with reference to the first ohmic electrode 109 is greater than or equal to a threshold voltage Vth, the first semiconductor element is in an ON state. Thus, when a voltage Vds applied to the second ohmic electrode 110 with reference to the first ohmic electrode 109 is greater than 0 V, a current flows from the second ohmic electrode 110 in the first cell 100A via the semiconductor substrate 101, the drift region and the JFET region 102j of the first silicon carbide semiconductor layer 102, the second silicon carbide semiconductor layer (channel layer) 106, and the second region (source region) 104 to the first ohmic electrode 109. On the other hand, the second semiconductor element formed in the second cell 100B includes no gate electrode. Thus, in the second cell 100B, when the voltage Vgs is greater than or equal to the threshold voltage Vth and the voltage Vds is greater than 0, a current does not flow from the second ohmic electrode 110 to the first ohmic electrode 109.

When the voltage Vgs is less than the threshold voltage Vth, the first semiconductor element is in an OFF state. However, even when the first semiconductor element is in the OFF state, if the voltage Vgs is less than the threshold voltage Vth and the voltage Vds is less than 0 V, the impurity concentration of the first region 103 and the impurity concentration and the thickness of the second silicon carbide semiconductor layer 106 are appropriately selected, thereby forming a diode which allows a current to flow from the first ohmic electrode 109 to the second ohmic electrode 110 via the second silicon carbide semiconductor layer 106 serving as a channel of the MISFET. A diode allowing a current to flow from the first ohmic electrode 109 to the second ohmic electrode 110 via the second silicon carbide semiconductor layer 106 is hereinafter referred to as a channel diode. A direction from the second ohmic electrode 110 to the first ohmic electrode 109 is defined as a "forward direction," and a direction from the first ohmic electrode 109 to the second ohmic electrode 110 is defined as a "reverse direction." Here, the channel diode allows a current to flow in the reverse direction.

The channel diode has such a characteristic that when the voltage Vds is greater than a predetermined voltage Vf1 (where Vf1 is a negative value) determined based on the characteristic of the channel diode, the channel diode does not allow a current greater than or equal to 1 mA to flow, and when the voltage Vds is less than or equal to the predetermined voltage Vf1, the channel diode allows a current greater than or equal to 1 mA to flow. When the voltage Vds is greater than the predetermined voltage Vf1, a current flowing through the channel diode is almost 0 (less than 1 mA). However, when the voltage Vds is gradually reduced from 0 V (the absolute value of the voltage Vds is increased), a current flowing through the channel diode at the time when the voltage Vds reaches the predetermined voltage Vf1 is 1 mA. When the absolute value of the voltage Vds is further increased, the current flowing through the channel diode further increases. Therefore, the predetermined voltage Vf1 corresponds to a turn-on voltage in the current-voltage characteristic of the diode.

Main factors which determine the turn-on voltage Vf1 of the diode and the threshold voltage Vth of the transistor are the impurity concentration of the first region 103, the impurity concentration and the thickness of the second silicon carbide semiconductor layer 106, and the thickness of the insulating film 107. The threshold voltage Vth is generally greater than 0 V when the semiconductor element is used as a power transistor.

In the first semiconductor element, a body diode is also formed by the drift region of the first silicon carbide semiconductor layer 102 and the first region 103. The voltage Vf at which a current start flowing through the body diode is a turn-on voltage generated due to the pn junction and is about 2.5 V at a room temperature. When the impurity concentration of the first region 103 and the impurity concentration of the second silicon carbide semiconductor layer 106 are increased, the absolute value of the turn-on voltage Vf1 can be reduced to a value less than the absolute value of the voltage Vf. When the absolute value of the turn-on voltage Vf1 is less than the absolute value of the voltage Vf, the first semiconductor element allows a current to flow to the channel diode before a current flows through the body diode in the case where the MISFET is in an OFF state, and the voltage Vgs is less than the threshold voltage Vth, and the voltage Vds is less than 0 V. The first semiconductor element may be an element which allows a current to flow to the channel diode also when the voltage Vgs is greater than 0 V, and the voltage Vds is less than 0 V, with the above-described conditions being satisfied. Note that in the present embodiment, an example in which a negative voltage is applied to the gate when the transistor is off has been mainly described, but the gate voltage when the transistor is off may be zero.

The first semiconductor element provided in the first cell 100A functions as a MISFET including a freewheeling diode as described above. In the second semiconductor element provided in the second cell 100B, the first control electrode 108b of the conductive film 108 is electrically insulated from the gate electrode 108a, and thus open/close operation of the channel is not performed, so that the second semiconductor element does not function as a MISFET. Therefore, even when the voltage Vds is positive, a current does not flow in the second cell 100B. However, since the second semiconductor element also functions as a channel diode almost similar to the first semiconductor element, a current flows from the first ohmic electrode 109 to the second ohmic electrode 110 via the channel also in the second cell 100B when the voltage Vds is negative. The absolute value of a voltage Vf2 at which a current starts flowing via the channel in the second semiconductor element is also less than the absolute value of the voltage Vf at which a current starts flowing through the body diode. The on-state current of the channel diode of the first semiconductor element is limited since a negative bias is applied to the gate electrode 108a. However, in the channel diode of the second semiconductor element, the first control electrode 108b of the conductive film 108 is electrically connected to the first ohmic electrode 109 and has an electric potential substantially equal to the electric potential of the first ohmic electrode 109, so that the on-state current is not limited by the gate electrode. Thus, the absolute value of the voltage Vf2 is less than the absolute value of the voltage Vf1.

Figure 17:
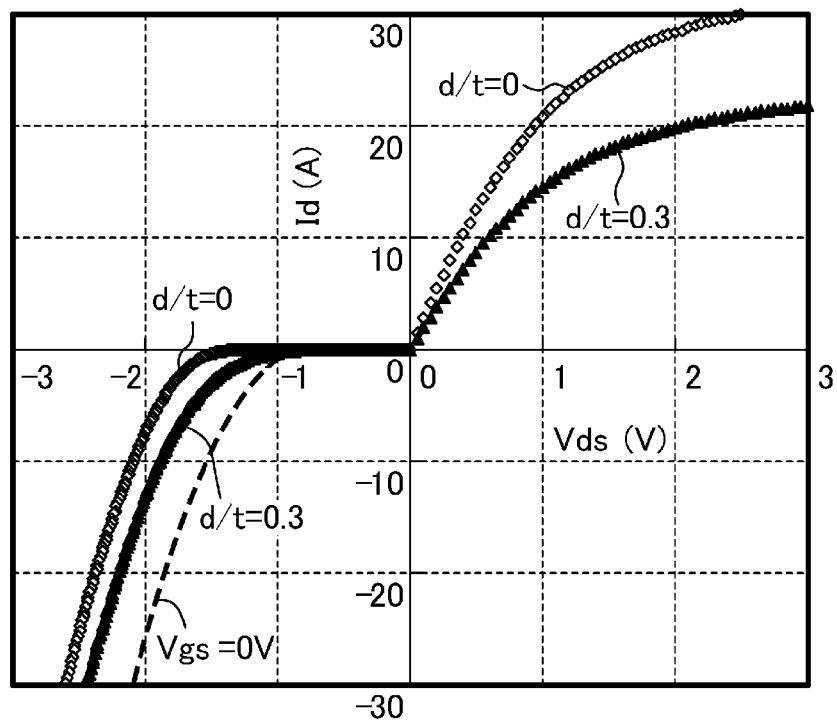
FIG. 17 is a graph illustrating the voltage-current characteristic of the semiconductor device according to the first embodiment.

FIG. 17 shows a result obtained by computing the current-voltage characteristic of the semiconductor device 100 of the present embodiment at a room temperature based on a value of a current flowing through a unit cell. Note that each of the first cell 100A and the second cell 100B is about 10-µm square, and a total number t of the first cells 100A and the second cells 100B (total cell number) is 140,000. A ratio d/t of the number d of the second cells 100B to the total cell number t is 0.3. Moreover, a current-voltage characteristic of a semiconductor device in which all the cells are first cells 100A, no second cell 100B is provided, and thus the ratio d/the is 0 is shown for comparison.

As illustrated in the upper right quadrant in FIG. 17, an on-state current of the semiconductor device 100 serving as a transistor is less than that of the semiconductor device in the comparative example including no second cell 100B. Note that in the upper right quadrant of FIG. 17, an example in which the voltage Vgs applied to the gate electrode 108a with reference to the first ohmic electrode 109 is 20 V is shown.

In the lower left quadrant of FIG. 17, a diode characteristic in the case where the voltage Vgs is −5 V is shown. For comparison, the characteristic in the case where the voltage Vgs is 0 V is also shown. As illustrated in the lower left quadrant, the diode characteristic in the case where the voltage Vgs is −5 V is improved compared to the diode characteristic of the transistor of the comparative example including no second cell 100B, and approximates to the characteristic in the case where the voltage Vgs is 0 V.

Figure 18:
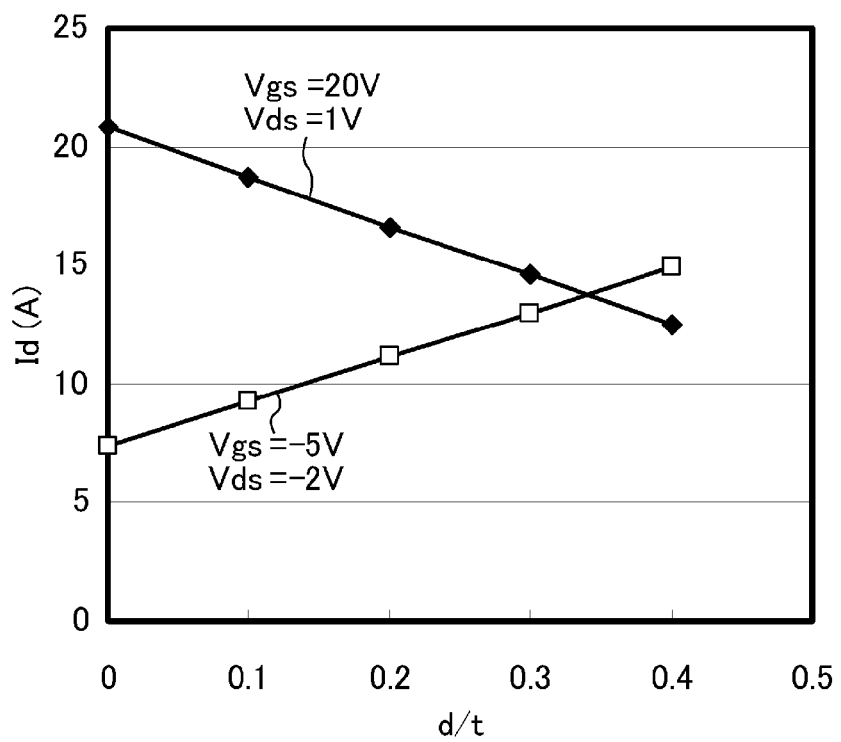
FIG. 18 is a graph illustrating the correlation between the ratio of second cells and the current characteristic.
Figure 19:
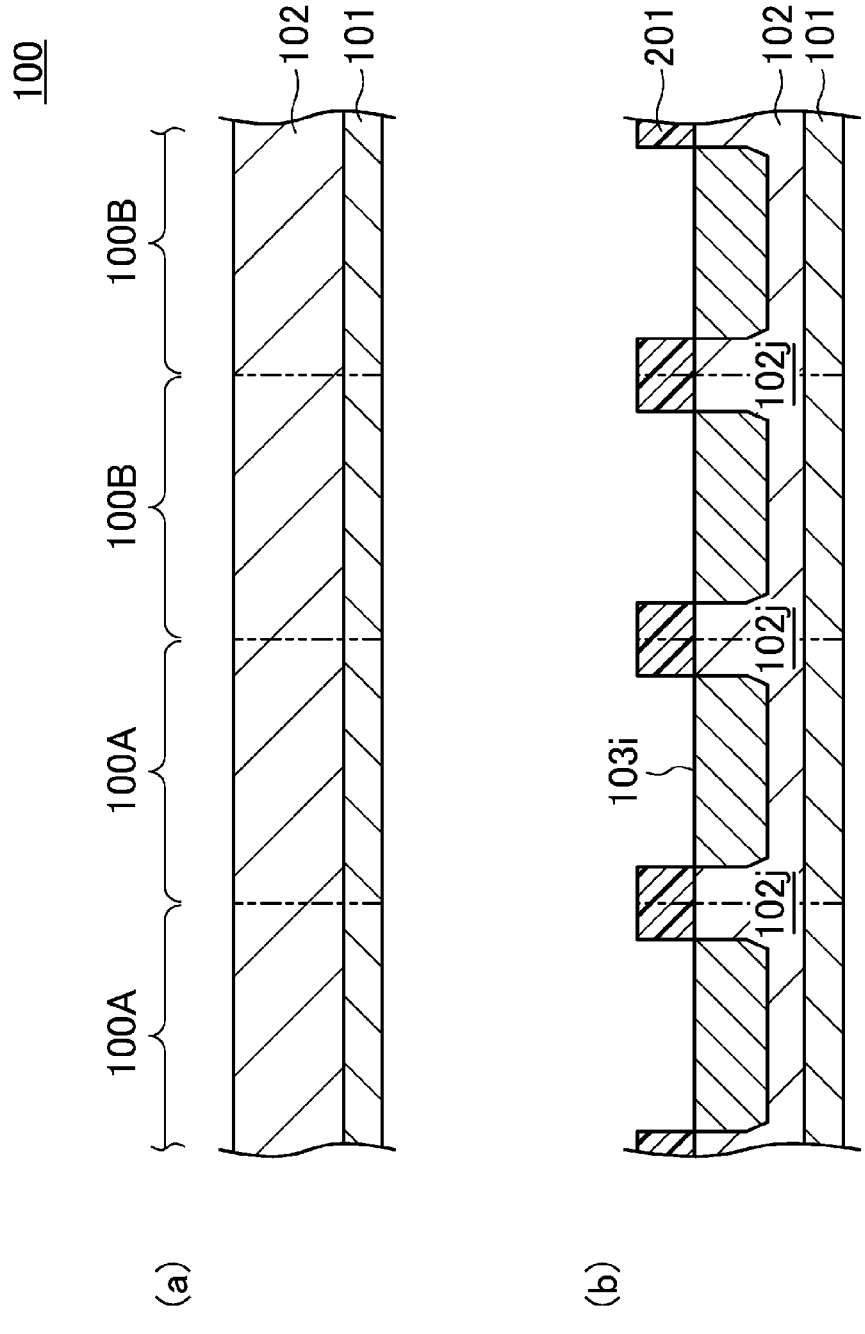
FIGS. 19(a) and 19(b) are cross-sectional views illustrating steps in a method for fabricating the semiconductor device according to the first embodiment in a sequential order.
Figure 20:
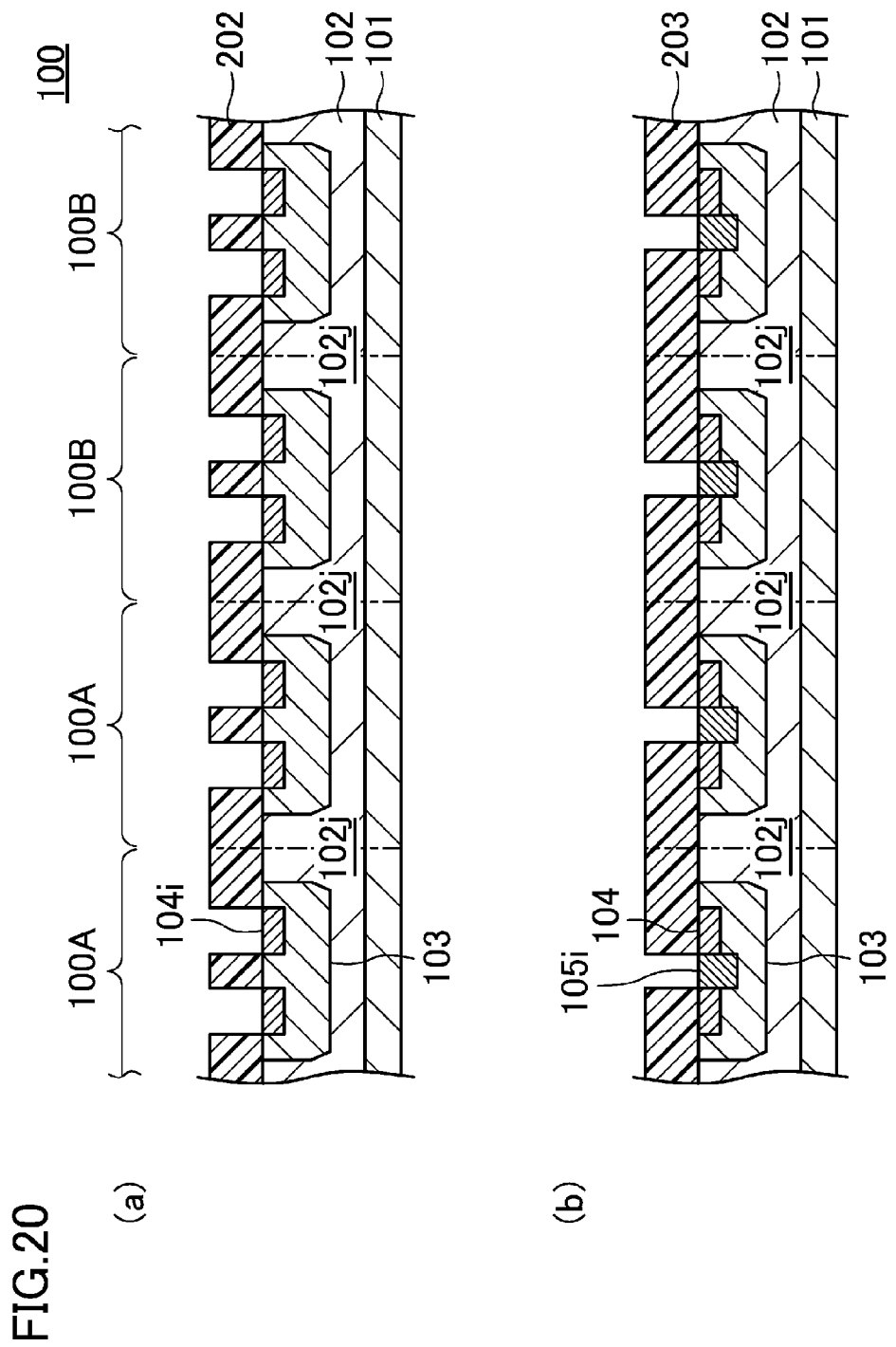
FIGS. 20(a) and 20(b) are cross-sectional views illustrating steps in a variation of the method for fabricating the semiconductor device according to the first embodiment in a sequential order.
Figure 21:
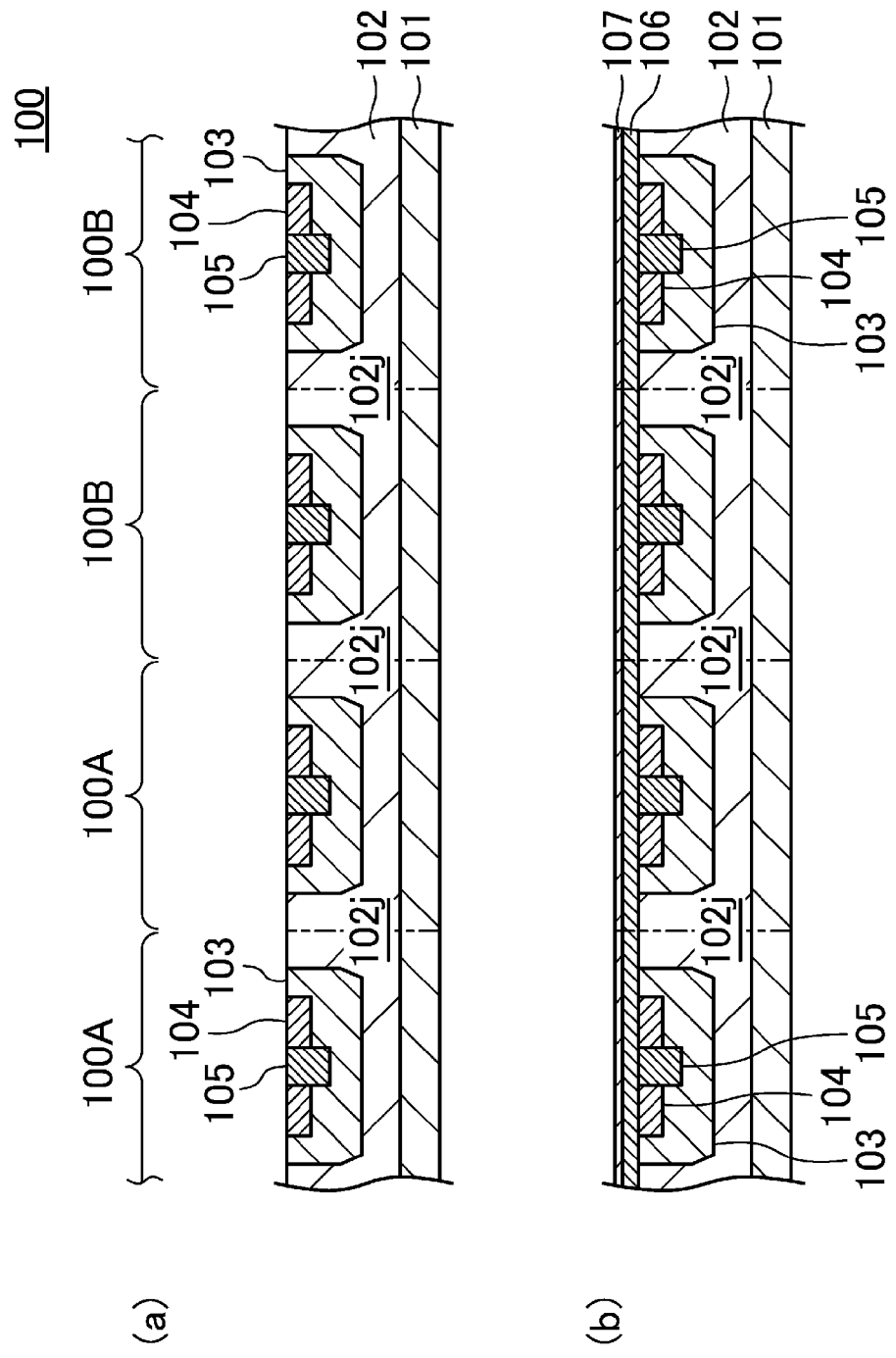
FIGS. 21(a) and 21(b) are cross-sectional views illustrating steps in the method for fabricating the semiconductor device according to first embodiment in a sequential order.

FIG. 18 shows the relationship between the absolute value of a drain current Id in the case where the voltage Vgs is 20 V and the voltage Vds is 1 V and the ratio d/t in the semiconductor device 100, and the relationship between the absolute value of a drain current Id in the case where the voltage Vgs is −5 V and the voltage Vds is −2 V and the ratio d/t in the semiconductor device 100. In the case where the voltage Vgs is 20 V and the voltage Vds is 1 V, the semiconductor device 100 exhibits a characteristic as a transistor, and in the case where the voltage Vgs is −5 V and the voltage Vds is −2 V, the semiconductor device 100 exhibits a characteristic as a freewheeling diode. When the ratio of the second cells 100B is increased, a current which the semiconductor device 100 as a freewheeling diode allows to flow can be increased compared to the case where the ratio d/t is 0 and no second cell 100B is provided. On the other hand, a current which the semiconductor device 100 as a transistor allows to flow decreases. Thus, the value of the ratio d/t may be appropriately adjusted so that requirements of an electronic circuit to which the semiconductor device 100 is applied are satisfied, and the semiconductor device 100 effectively functions both as a transistor and a freewheeling diode.

As described above, in the semiconductor device of the present embodiment, the value of the ratio d/t is appropriately adjusted, so that a sufficient current can flow from the source to the rain even when the voltage Vgs is negative, and it is not necessary to externally provide a freewheeling diode even when the semiconductor device is used in an inverter circuit, etc.

When the third cell 100C is provided, the third cell 100C also functions similar to the second cell 100B.

Next, with reference to FIGS. 19-23, an example method for fabricating the semiconductor device 100 will be described. Note that specific values, materials, process conditions described below are mere examples.

First, a semiconductor substrate 101 is prepared. The semiconductor substrate 101 can be, for example, an n-type miscut 4H—SiC (0001) substrate and has a low resistance (resistivity: 0.02 Ωcm).

As illustrated in FIG. 19(a), a first silicon carbide semiconductor layer 102 having a high resistance is epitaxially grown on the semiconductor substrate 101. Before the first silicon carbide semiconductor layer 102 is formed, a buffer layer having a high impurity concentration and made of SiC may be deposited on the semiconductor substrate 101. The buffer layer may have an impurity concentration of, for example, $1 \times 10^{18}$ cm$^{-3}$ and a thickness of, for example, 1 µm. The first silicon carbide semiconductor layer 102 is made of, for example, n-type 4H—SiC. The impurity concentration and the thickness of the first silicon carbide semiconductor layer 102 may be, for example, $1 \times 10^{16}$ cm$^{-3}$ and 10 µm, respectively.

Next, as illustrated in FIG. 19(b), a mask 201 made of, for example, SiO$_2$ is formed on the first silicon carbide semiconductor layer 102, and for example, aluminum (Al) ions are implanted to the first silicon carbide semiconductor layer 102, thereby forming implantation regions 103i. The implanted ions are activated, so that the implantation regions 103i serve as first regions 103. Regions of the first silicon carbide semiconductor layer 102 other than the first regions 103 are drift regions. The impurity concentration (dopant concentration) of each first region 103 is adjusted to, for example, about $2 \times 10^{19}$ cm$^3$ near a position 100 nm from a surface of the first silicon carbide semiconductor layer 102. The junction depth of a pn junction between each first region 103 and the first silicon carbide semiconductor layer 102 can be about 0.5-1 µm. In order to obtain a breakdown voltage required for the semiconductor device 100, the impurity concentration, the impurity profile, and the thickness of the first regions 103 may be determined so that punch through does not occur between each of second regions (source regions) 104 which will be formed later and the drift regions.

Next, as illustrated in FIG. 20(a), the mask 201 is removed, and ions of, for example, nitrogen are implanted to the implantation regions 103i by using a mask 202, thereby forming implantation regions 104i. The implanted ions are activated, so that the implantation regions 104i serve as the second regions 104. A so-called self-align process in which the implantation regions 104i are formed in a self-aligned manner to the implantation regions 103i may be used. In this case, the mask 201 may be left, and sidewall masks may be formed on sidewalls of the mask 201, thereby forming the mask 202.

After the ion implantation, the mask 202 is removed, and as illustrated in FIG. 20(b), Al ions are implanted by using a mask 203, thereby forming implantation regions 105i. The implanted ions are activated, so that the implantation regions 105i serve as contact regions 105.

After the mask 203 is removed, ions, of for example, nitrogen may be implanted to the regions serving as JFET regions 102j of the first silicon carbide semiconductor layer 102 as needed. In this case, the nitrogen ions may be implanted in a vertical direction of the semiconductor substrate 101 from the surface of the first silicon carbide semiconductor layer 102 to a position deeper than at least the implantation region 103i. Moreover, the impurity concentration in the ion implantation is higher than the dopant concentration of the drift regions. For example, the average impurity concentration may be set to about $1 \times 10^{17}$ cm$^{-3}$.

After these ions are implanted, a high-temperature thermal treatment (activation annealing) is performed to activate the impurities implanted to the first silicon carbide semiconductor layer 102. As illustrated in FIG. 21(a), the first regions 103, the second regions 104, and the contact regions 105 are thus formed. Each first region 103 may have a depth of, for example, 550 nm and an average dopant concentration of about $2 \times 10^{19}$ cm$^{-3}$. Each second region 104 may have a depth of, for example, 250 nm and an average dopant concentration of about $5 \times 10^{19}$ cm$^{-3}$. Each contact region 105 may have a depth of, for example, 400 nm, and an average dopant concentration of about $1 \times 10^{20}$ cm$^{-3}$. Here, "depth" of a region refers to, for example, a position at which the concentration of the region is equal to the impurity concentration of a region adjacent to the region. Moreover, with reference to a constant value, the depth may be defined as a position at the constant value. In order to purify the surface of the first silicon carbide semiconductor layer 102 after the activation annealing, a top surface of the first silicon carbide semiconductor layer 102 may be removed.

Next, as illustrated in FIG. 21(b), a second silicon carbide semiconductor layer 106 is epitaxially grown on an upper surface of the first silicon carbide semiconductor layer 102 including the first regions 103, the second regions 104, and the contact regions 105. The second silicon carbide semiconductor layer 106 has an average dopant concentration of, for example, about $1 \times 10^{18}$ cm$^{-3}$ and a thickness of, for example, 90 nm.

Next, an insulating film 107 is formed on the second silicon carbide semiconductor layer 106. When the insulating film 107 is formed by thermal oxidation, an upper portion of the second silicon carbide semiconductor layer 106 becomes the insulating film 107. Thus, the second silicon carbide semiconductor layer 106 is deposited to have a thickness in consideration of elimination due to the thermal oxidation. In the present embodiment, the final thickness of the second silicon carbide semiconductor layer 106 is 40 nm, and at the time of deposition, the thickness of the second silicon carbide semiconductor layer 106 is 90 nm which is thicker than the final thickness by about 50 nm. The thickness of the insulating film 107 is about 70 nm. Nitridation, etc. may be performed on an interface between the insulating film 107 and the second silicon carbide semiconductor layer 106 as needed. The nitridation may be performed by, for example, annealing in a nitric oxide (NO) gas high-temperature atmosphere.

Next, as illustrated in FIG. 22(a), a conductive film 108 is formed on a surface of the insulating film 107. The conductive film 108 is a polysilicon film doped with, for example, phosphorus of about $7\times10^{20}$ cm$^{-3}$ and having a thickness of about 500 nm. After the conductive film 108 is formed, dry etching is performed by using a mask, thereby removing unnecessary portions of the conductive film 108. In this way, a gate electrode 108a is formed in each of first cells 100A, and a first control electrode 108b is formed in each of second cells 100B.

Next, as illustrated in FIG. 22(b), an interlayer insulating film 111 made of, for example, SiO$_2$ is deposited by CVD to cover the first silicon carbide semiconductor layer 102 on which the conductive film 108 has been formed. The thickness of the interlayer insulating film 111 is, for example, 1 µm.

Next, as illustrated in FIG. 23(a), dry etching is performed by using a mask having openings at positions where ohmic electrodes will be formed, thereby selectively removing the first interlayer insulating film 111 to form contact holes 111c. In each second cell 100B, the first control electrode 108b of the conductive film 108 is exposed in a sidewall of the contact hole 111c. The gate electrode 108a of the conductive film 108 is not exposed in a sidewall of the contact hole 111c.

After this, a nickel film having a thickness of, for example, 100 nm is formed on the interlayer insulating film 111 in which the contact holes 111c have been formed, and a thermal treatment at a temperature of, for example, 950° C. in an inert atmosphere for 5 minutes is performed, thereby causing reaction between the nickel film and silicon carbide to form first ohmic electrodes 109 made of nickel silicide. Each first ohmic electrode 109 is in ohmic contact with the second region 104 and the contact region 105. Here, a silicide layer (not shown) is also formed on side surfaces of the first control electrodes 108b exposed in the contact holes 111c. Next, after the nickel film on the interlayer insulating film 111 is removed by etching, for example, nickel is deposited on a back face of the semiconductor substrate 101, and a thermal treatment is similarly performed to cause reaction between the nickel and the silicon carbide, thereby forming a second ohmic electrode 110.

Next, as illustrated in FIG. 23(b), on the interlayer insulating film 111 and in the contact holes 111c, a conductive film made of an aluminum film and having a thickness of about 4 µm is deposited and etched to have a desirable pattern. In this way, an upper electrode 112 connected to the first ohmic electrodes 109 via contact portions passing through the interlayer insulating film 111 can be obtained. Moreover, in each second cell 100B, the first control electrode 108b is in contact with the contact portion, and the first ohmic electrode 109 is electrically connected to the first control electrode 108b. Although not shown, a gate interconnect (or gate pad) in contact with the gate electrode 108a is formed at a chip end. Moreover, titanium (Ti)/nickel (Ni)/silver (Ag) as a back electrode 113 for die bonding are deposited in this order on the back face of the second ohmic electrode 110.

Although an example in which the conductive film is filled in the contact holes 111c has been described, the conductive film does not need to be filled in the contact holes 111c, but the conductive film may be formed to successively cover at least bottom surfaces and the wall surfaces of the contact holes 111c. Portions of the conductive film in the contact holes 111c may be formed separately from portions of the conductive film above the interlayer insulating film 111.

In the method for fabricating the semiconductor device of the present embodiment, the first cells 100A and the second cells 100B can be formed in the same process except for a mask pattern used to selectively remove the conductive film 108. Thus, the first cells 100A and the second cells 100B can be easily formed differently. Moreover, the ratio between the first cell 100A and the second cell 100B can be easily changed.

When the upper electrode 112 is formed, the following steps may be performed. After the step illustrated in FIG. 22(b), the deposited interlayer insulating film 111 is etched as illustrated in FIG. 24(a) to form contact holes 111c such that an opening width w1 in the interlayer insulating film 111 of the second cell 100B is greater than an opening width w2 in the conductive film 108 (first control electrode 108b) of the second cell 100B.

As described above, the opening width w1 in the interlayer insulating film 111 is greater than the opening width w2 in the first control electrode 108b. Thus, a surface of a circumferential region of the first control electrode 108b is exposed in the opening when the interlayer insulating film 111 is etched. Here, part of the exposed circumferential region of the first control electrode 108b may also be etched. The thickness of the first control electrode 108b is, for example, 500 nm, and the thickness of the interlayer insulating film 111 is, for example, 1 µm. The thickness of the second silicon carbide semiconductor layer 106 is, for example, 40 nm. As illustrated in FIG. 24(a), when the interlayer insulating film 111 is dry etched, at least an upper portion of the second silicon carbide semiconductor layer 106 may be etched. However, as long as the thickness of the first control electrode 108b is at least about 500 nm, the opening width w2 smaller than the opening width w1 can be ensured even when the surface of the first electrode 108b is slightly etched.

Figure 24:
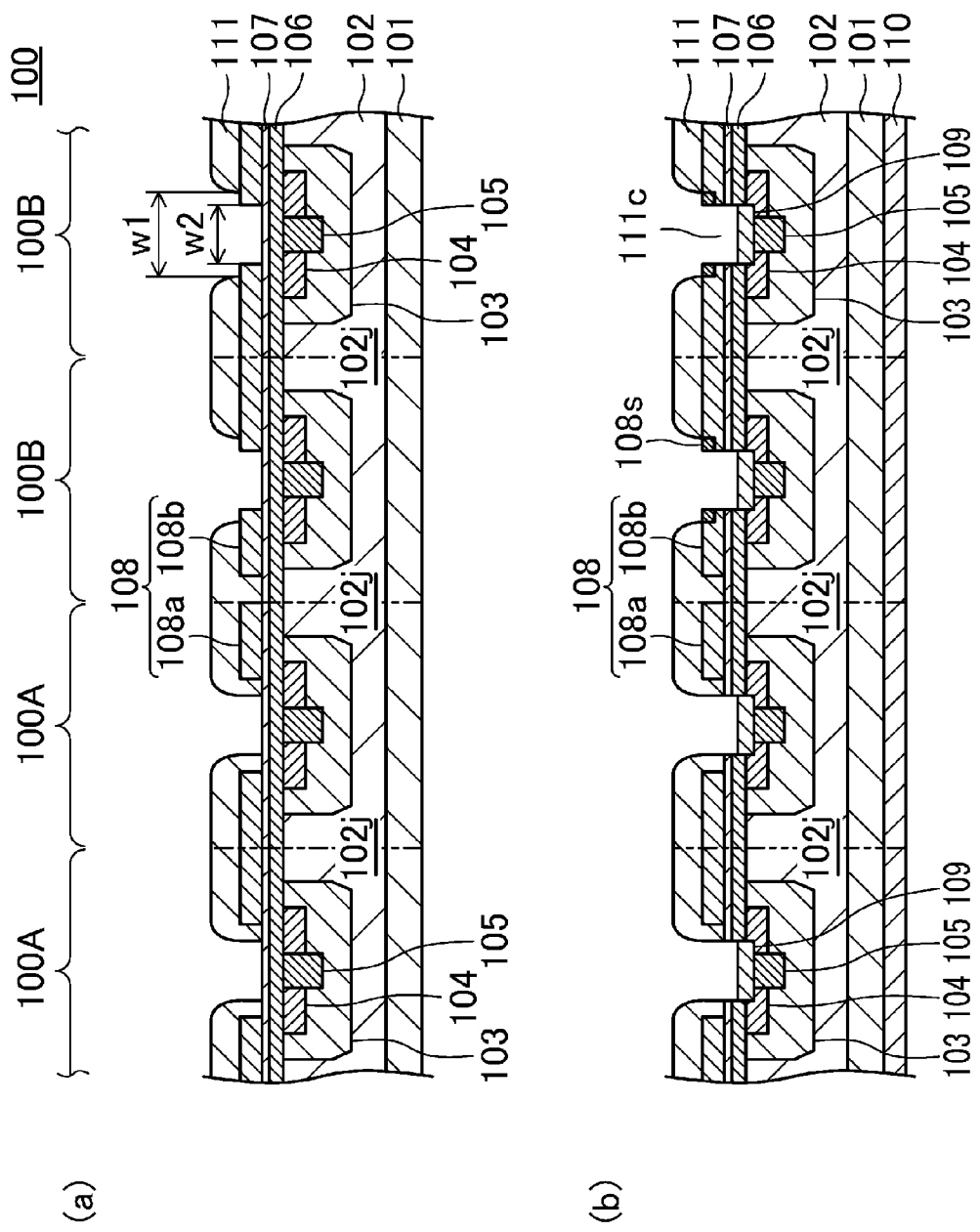
FIGS. 24(a) and 24(b) are cross-sectional view illustrating steps in the method for fabricating the semiconductor device according to the first embodiment in a sequential order.

Next, as illustrated in FIG. 24(b), a nickel film having a thickness of, for example, about 100 nm is deposited on the interlayer insulating film 111 to fill the contact holes 111c. In this state, at a temperature of, for example, 950° C. in an inert atmosphere, a thermal treatment is performed for 5 minutes to cause reaction between the nickel film and SiC, thereby forming first ohmic electrodes 109 made of nickel silicide. Thus, each first ohmic electrode 109 is in ohmic contact with the second region 104 and the contact region 105. Here, a silicide layer 108s made of nickel silicide is formed in the portion of the first control electrode 108b exposed in each contact hole 111c. The silicide layer 108s may be in contact with the insulating film 107. After the nickel film on the interlayer insulating film 111 is removed by etching, for example, nickel is deposited on the back face of the semiconductor substrate 101, and a thermal treatment is performed in a similar manner to cause reaction between the nickel and the silicon carbide, thereby forming a second ohmic electrode 110.

Figure 25:
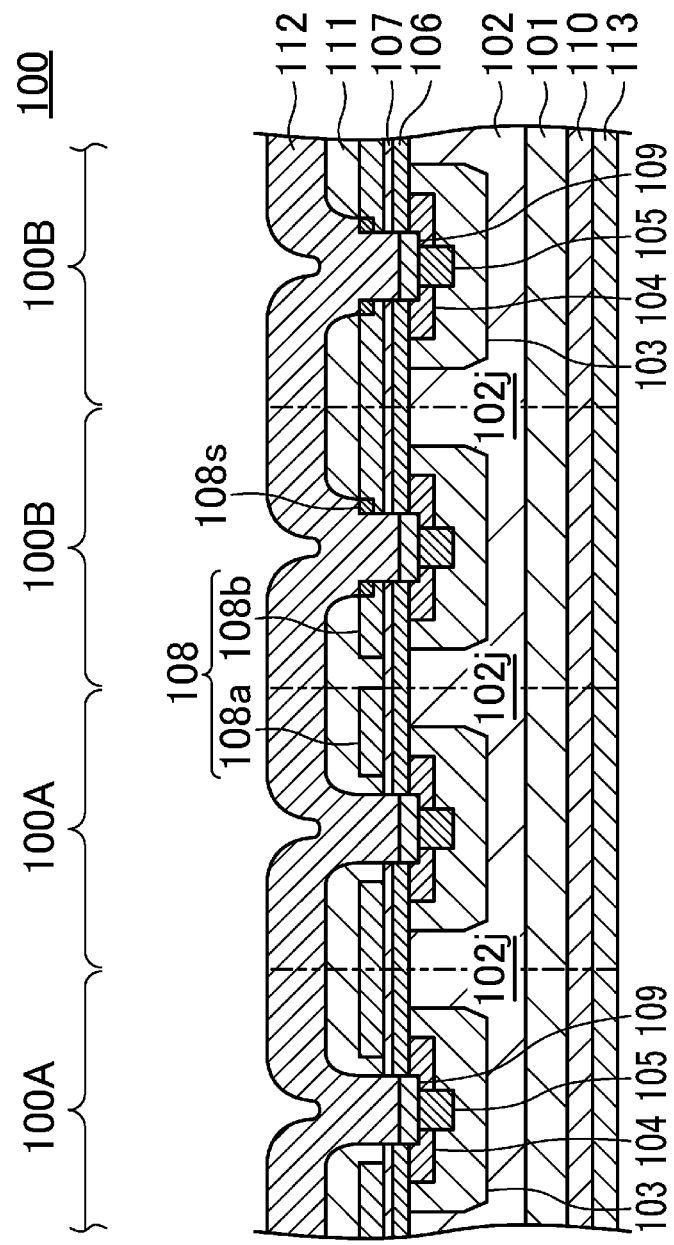
FIG. 25 is a cross-sectional view illustrating a variation of the semiconductor device according to the first embodiment.

Next, as illustrated in FIG. 25, in a manner similar to the process illustrated in FIG. 23(b), an upper electrode 112 and a back electrode 113 are formed. In this way, in each second cell 100B, a contact portion of the upper electrode 112 has a larger width at a portion above the first control electrode 108b than at a portion below the first control electrode 108b. Thus, the contact portion is in contact with not only side surface of the first control electrode 108b but also upper surface of the first control electrode 108b. The silicide layer 108s is formed in part of the upper surface of the first control electrode 108b to surround the contact portion, and the contact portion is connected to the first control electrode 108b via the silicide layer 108s. Therefore, contact between the first control electrode 108b and the upper electrode 112 can be further ensured.

The semiconductor device 100 satisfies the basic characteristic as a transistor, and at the same time, has a function as a unipolar channel diode. For example, the threshold voltage of the semiconductor device 100 serving as a transistor can be about 3 V at the room temperature. The threshold voltage in the range from about 1 V to about 10 V can be easily realized. The threshold voltage at the room temperature may be 2-8 V for ease of use. The breakdown voltage, which is determined by the dopant concentration mainly of the first silicon carbide semiconductor layer 102, can be about 1200 V at the room temperature. Even when the absolute value of the voltage Vds is less than or equal to 2 V, the on-state current of the diode at a voltage Vgs of 0 V can ensure a current value substantially equal to the current in the case where the transistor is on.

Second Embodiment

Figure 26:
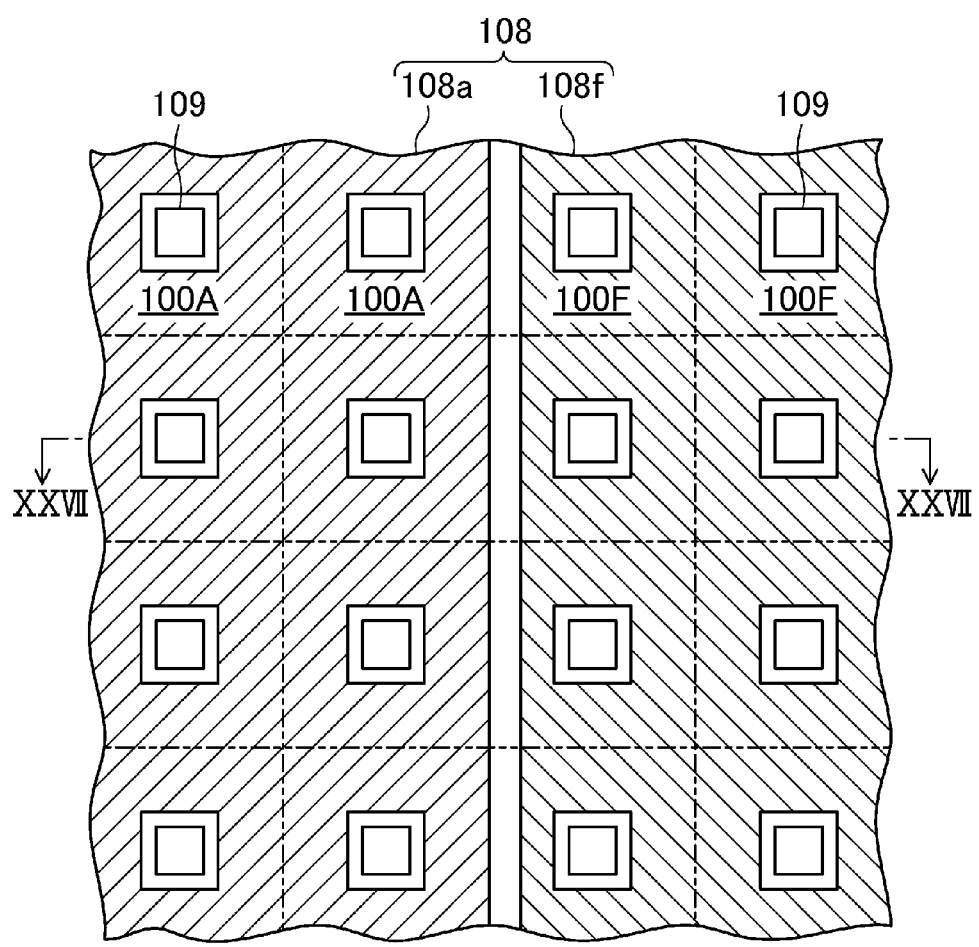
FIG. 26 is a plan view illustrating a semiconductor device according to a second embodiment.
Figure 27:
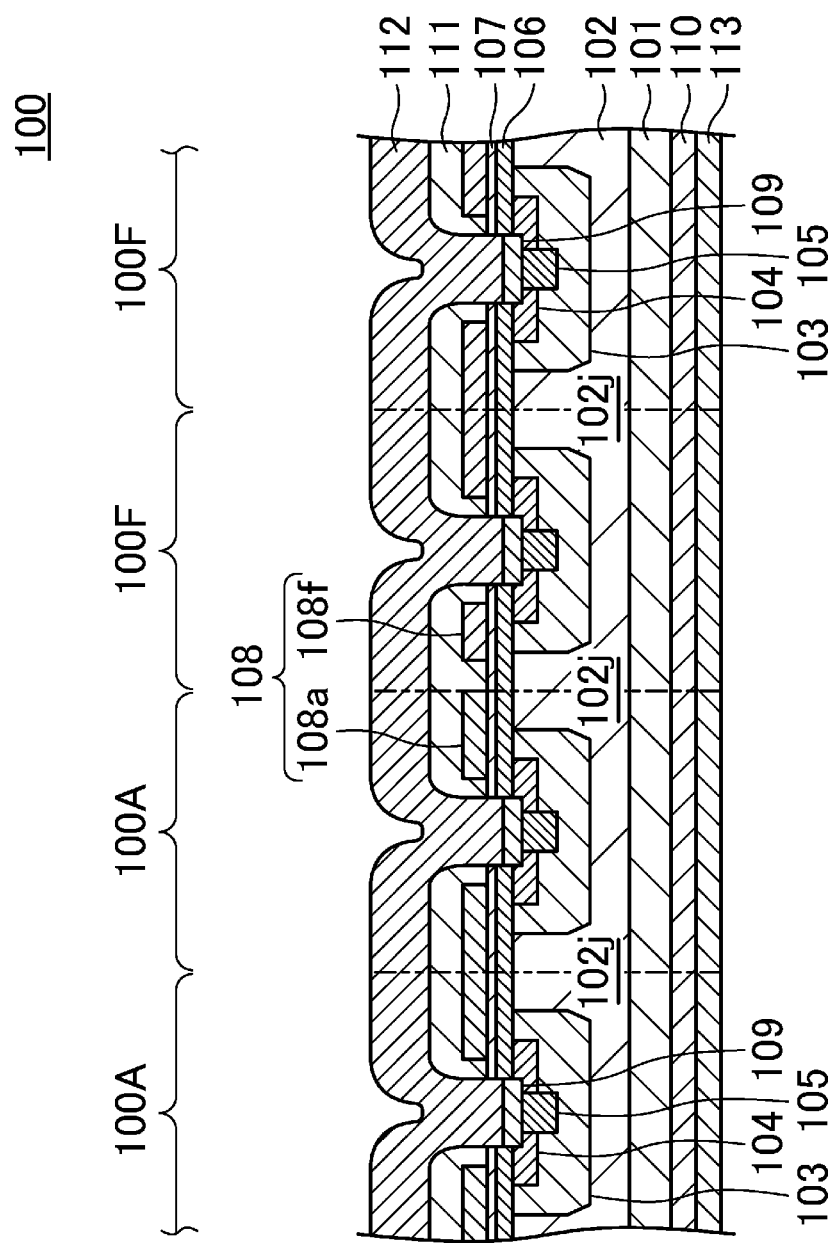
FIG. 27 is a cross-sectional view along the line XXVII-XXVII of FIG. 26.

With reference to the drawings, a semiconductor device of a second embodiment will be described further in detail. In the following drawings, there are cases where the thickness of each layer is not to actual scale. FIG. 26 shows a plan configuration of a semiconductor device 100 of the present embodiment. FIG. 27 shows a cross-sectional configuration along the line XXVII-XXVII of FIG. 26. In FIG. 26, an upper electrode and an interlayer insulating layer are omitted. In FIG. 26, eight first cells 100A and eight second cells 100F are shown. However, the number of the first cells 100A and the number of the second cells 100F may be arbitrarily changed. The number of the first cells 100A may be different from the number of the second cells 100F. In FIG. 26, the first cells 100A and the second cells 100F are arranged in a two-dimensional matrix, but other arrangements are possible. For example, the first cells 100A and the second cells 100F may be arranged in a single row.

As illustrated in FIGS. 26 and 27, the semiconductor device 100 of the present embodiment includes the first cells 100A and the second cells 100F. Each first cell 100A functions as a transistor. Each second cell 100F includes no electrode configured to control the electric potential of a second silicon carbide semiconductor layer 106 independently of the potential of each of first ohmic electrodes 109. Each second cell 100F functions as a diode. More specifically, an n$^+$-type semiconductor substrate 101 made of SiC has a first face (surface) and a second face (back face) opposite to the first face. An n$^-$-type first silicon carbide semiconductor layer 102 is provided on the first face (surface) of the semiconductor substrate 101. The first silicon carbide semiconductor layer 102 may be an epitaxially grown layer.

First regions 103 serving as p-type impurity diffusion regions are provided in an upper portion of the first silicon carbide semiconductor layer 102. Each first region 103 functions as a body region. The term "body region" generally refers to a semiconductor region which is located under a channel layer and has a conductivity type opposite to the channel layer. The first region 103 is formed by implanting an impurity such as nitrogen in the n$^-$-type first silicon carbide semiconductor layer 102. The first region 103 is shallower than the first silicon carbide semiconductor layer 102 and is surrounded by the first silicon carbide semiconductor layer 102. The first region 103 is a region which contains an n-type impurity and a p-type impurity, and in which the concentration of the p-type impurity is higher than that of the n-type impurity. The impurity concentration of the first region 103 may vary in a direction vertical to the semiconductor substrate 101 or may be uniform.

A second region 104 serving as an n$^+$-type impurity diffusion region is provided in an upper portion of each first region 103. The second region 104 is shallower than the first region 103 and is surrounded by the first region 103.

A p$^+$-type contact region 105 is provided in each first region 103 to pass through the first region 103. Each first ohmic electrode 109 is provided to extend on both the contact region 105 and the second region 104. Each first ohmic electrode 109 is in ohmic contact with the contact region 105 and the second region 104. The contact region 105 is provided to facilitate the ohmic contact between the first ohmic electrode 109 and the first region 103. Thus, when the impurity concentration of the first region 103 is sufficiently high, and an ohmic contact between the first region 103 and the first ohmic electrode 109 can be easily formed, the contact region 105 does not need to be provided, and the first ohmic electrode 109 may be directly in contact with the first region 103. For example, a contact trench exposing the first region 103 may be formed in the second region 104, and the first ohmic electrode 109 may be provided in the contact trench. Alternatively, a region exposing the first region 103 may be left in forming the second region 104 so that the first region 103 is in contact with the first ohmic electrode 109.

A portion of the first silicon carbide semiconductor layer 102 in which a first region 103 is not formed is a drift region, and a portion of the drift region which is adjacent to the first region 103 is referred to as a JFET region 102j for simplicity of description. When a plurality of first cells 100A and second cells 100F are adjacent to each other, portions each of which is located between the first regions 103 adjacent to each other are JFET regions 102j. Each JFET region 102j may have an impurity concentration equal to the impurity concentration of other portions of the drift region, or an n-type impurity may be implanted by ion implantation or the like so that the impurity concentration of the JFET region 102j is higher than that of other portions of the drift region. When the impurity concentration of the JFET region 102j is higher than that of other portions of the drift region, the resistance value of the JFET region 102j can be reduced. Note that the term "JFET region" represents a structure for the sake of convenience, but does not mean that the region can perform on/off operation as a JFET.

When an impurity is implanted in the JFET region 102j, the implantation depth may be set to be greater than the depth of the first region 103. The implantation depth of the JFET region 102j represents a depth at which the impurity concentration of the JFET region 102j is equal to the impurity concentration of other portions of the drift region.

On the first silicon carbide semiconductor layer 102, the second silicon carbide semiconductor layer 106 containing an n-type impurity is provided in contact with the first silicon carbide semiconductor layer 102. Openings exposing the first ohmic electrodes 109 are formed in the second silicon carbide semiconductor layer 106. The second silicon carbide semiconductor layer 106 extends at least on the JFET region 102j, the first region 103, and the second region 104. The second silicon carbide semiconductor layer 106 functions as a channel layer. The second silicon carbide semiconductor layer 106 may be formed by epitaxial growth. The impurity concentration of the second silicon carbide semiconductor layer 106 may be mainly controlled by a flow of a doping gas in the epitaxial growth. The impurity concentration of the second silicon carbide semiconductor layer 106 may vary in a direction vertical to the semiconductor substrate 101 or may be uniform.

An insulating film 107 is provided on and in contact with the second silicon carbide semiconductor layer 106. A conductive film 108 is selectively provided on and in contact with the insulating film 107. An upper electrode (source pad) 112 is provided on the conductive film 108 with an interlayer insulating film 111 provided between the conductive film 108 and the upper electrode 112. The upper electrode 112 is in contact with and electrically connected to the first ohmic electrode 109 in each of contact holes formed in the interlayer insulating film 111. A second ohmic electrode 110 is provided on the entire second face (back face) of the semiconductor substrate 101. A back electrode 113 is provided on an entire surface of the second ohmic electrode 110 opposite a surface of the second ohmic electrode 110 in contact with the semiconductor substrate 101.

Each first cell 100A includes a first semiconductor element serving as a MISFET having a freewheeling diode. In the first semiconductor element, the first ohmic electrode 109 functions as a source electrode, and the second ohmic electrode 110 functions as a drain electrode.

In the first cell 100A, the second silicon carbide semiconductor layer 106 is in contact with the drift region of the first silicon carbide semiconductor layer 102, the first region 103, and the second region 104. The second silicon carbide semiconductor layer 106 functions as a channel through which a current flows between the first ohmic electrode (source electrode) 109 and the second ohmic electrode (drain electrode) 110.

A portion of the insulating film 107 formed in the first cell 100A is a gate insulating film, and a portion of the conductive film 108 formed in the first cell 100A is a gate electrode 108a. The gate electrode 108a is electrically connected to a gate pad (not shown). The channel can be switched between an energized state and a shutdown state by applying a voltage to the gate electrode 108a. Thus, the insulating film 107 serving as a gate insulating film and the gate electrode 108a may be formed on at least a portion of the second silicon carbide semiconductor layer 106 which will be the channel. Specifically, the insulating film 107 and the gate electrode 108a may extend on the drift region, the first region 103, and the second region 104.

In the present embodiment, the term "gate electrode" means an electrode capable of controlling the electric potential at an interface between the channel layer and the gate insulating film independently of the electric potential of a first ohmic contact. Moreover, the term "gate insulating film" means an insulating film provided between the gate electrode and the channel layer.

Each second cell 100F includes a second semiconductor element serving as a diode. In the second cell 100F, a portion 108f of the conductive film 108 formed in the second cell 100F is physically separated and electrically insulated from the gate electrode 108a formed in the first cell 100A. Therefore, the portion 108f of the conductive film 108 formed in the second cell 100F is in a floating state, and thus does not function as a gate electrode for controlling the electric potential of the channel. In other words, the second cell 100F includes no gate electrode. The portion 108f is hereinafter referred to as a floating electrode 108f. The floating electrode 108f affects the electric potential of the second silicon carbide semiconductor layer 106. However, floating electrode 108f does not purposely change the electric potential of the second silicon carbide semiconductor layer 106. Therefore, the floating electrode 108f does not control the electric potential of the second silicon carbide semiconductor layer 106 independently of the electric potential of the first ohmic electrode 109.

In the second cell 100F, the floating electrode 108f is in the floating state, and thus a portion of the second silicon carbide semiconductor layer 106 extending on the drift region, the first regions 103 and the second regions 104 functions as a channel of a unipolar diode which will be described later.

In FIGS. 26 and 27, in the second cell 100F adjacent to the first cell 100A, a region in which the floating electrode 108f is not formed is formed in a portion of the second cell 100F adjacent to the first cell 100A. With this configuration, the floating electrode 108f is physically separated and electrically insulated from the gate electrode 108a. Neither physical connection nor electrical connection needs to be provided between the floating electrodes 108. Thus, part of the floating electrodes 108f of all the second cells 100F may be removed so that the floating electrodes 108f have the same size.

Figure 28:
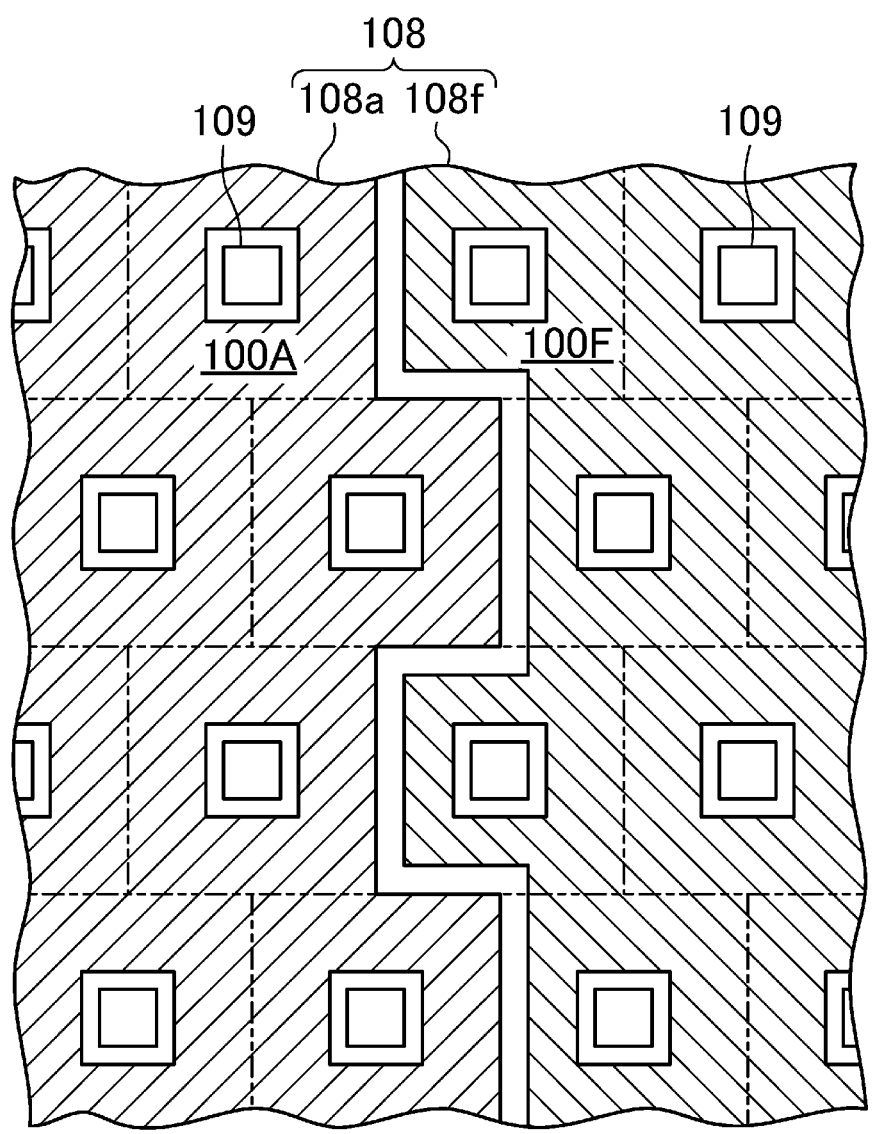
FIG. 28 is a plan view illustrating a variation of the semiconductor device according to the second embodiment.
Figure 29:
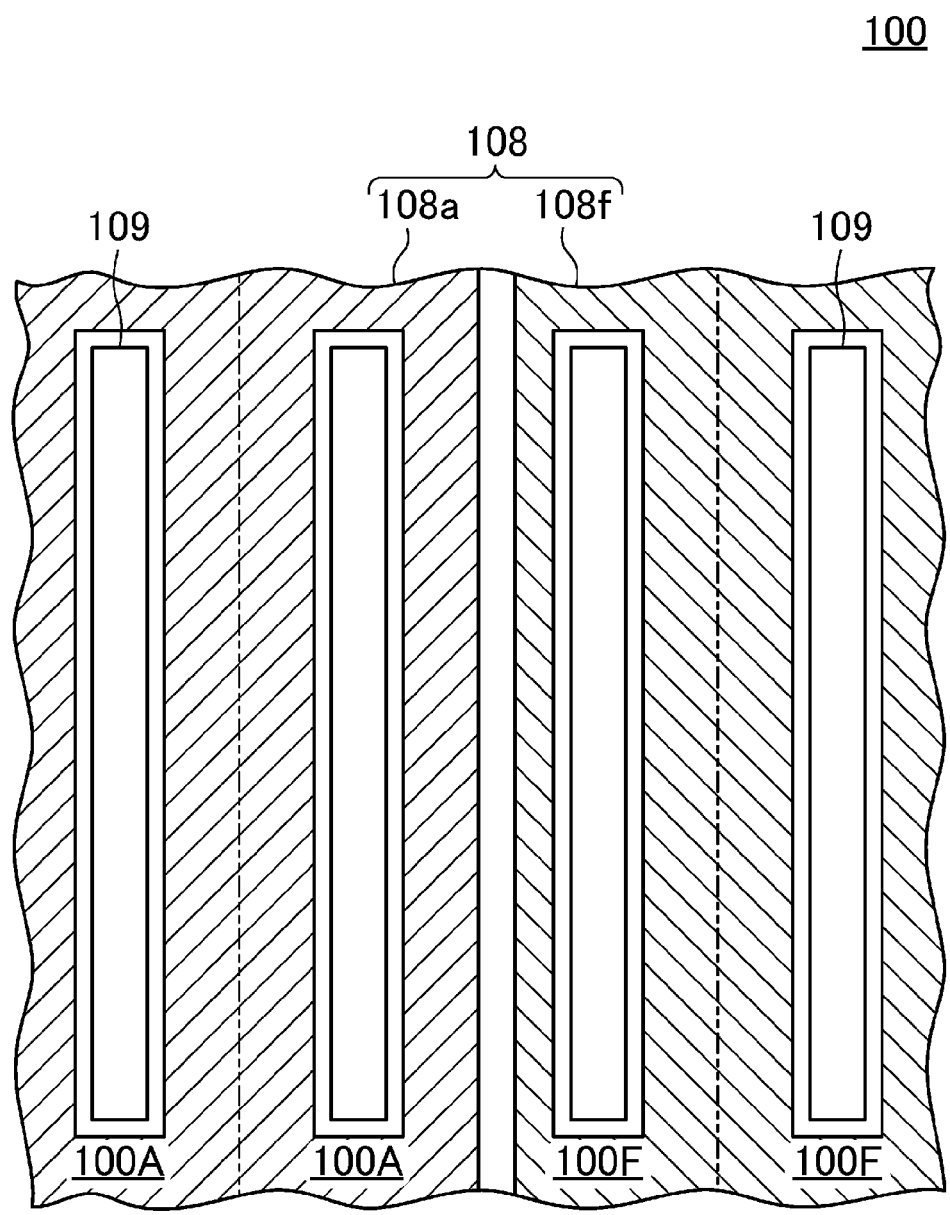
FIG. 29 is a plan view illustrating a variation of the semiconductor device according to the second embodiment.

In FIG. 26, an example in which the first cells 100A and the second cells 100F are arranged in a square lattice pattern. However, as illustrated in FIG. 28, the first cells 100A and the second cells 100F may be offset by a half cycle. Although examples in which the first cells 100A and the second cells 100F have a square shape have been shown in FIGS. 26 and 28, the first cells 100A and the second cells 100F may have a rectangular shape as illustrated in FIG. 29. Alternatively, the first cells 100A and the second cells 100F may have a polygonal shape such as a hexagonal shape.

Figure 30:
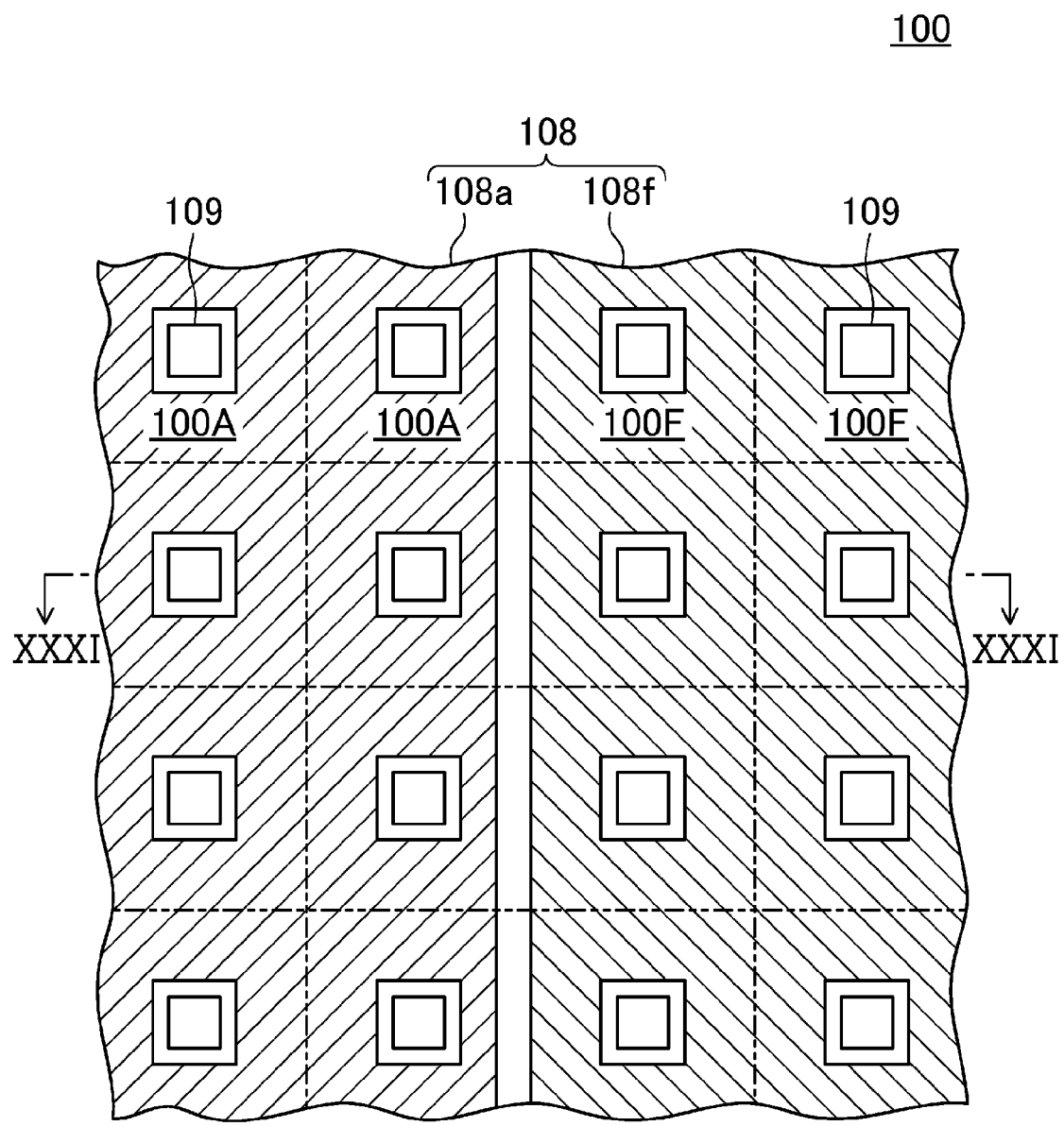
FIG. 30 is a plan view illustrating a variation of the semiconductor device according to the second embodiment.
Figure 31:
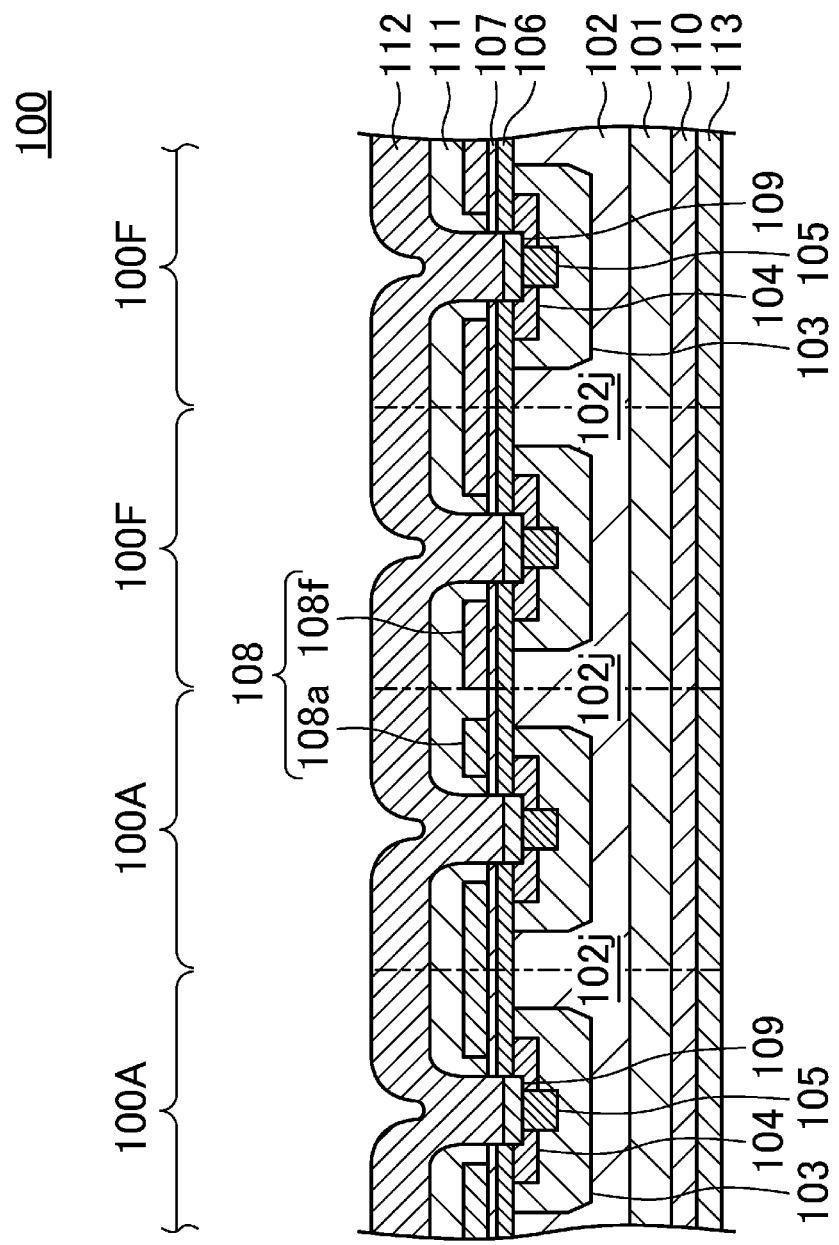
FIG. 31 is a cross-sectional view along the line XXXI-XXXI of FIG. 30.

As illustrated in FIGS. 30 and 31, in a first cell 100A adjacent to a second cell 100F, a region in which a gate electrode 108a is not formed may be formed in a portion adjacent to the second cell 100F. In this case, in the first cell 100A adjacent to the second cell 100F, the area of the gate electrode 108a is slightly smaller than in other first cells 100A.

Figure 32:
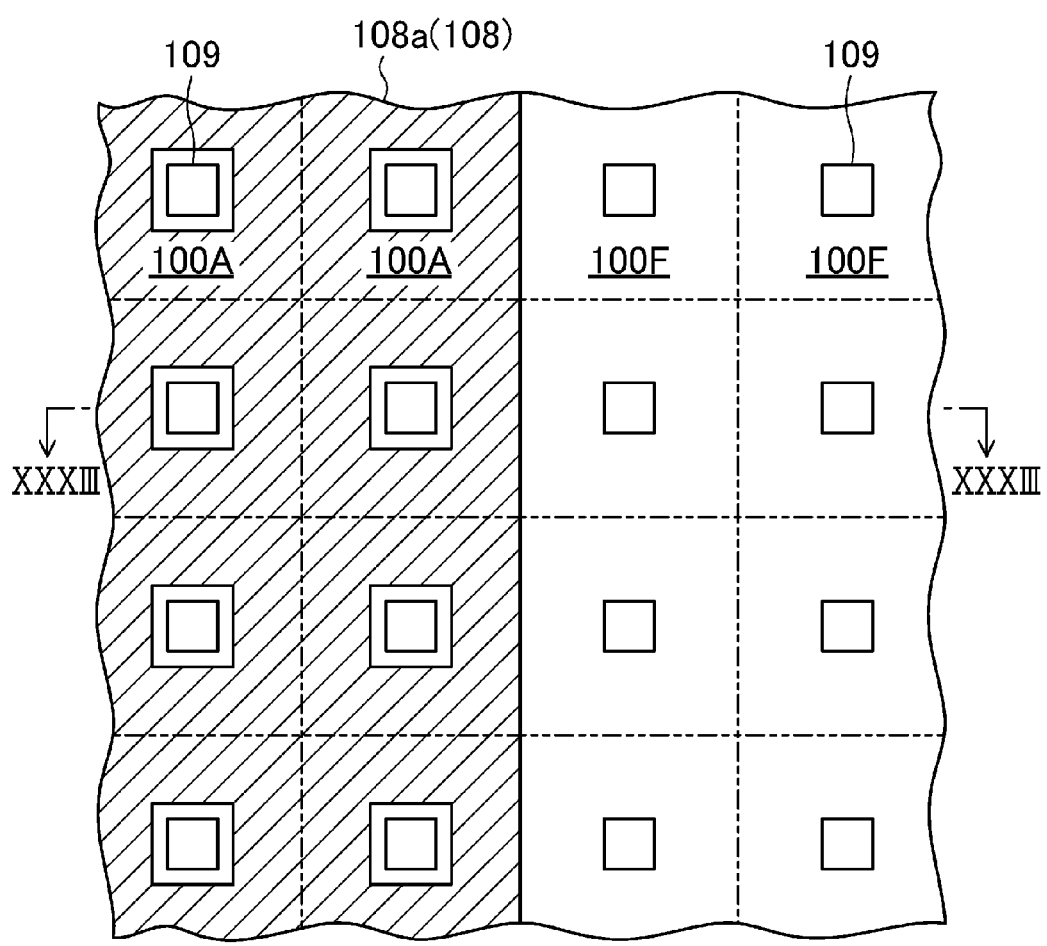
FIG. 32 is a plan view illustrating a variation of the semiconductor device according to the second embodiment.
Figure 33:
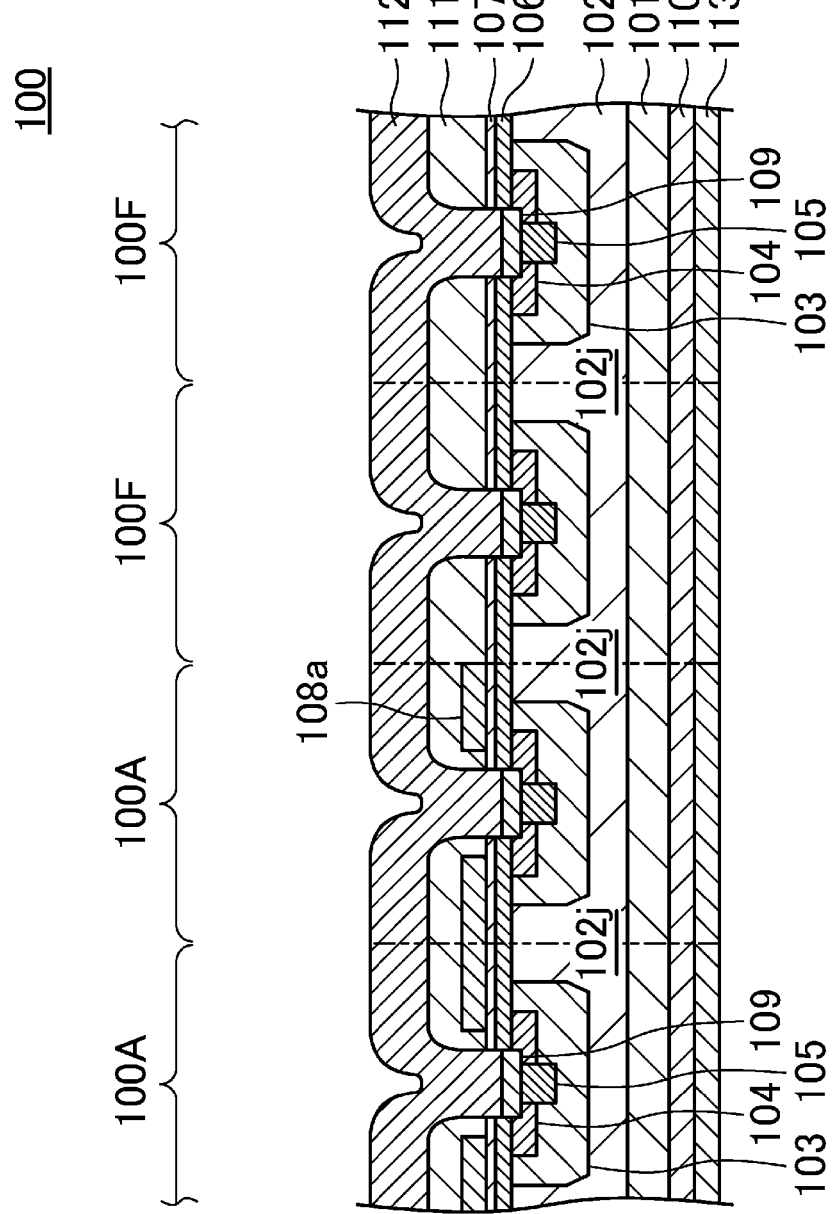
FIG. 33 is a cross-sectional view along the line XXXIII-XXXIII of FIG. 32.

Since the floating electrode 108f has a conductivity, the electric potential in the floating electrode 108f can be kept constant, so that it is possible to reduce the variations of electric potentials due to the variations of thicknesses of the interlayer insulating film 111. Thus, providing the floating electrode 108f offers the advantage of maintaining the characteristic of reduced variations of the electric potentials. However, as illustrated in FIG. 32 and FIG. 33, in each second cell 100F, the floating electrode 108f may be removed. That is, the second cell 100F does not need to include the conductive film 108 on the channel. The upper electrode 112 is provided on the second cell 100F. The upper electrode 112 is electrically connected to the first ohmic electrode 109 via the interlayer insulating film 111 and has an electric potential substantially equal to the electric potential of the first ohmic electrode 109. Therefore, whether or not the floating electrode 108f is provided, potential can be applied to a surface of the second silicon carbide semiconductor layer 106 serving as a channel layer (an interface between the second silicon carbide semiconductor layer 106 and the insulating film 107) by the upper electrode 112. Thus, even when floating electrode 108f is removed in the second cell 100F, the second semiconductor element functions as a unipolar diode.

Figure 34:
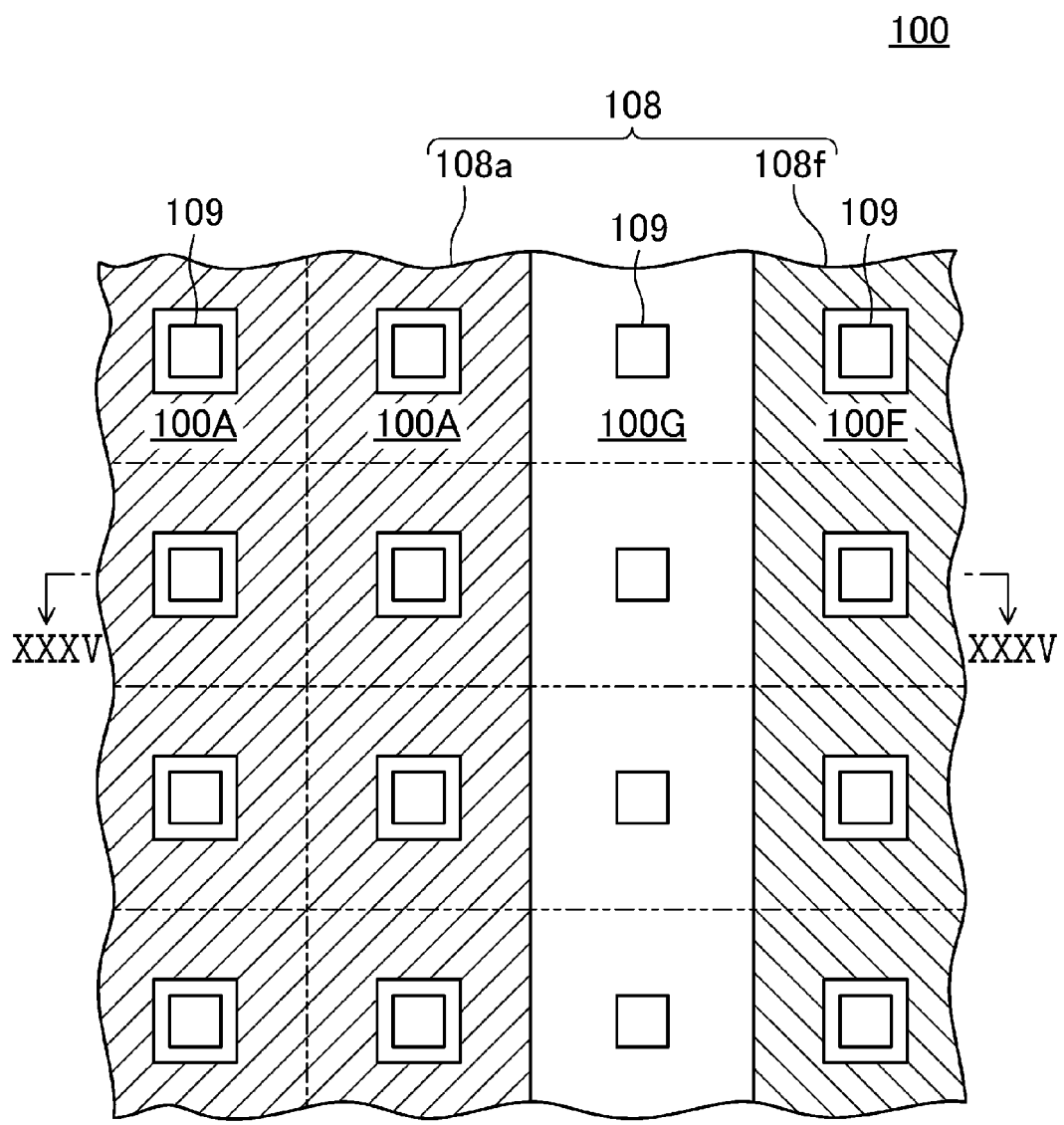
FIG. 34 is a plan view illustrating a variation of the semiconductor device according to the second embodiment.
Figure 35:
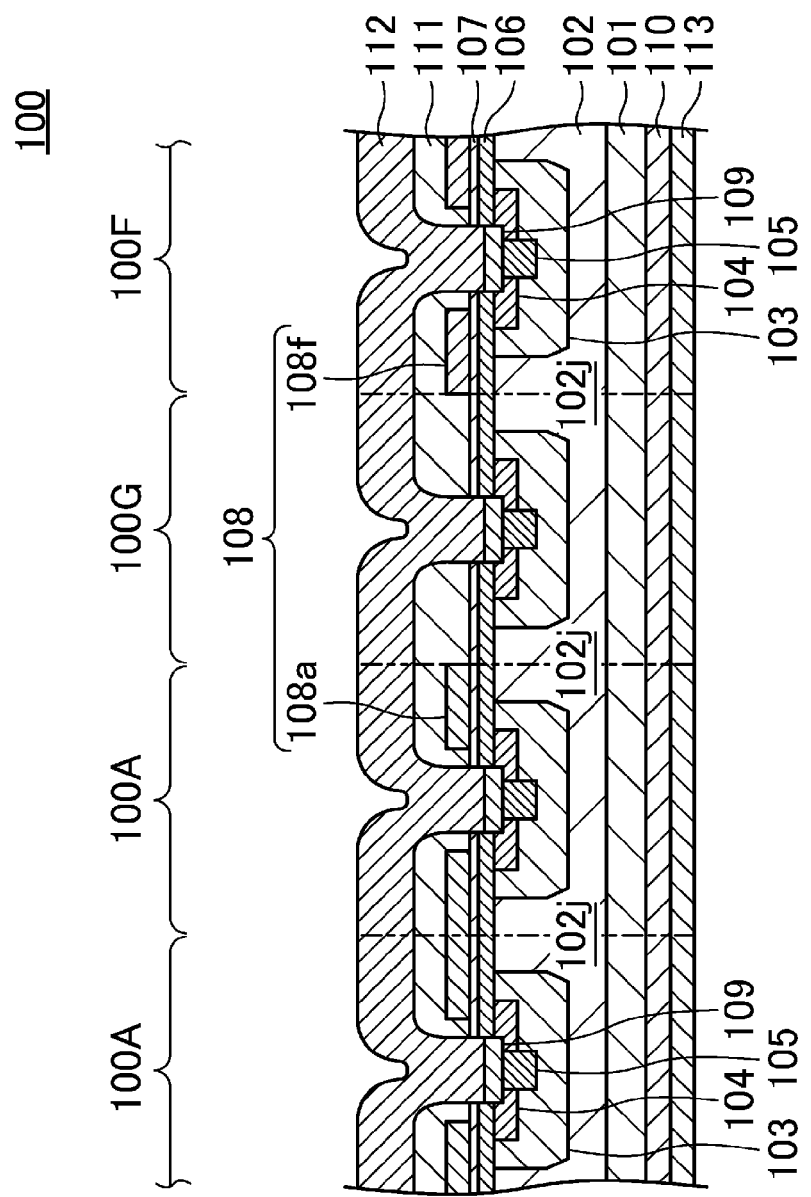
FIG. 35 is a cross-sectional view along the line XXXV-XXXV of FIG. 34.

Moreover, as illustrated in FIGS. 34 and 35, a sixth cell 100G from which a floating electrode 108f has been removed can be provided between the first cell 100A and the second cell 100F. A third semiconductor element provided in the sixth cell 100G also functions as a unipolar diode similar to the second semiconductor element provided in the second cell 100F.

Figure 36:
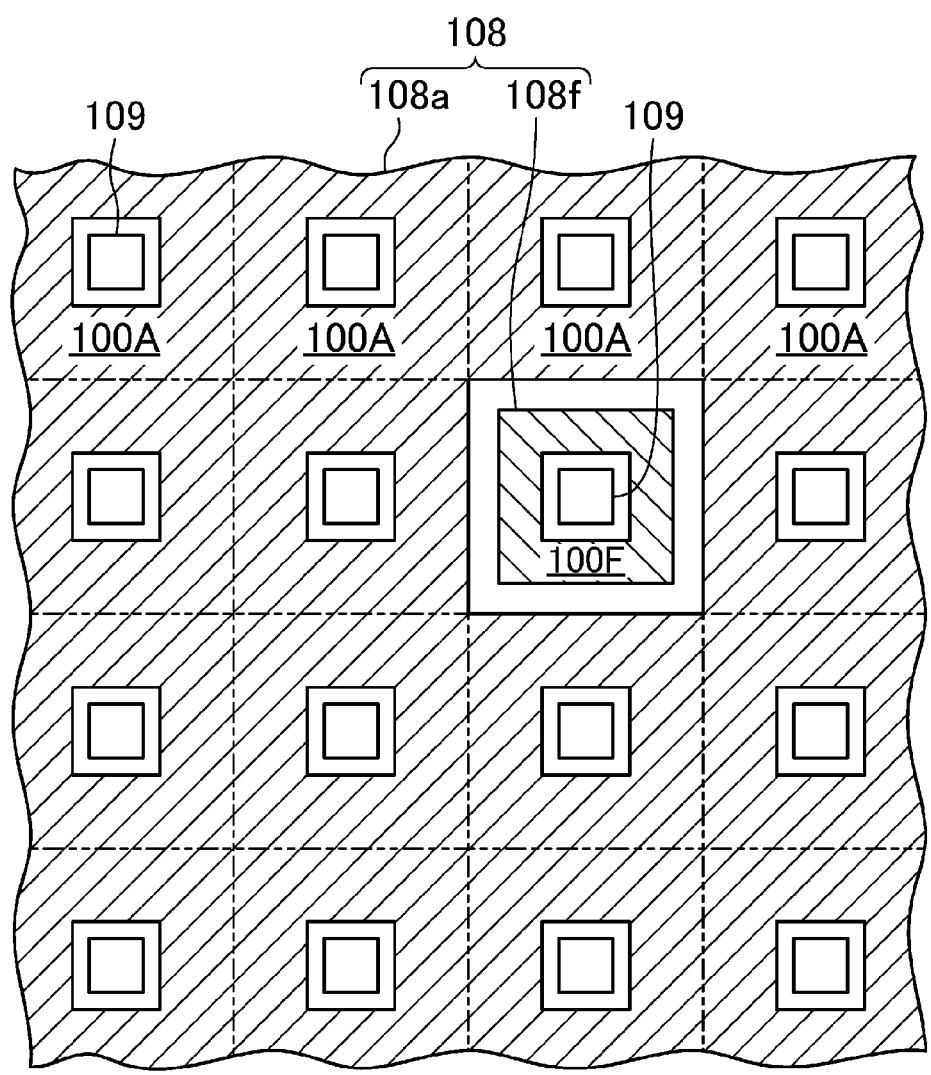
FIG. 36 is a plan view illustrating a variation of the semiconductor device according to the second embodiment.
Figure 37:
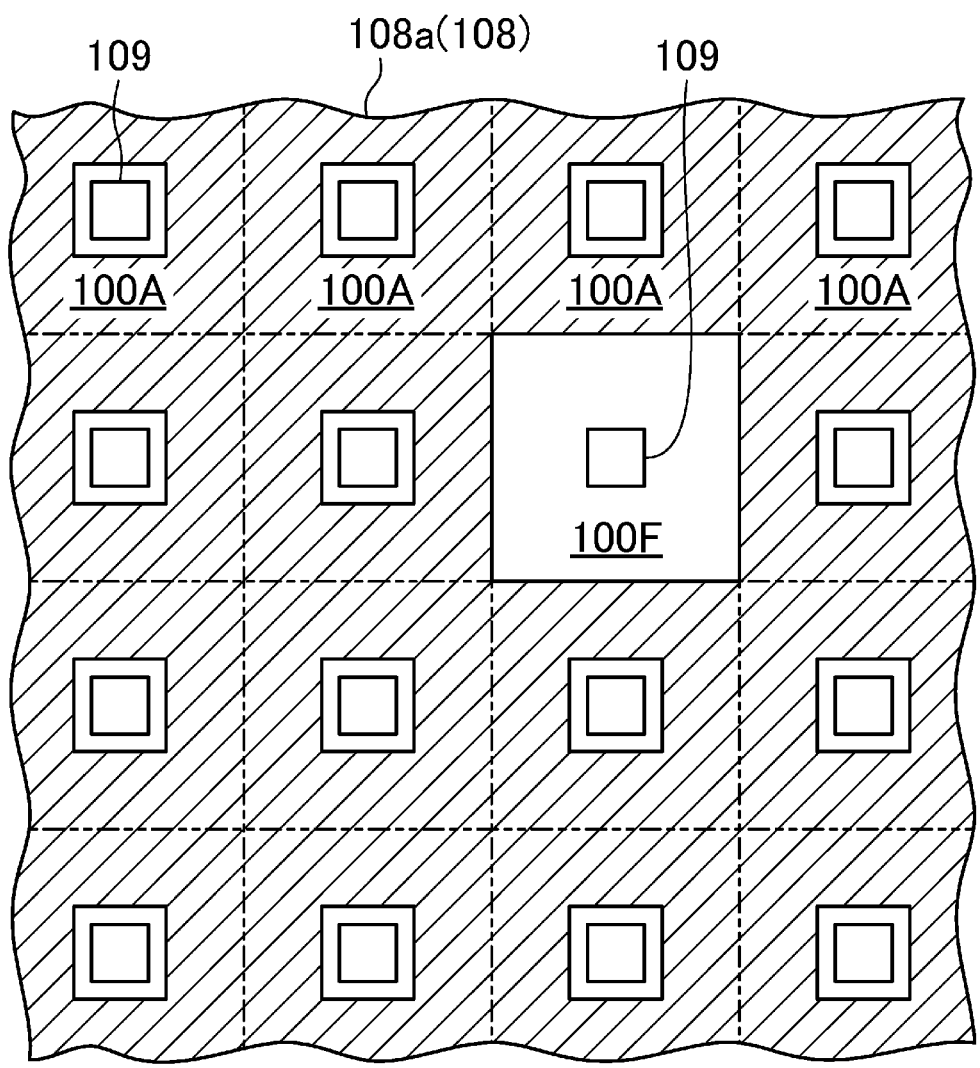
FIG. 37 is a plan view illustrating a variation of the semiconductor device according to the second embodiment.

As illustrated in FIG. 36, a second cell 100F may be surrounded by first cells 100A. Also with this configuration, a second semiconductor element provided in the second cell 100F functions as a unipolar diode. As illustrated in FIG. 37, a second cell 100F in which a floating electrode 108f is not provided may be surrounded by first cells 100A. A first cell 100A may be surrounded by second cells 100F.

Although an example in which the gate electrodes 108a of the conductive film 108 formed in the first cells 100A are integrated with each other has been described, the gate electrodes 108a may be electrically connected to each other. Thus, gate electrodes 108a physically separated from and independent of each other may be formed, and the gate electrodes 108a may be electrically connected to each other via gate interconnects, etc. Although an example in which the floating electrodes 108f of the conductive film 108 formed in the second cells 100F are also integrated with each other has been described, the floating electrodes may be physically separated from and independent of each other. When independent floating electrodes 108f are formed, it is not necessary to provide interconnects to connect the independent floating electrodes 108 to each other. Alternatively, the floating electrodes 108f may be electrically connected to each other via interconnects.

The first semiconductor element formed in the first cell 100A includes the first ohmic electrode (source electrode) 109 electrically connected to the second silicon carbide semiconductor layer 106, the second ohmic electrode (drain electrode) 110, and the gate electrode 108a configured to control a current flowing through the second silicon carbide semiconductor layer 106, and functions as a MISFET. When a voltage Vgs applied to the gate electrode 108a with reference to the first ohmic electrode 109 is greater than or equal to a threshold voltage Vth, the first semiconductor element is in an ON state. Thus, when a voltage Vds applied to the second ohmic electrode 110 with reference to the first ohmic electrode 109 is greater than 0 V, a current flows from the second ohmic electrode 110 via the semiconductor substrate 101, the drift region and the JFET region 102j of the first silicon carbide semiconductor layer 102, the second silicon carbide semiconductor layer (channel layer) 106, and the second region (source region) 104 to the first ohmic electrode 109. On the other hand, the second semiconductor element formed in the second cell 100F includes no gate electrode. Thus, in the second cell 100F, when the voltage Vgs is greater than or equal to the threshold voltage Vth and the voltage Vds is greater than 0, a current does not flow from the second ohmic electrode 110 to the first ohmic electrode 109.

When the voltage Vgs is less than the threshold voltage Vth, the first semiconductor element is in an OFF state. However, even when the first semiconductor element is in the OFF state, if the voltage Vgs is less than the threshold voltage Vth and the voltage Vds is less than 0 V, the impurity concentration of the first region 103 and the impurity concentration and the thickness of the second silicon carbide semiconductor layer 106 are appropriately selected, thereby forming a diode which allows a current to flow from the first ohmic electrode 109 to the second ohmic electrode 110 via the second silicon carbide semiconductor layer 106 serving as a channel of the MISFET. A diode allowing a current to flow from the first ohmic electrode 109 to the second ohmic electrode 110 via the second silicon carbide semiconductor layer 106 is hereinafter referred to as a channel diode. A direction from the second ohmic electrode 110 to the first ohmic electrode 109 is defined as a "forward direction," and a direction from the first ohmic electrode 109 to the second ohmic electrode 110 is defined as a "reverse direction." Here, the channel diode allows a current to flow in the reverse direction.

The channel diode has such a characteristic that when the voltage Vds is greater than a predetermined voltage Vf1 (where Vf1 is a negative value) determined based on the characteristic of the channel diode, the channel diode does not allow a current greater than or equal to 1 mA to flow, and when the voltage Vds is less than or equal to the predetermined voltage Vf1, the channel diode allows a current greater than or equal to 1 mA to flow. When the voltage Vds is greater than the predetermined voltage Vf1, a current flowing through the channel diode is almost 0 (less than 1 mA). However, when the voltage Vds is gradually reduced from 0 V (the absolute value of the voltage Vds is increased), a current flowing through the channel diode at the time when the voltage Vds reaches the predetermined voltage Vf1 is 1 mA. When the absolute value of the voltage Vds is further increased, the current flowing through the channel diode further increases. Therefore, the predetermined voltage Vf1 corresponds to a turn-on voltage in the current-voltage characteristic of the diode.

Main factors which determine the turn-on voltage Vf1 of the diode and the threshold voltage Vth of the transistor are the impurity concentration of the first region 103, the impurity concentration and the thickness of the second silicon carbide semiconductor layer 106, and the thickness of the insulating film 107. The threshold voltage Vth is generally greater than 0 V when the semiconductor element is used as a power transistor.

In the first semiconductor element, a body diode is also formed by the drift region of the first silicon carbide semiconductor layer 102 and the first region 103. The voltage Vf at which a current start flowing through the body diode is a turn-on voltage generated due to the pn junction and is about 2.5 V at a room temperature. When the impurity concentration of the first region 103 and the impurity concentration of the second silicon carbide semiconductor layer 106 are increased, the absolute value of the turn-on voltage Vf1 can be reduced to a value less than the absolute value of the voltage Vf. When the absolute value of the turn-on voltage Vf1 is less than the absolute value of the voltage Vf, the first semiconductor element allows a current to flow to the channel diode before a current flows through the body diode in the case where the MISFET is in an OFF state, and the voltage Vgs is less than the threshold voltage Vth, and the voltage Vds is less than 0 V. The first semiconductor element may be an element which allows a current to flow to the channel diode also when the voltage Vgs is greater than 0 V, and the voltage Vds is less than 0 V, with the above-described conditions being satisfied. Note that in the present embodiment, an example in which a negative voltage is applied to the gate when the transistor is off has been mainly described, but the gate voltage when the transistor is off may be zero.

The first semiconductor element provided in the first cell 100A functions as a MISFET including a freewheeling diode as described above. The second semiconductor element provided in the second cell 100F does not include a gate electrode, and thus open/close operation of the channel is not performed, so that the second semiconductor element does not function as a MISFET. Therefore, even when the voltage Vds is positive, a current does not flow in the second cell 100F. However, since the second semiconductor element also functions as a channel diode almost similar to the first semiconductor element, a current flows from the first ohmic electrode 109 to the second ohmic electrode 110 via the channel also in the second cell 100F when the voltage Vds is negative. The absolute value of a voltage Vf2 at which a current starts flowing via the channel in the second semiconductor element is also less than the absolute value of the voltage Vf at which a current starts flowing through the body diode. The on-state current of the channel diode of the first semiconductor element is limited since a negative bias is applied to the gate electrode 108a. However, in the channel diode of the second semiconductor element, the floating electrode 108b is floating, so that the on-state current is not limited by the gate electrode. Thus, the absolute value of the voltage Vf2 is less than the absolute value of the voltage Vf1.

Figure 38:
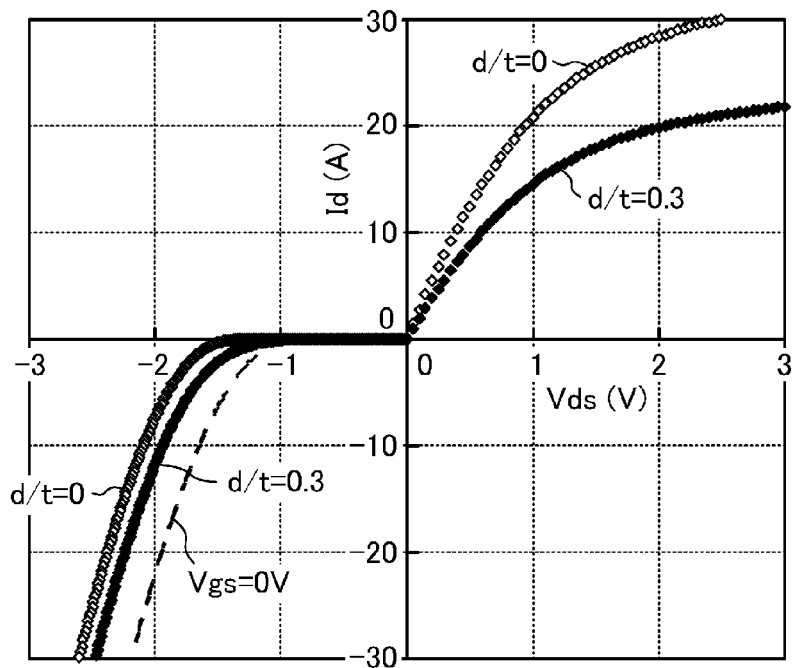
FIG. 38 is a graph illustrating the voltage current characteristic of the semiconductor device according to the second embodiment.

FIG. 38 shows a result obtained by computing the current-voltage characteristic of the semiconductor device 100 of the present embodiment at a room temperature based on a value of a current flowing through a unit cell. Note that each of the first cell 100A and the second cell 100F is about 10-μm square, and a total number t of the first cells 100A and the second cells 100F (total cell number) is 140,000. A ratio d/t of the number d of the second cells 100F to the total cell number t is 0.3. Moreover, a current-voltage characteristic of a semiconductor device in which all the cells are first cells 100A, no second cell 100F is provided and thus the ratio d/the is 0 is shown for comparison.

As illustrated in the upper right quadrant in FIG. 38, an on-state current of the semiconductor device 100 serving as a transistor is less than that of the semiconductor device in the comparative example including no second cell 100F. Note that in the upper right quadrant of FIG. 38, an example in which the voltage Vgs applied to the gate electrode 108a with reference to the first ohmic electrode 109 is 20 V is shown.

In the lower left quadrant of FIG. 38, a diode characteristic in the case where the voltage Vgs is −5 V is shown. For comparison, the characteristic in the case where the voltage Vgs is 0 V is also shown. As illustrated in the lower left quadrant, the diode characteristic in the case where the voltage Vgs is −5 V is improved compared to the diode characteristic of the transistor of the comparative example including no second cell 100F, and approximates to the characteristic in the case where the voltage Vgs is 0 V.

Figure 39:
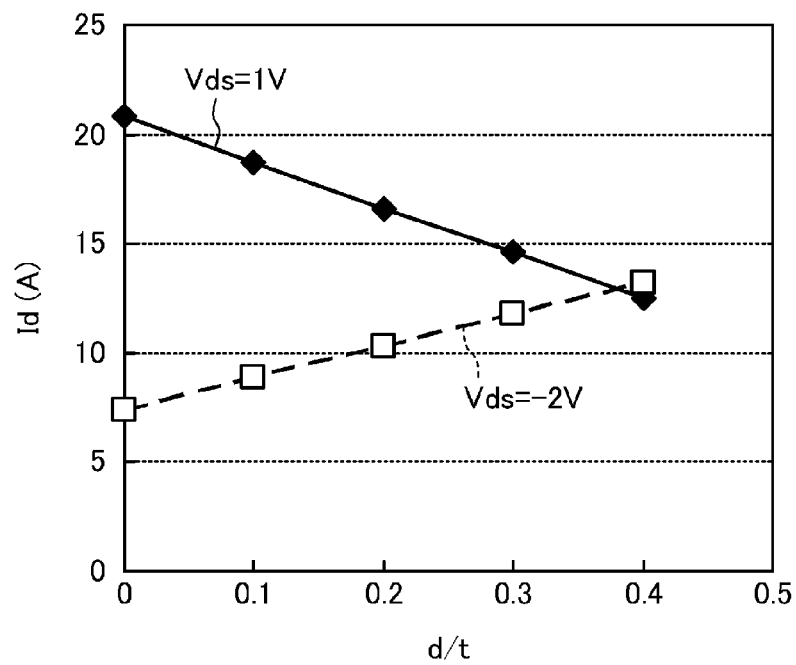
FIG. 39 is a graph illustrating the correlation of the ratio of second cells and the current characteristic.
Figure 40:
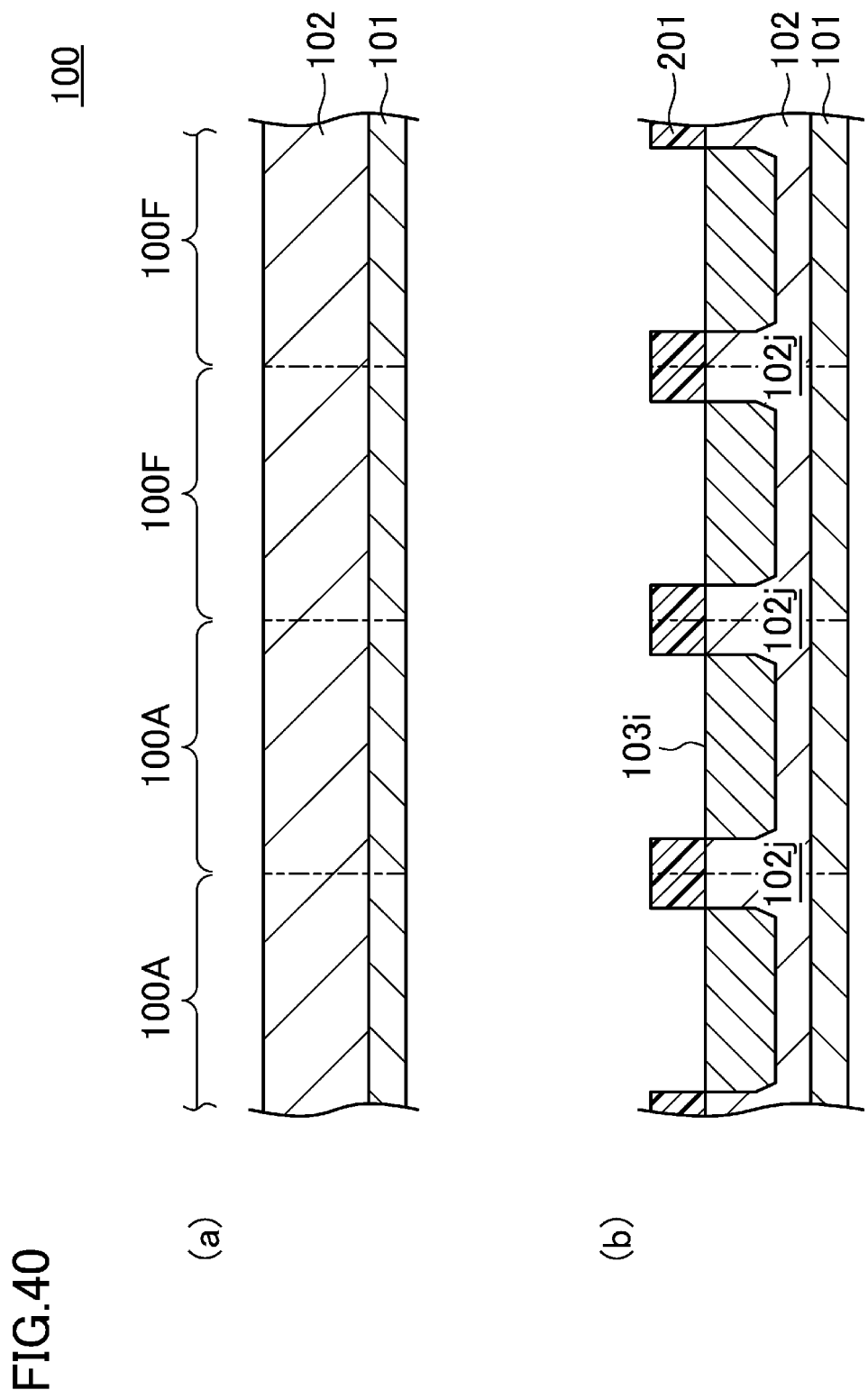
FIG. 40(a) and FIG. 40(b) are cross-sectional views illustrating steps in a method for fabricating the semiconductor device according to the second embodiment.
Figure 41:
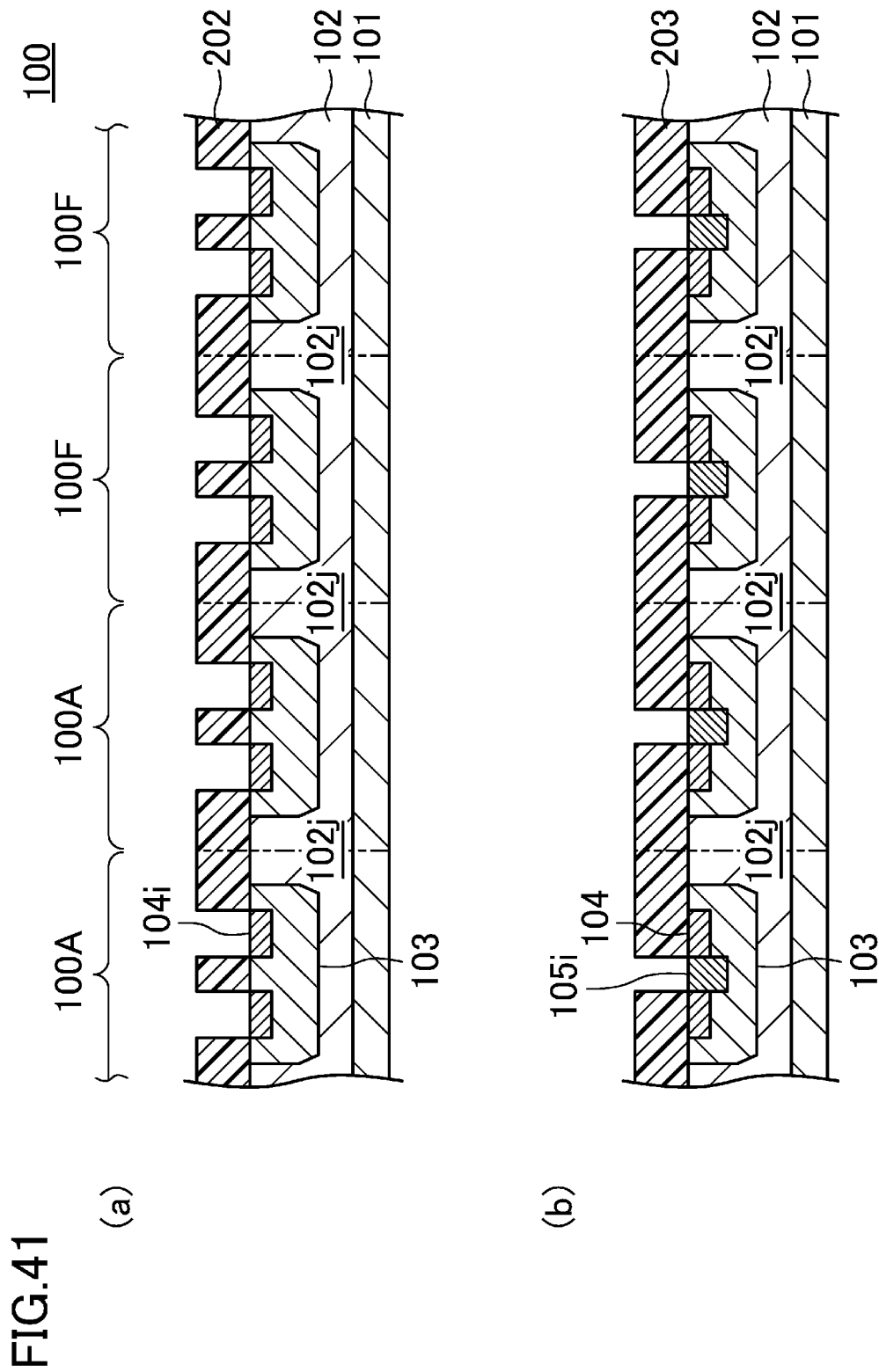
FIG. 41(a) and FIG. 41(b) are cross-sectional views illustrating steps in the method for fabricating the semiconductor device according to the second embodiment.
Figure 42:
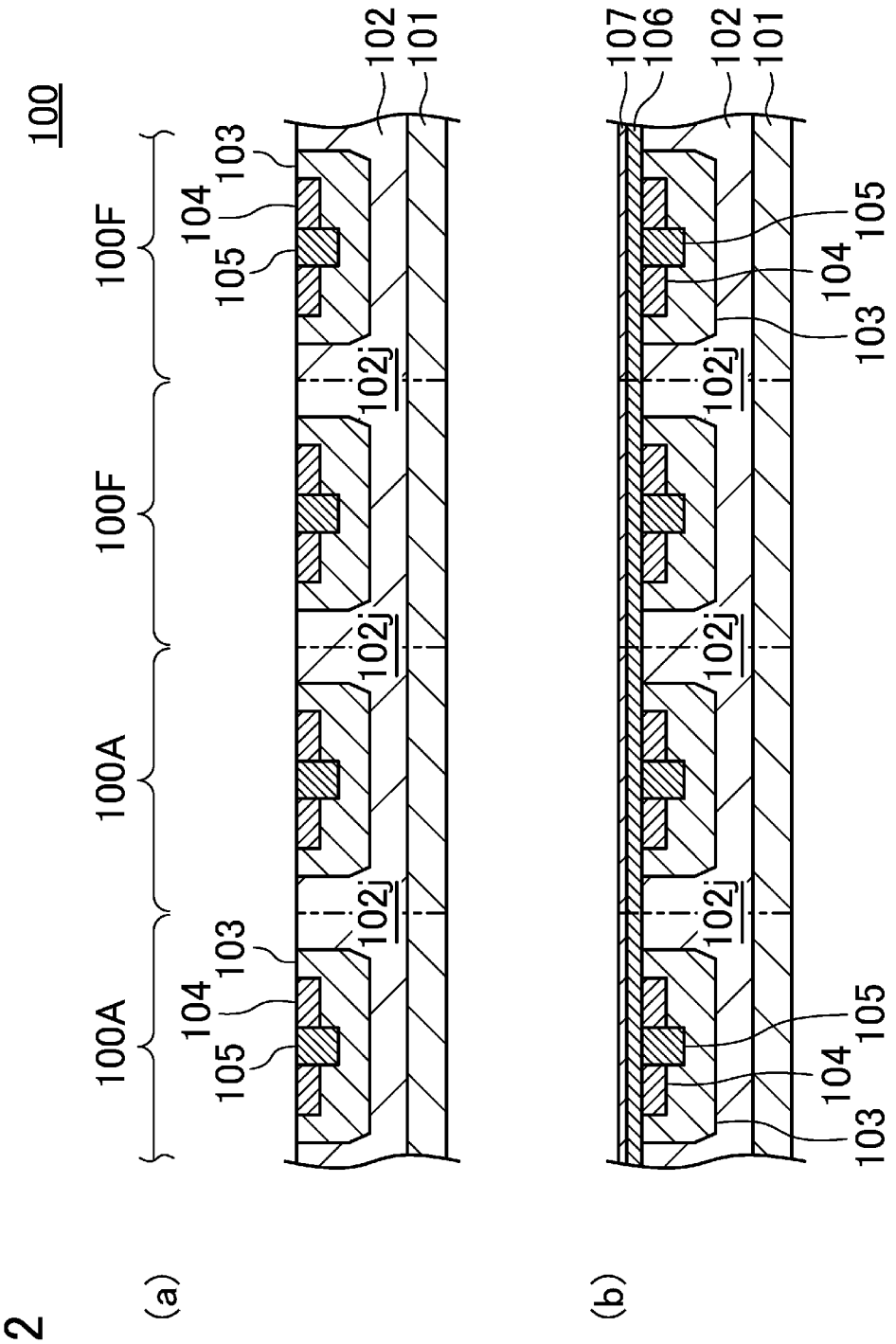
FIG. 42(a) and FIG. 42(b) are cross-sectional views illustrating steps in the method for fabricating the semiconductor device according to the second embodiment.
Figure 43:
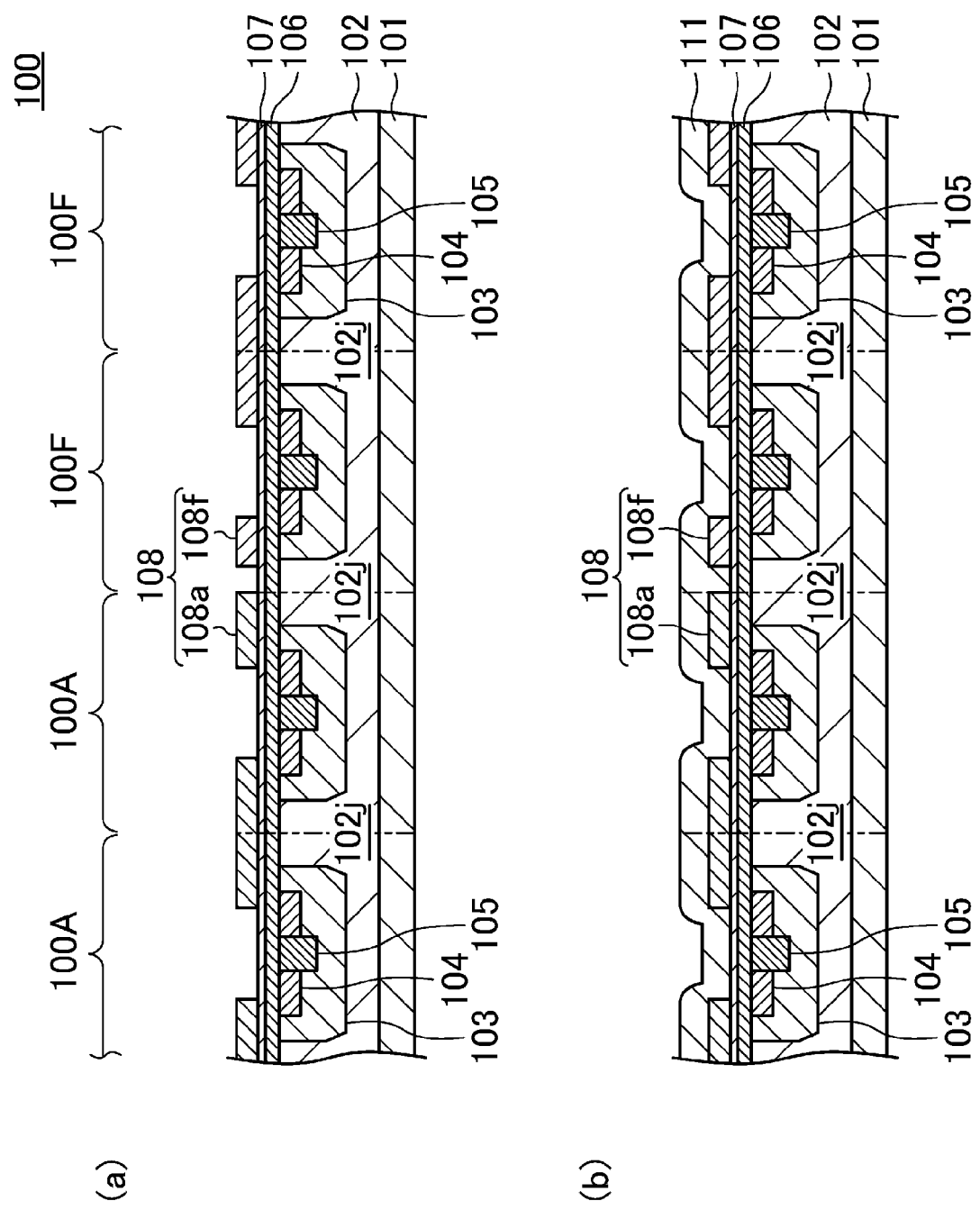
FIG. 43(a) and FIG. 43(b) are cross-sectional views illustrating steps in the method for fabricating the semiconductor device according to the second embodiment.

FIG. 39 shows the relationship between the absolute value of a drain current Id in the case where the voltage Vgs is 20 V and the voltage Vds is 1 V and the ratio d/t in the semiconductor device 100, and the relationship between the absolute value of a drain current Id in the case where the voltage Vgs is −5 V and the voltage Vds is −2 V and the ratio d/t in the semiconductor device 100, where t is the total number of cells, and d is the number of second cells 100F. In the case where the voltage Vgs is 20 V and the voltage Vds is 1 V, the semiconductor device 100 exhibits a characteristic as a transistor, and in the case where the voltage Vgs is −5 V and the voltage Vds is −2 V, the semiconductor device 100 exhibits a characteristic as a freewheeling diode. When the ratio of the second cells 100F is increased, a current which the semiconductor device 100 as a freewheeling diode allows to flow can be increased compared to the case where the ratio d/t is 0 and no second cell 100F is provided. On the other hand, a current which the semiconductor device 100 as a transistor allows to flow decreases. Thus, the value of the ratio d/t may be appropriately adjusted so that requirements of an electronic circuit to which the semiconductor device 100 is applied are satisfied, and the semiconductor device 100 effectively functions both as a transistor and a freewheeling diode.

As described above, in the semiconductor device of the present embodiment, the value of the ratio d/t is appropriately adjusted, so that a sufficient current can flow from the source to the rain even when the voltage Vgs is negative, and it is not necessary to externally provide a freewheeling diode even when the semiconductor device is used in an inverter circuit, etc.

Next, with reference to FIGS. 40-44, an example method for fabricating the semiconductor device 100 will be described. Note that specific values, materials, process conditions described below are mere examples.

First, a semiconductor substrate 101 is prepared. The semiconductor substrate 101 can be, for example, an n-type misuct 4H—SiC (0001) substrate and has a low resistance (resistivity: 0.02 Ωcm).

As illustrated in FIG. 40(a), a first silicon carbide semiconductor layer 102 having a high resistance is epitaxially grown on the semiconductor substrate 101. Before the first silicon carbide semiconductor layer 102 is formed, a buffer layer having a high impurity concentration and made of SiC may be deposited on the semiconductor substrate 101. The buffer layer may have an impurity concentration of, for example, $1 \times 10^{18}$ cm$^{-3}$ and a thickness of, for example, 1 μm. The first silicon carbide semiconductor layer 102 is made of, for example, n-type 4H—SiC. The impurity concentration and the thickness of the first silicon carbide semiconductor layer 102 may be, for example, $1 \times 10^{16}$ cm$^{-3}$ and 10 μm, respectively.

Next, as illustrated in FIG. 40(b), a mask 201 made of, for example, SiO$_2$ is formed on the first silicon carbide semiconductor layer 102, and for example, aluminum (Al) ions are implanted to the first silicon carbide semiconductor layer 102, thereby forming implantation regions 103i. The implanted ions are activated, so that the implantation regions 103i serve as first regions 103. Regions of the first silicon carbide semiconductor layer 102 other than the first regions 103 are drift regions. The impurity concentration (dopant concentration) of each first region 103 is adjusted to, for example, about $2 \times 10^{19}$ cm$^{-3}$ near a position 100 nm from a surface of the first silicon carbide semiconductor layer 102. The junction depth of a pn junction between each first region 103 and the first silicon carbide semiconductor layer 102 can be about 0.5-1 μm. In order to obtain a breakdown voltage required for the semiconductor device 100, the impurity concentration, the impurity profile, and the thickness of the first regions 103 may be determined so that punch through does not occur between each of second regions (source regions) 104 which will be formed later and the drift regions.

Next, as illustrated in FIG. 41(a), the mask 201 is removed, and ions of, for example, nitrogen are implanted to the implantation regions 103i by using a mask 202, thereby forming implantation regions 104i. The implanted ions are activated, so that the implantation regions 104i serve as the second regions 104. A so-called self-align process in which the implantation regions 104i are formed in a self-aligned manner to the implantation regions 103i may be used. In this case, the mask 201 may be left, and sidewall masks may be formed on sidewalls of the mask 201, thereby forming the mask 202.

After the ion implantation, the mask 202 is removed, and as illustrated in FIG. 41(b), Al ions are implanted by using a mask 203, thereby forming implantation regions 105i. The implanted ions are activated, so that the implantation regions 105i serve as contact regions 105.

After the mask 203 is removed, ions, of for example, nitrogen may be implanted to the regions serving as JFET regions 102j of the first silicon carbide semiconductor layer 102 as needed. In this case, the nitrogen ions may be implanted in a vertical direction of the semiconductor substrate 101 from the surface of the first silicon carbide semiconductor layer 102 to a position deeper than at least the implantation region 103i. Moreover, the impurity concentration in the ion implantation is higher than the dopant concentration of the drift regions. For example, the average impurity concentration may be set to about $1 \times 10^{17}$ cm$^{-3}$.

After these ions are implanted, a high-temperature thermal treatment (activation annealing) is performed to activate the impurities implanted to the first silicon carbide semiconductor layer 102. As illustrated in FIG. 42(a), the first regions 103, the second regions 104, and the contact regions 105 are thus formed. Each first region 103 may have a depth of, for example, 550 nm and an average dopant concentration of about $2 \times 10^{19}$ cm$^{-3}$. Each second region 104 may have a depth of, for example, 250 nm and an average dopant concentration of about $5 \times 10^{19}$ cm$^{-3}$. Each contact region 105 may have a depth of, for example, 400 nm, and an average dopant concentration of about $1 \times 10^{20}$ cm$^{-3}$. Here, "depth" of a region refers to, for example, a position at which the concentration the region is equal to the impurity concentration of a region adjacent to the region. Moreover, with reference to a constant value, the depth may be defined as a position at the constant value. In order to purify the surface of the first silicon carbide semiconductor layer 102 after the activation annealing, a top surface of the first silicon carbide semiconductor layer 102 may be removed.

Next, as illustrated in FIG. 42(b), a second silicon carbide semiconductor layer 106 is epitaxially grown on an upper surface of the first silicon carbide semiconductor layer 102 including the first regions 103, the second regions 104, and the contact regions 105. The second silicon carbide semiconductor layer 106 has an average dopant concentration of, for example, about $1 \times 10^{18}$ cm$^{-3}$ and a thickness of, for example, 90 nm.

Next, an insulating film 107 is formed on the second silicon carbide semiconductor layer 106. When the insulating film 107 is formed by thermal oxidation, an upper portion of the second silicon carbide semiconductor layer 106 becomes the insulating film 107. Thus, the second silicon carbide semiconductor layer 106 is deposited to have a thickness in consideration of elimination due to the thermal oxidation. In the present embodiment, the final thickness of the second silicon carbide semiconductor layer 106 is 40 nm, and at the time of deposition, the thickness of the second silicon carbide semiconductor layer 106 is 90 nm which is thicker than the final thickness by about 50 nm. The thickness of the insulating film 107 is about 70 nm. Nitridation, etc. may be performed on an interface between the insulating film 107 and the second silicon carbide semiconductor layer 106 as needed. The nitridation may be performed by, for example, annealing in a nitric oxide (NO) gas high-temperature atmosphere.

Next, as illustrated in FIG. 43(a), a conductive film 108 is formed on a surface of the insulating film 107. The conductive film 108 is a polysilicon film doped with, for example, phosphorus of about $7 \times 10^{20}$ cm$^{-3}$ and having a thickness of about 500 nm. After the conductive film 108 is formed, dry etching is performed by using a mask, thereby removing unnecessary portions of the conductive film 108. In this way, a gate electrode 108a is formed in each of first cells 100A, and a floating electrode 108f is formed in each of second cells 100F. Note that a portion of the conductive film 108 formed in each second cell 100F may be removed so that the floating electrode 108f is not left.

Next, as illustrated in FIG. 43(b), an interlayer insulating film 111 made of, for example, SiO$_2$ is deposited by CVD to cover the first silicon carbide semiconductor layer 102 on which the conductive film 108 has been formed. The thickness of the interlayer insulating film 111 is, for example, 1 µm.

Next, as illustrated in FIG. 44(a), dry etching is performed by using a mask having openings at positions where ohmic electrodes will be formed, thereby selectively removing the first interlayer insulating film 111 to form contact holes 111c. After this, a nickel film having a thickness of, for example, 100 nm is formed on the interlayer insulating film 111 in which the contact holes 111c have been formed, and a thermal treatment at a temperature of, for example, 950° C. in an inert atmosphere for 5 minutes is performed, thereby causing reaction between the nickel film and silicon carbide to form first ohmic electrodes 109 made of nickel silicide. Each first ohmic electrode 109 is in ohmic contact with the second region 104 and the contact region 105. Next, after the nickel film on the interlayer insulating film 111 is removed by etching, for example, nickel is deposited on a back face of the semiconductor substrate 101, and a thermal treatment is similarly performed to cause reaction between the nickel and the silicon carbide, thereby forming a second ohmic electrode 110.

Next, as illustrated in FIG. 44(b), on the interlayer insulating film 111 and in the contact holes 111c, a conductive film made of an aluminum film and having a thickness of about 4 µm is deposited and etched to have a desirable pattern. An upper electrode 112 connected to the first ohmic electrodes 109 via contact portions passing through the interlayer insulating film 111 can be obtained. Although not shown, a gate interconnect (or gate pad) in contact with the gate electrode 108a is formed at a chip end. Moreover, titanium (Ti)/nickel (Ni)/silver (Ag) as a back electrode 113 for die bonding are deposited in this order on the back face of the second ohmic electrode 110.

Although an example in which the conductive film is filled in the contact holes 111c has been described, the conductive film does not need to be filled in the contact holes 111c, but the conductive film may be formed to successively cover at least bottom surfaces and the wall surfaces of the contact holes 111c. Portions of the conductive film in the contact holes 111c may be formed separately from portions of the conductive film above the interlayer insulating film 111.

In the method for fabricating the semiconductor device of the present embodiment, the first cells 100A and the second cells 100F can be formed in the same process except for a mask pattern used to selectively remove the conductive film 108. Thus, the first cells 100A and the second cells 100F can be easily formed differently. Moreover, the ratio between the first cell 100A and the second cell 100F can be easily changed.

The semiconductor device 100 satisfies the basic characteristic as a transistor, and at the same time, has a function as a unipolar channel diode. For example, the threshold voltage of the semiconductor device 100 serving as a transistor can be about 3 V at the room temperature. The threshold voltage in the range from about 1 V to about 10 V can be easily realized. the threshold voltage at the room temperature may be 2-8 V for ease of use. The breakdown voltage, which is determined by the dopant concentration mainly of the first silicon carbide semiconductor layer 102, can be about 1200 V at the room temperature. Even when the absolute value of the voltage Vds is less than or equal to 2 V, the on-state current of the diode at a voltage Vgs of 0 V can ensure a current value substantially equal to the current in the case where the transistor is on.

In the semiconductor devices of the first and second embodiments, the impurity concentration of each semiconductor region can be arbitrarily modified to obtain desirable characteristics. In the first and second embodiments, an example in which silicon carbide is 4H—SiC has been described. However, the silicon carbide may be another polytype such as 6H—SiC, 3C—SiC, or 15R—SiC. Although an example in which the principal surface is a miscut (0001) plane, the plane orientation of the principal surface may be the (11-20) plane, the (1-100) plane, the (000-1) plane, etc. A miscut plane of these planes may be the principal surface. The substrate may be made of silicon, and a drift layer may have a hetero junction made of silicon carbide (3C—SiC).

Both second cells 100B including first control electrodes 108b electrically connected to first ohmic electrodes 109 and second cells 100F including floating electrodes 108f may be provided. In this case, at least some of the second cells 100F do not need to include floating electrodes 108f. Moreover, at least one of cell types that are a third cell 100C, a fourth cell 100D, a fifth cell 100E, and a sixth cell 100G may be further included.

INDUSTRIAL APPLICABILITY

The semiconductor device of the present disclosure can limit a reduction in a current flowing from the source to the drain to a lesser degree even when the semiconductor device is in an OFF state by the negative gate bias, and can be widely applied to a semiconductor device using SiC, and various control device and drive device using the same, such as inverter circuit using the same.

DESCRIPTION OF REFERENCE CHARACTERS

100 Semiconductor Device
100A First Cell
100B Second Cell
100C Third Cell
100D Fourth Cell
100E Fifth Cell
100F Second Cell
100G Sixth Cell
101 Semiconductor Substrate
102 First Silicon Carbide Semiconductor Layer
102j JFET Region
103 First Region
103i Implantation Region
104 Second Region
104i Implantation Region
105 Contact Region
105i Implantation Region
106 Second Silicon Carbide Semiconductor Layer
107 Insulating Film
108 Conductive Film
108a Gate Electrode
108b First Control Electrode
108c Second Control Electrode
108d Connection Electrode
108f Floating Electrode
108s Silicide Layer
109 F First Ohmic Electrode
110 Second Ohmic Electrode
111 Interlayer insulating film
111c Contact Hole
112 Upper Electrode
113 Back Electrode
201 Mask
202 Mask
203 Mask
500 Semiconductor Device
501 Semiconductor Substrate
502 First Silicon Carbide Semiconductor Layer
503 Body Region
504 Source Region
505 Channel Layer
506 Gate Insulating Film
507 Contact Region
511 Source Electrode
512 Gate Electrode
513 Drain Electrode

The invention claimed is:

1. A semiconductor device comprising:
a first cell; and
a second cell, wherein
each of the first cell and the second cell includes:
a first silicon carbide semiconductor layer of a first conductivity type,
a first region of a second conductivity type provided in the first silicon carbide semiconductor layer,
a second region of the first conductivity type provided in the first region,
a second silicon carbide semiconductor layer which is provided on and in contact with the first silicon carbide semiconductor layer and is in contact with the first region and the second region,
a first ohmic electrode which is in ohmic contact with the second region,
an insulating film provided on the second silicon carbide semiconductor layer,
a conductive film provided on the second silicon carbide semiconductor layer with the insulating film provided between the second silicon carbide semiconductor layer and the conductive film,
an interlayer insulating film provided on the second silicon carbide semiconductor layer, and
an upper electrode provided on the interlayer insulating film,
wherein the conductive film of the first cell is a gate electrode,
the conductive film of the second cell is insulated from the gate electrode and is electrically connected to the first ohmic electrode of the second cell,
the first ohmic electrode of the first cell is electrically connected to the first ohmic electrode of the second cell,
the upper electrode is electrically connected to the first ohmic electrode, and
the conductive film of the second cell is in contact with the upper electrode.

2. The semiconductor device of claim 1, wherein
the upper electrode includes a contact portion which passes through the interlayer insulating film and is in contact with the first ohmic electrode, and
the conductive film of the second cell is in contact with the contact portion.

3. The semiconductor device of claim 2, wherein
the second cell includes a silicide layer in at least part of an upper surface of the conductive film,
the silicide layer surrounds the contact portion, and
in the second cell,
part of the contact portion above the conductive film has a larger width than part of the contact portion below the conductive film, and
the part of the contact portion above the conductive film is in contact with the silicide layer.

4. The semiconductor device of claim 1, further comprising:
a third cell, wherein
the third cell includes
a first silicon carbide semiconductor layer,
a first region,
a second region,
a second silicon carbide semiconductor layer,
a first ohmic electrode,
an insulating film, and
a conductive film provided on the second silicon carbide semiconductor layer with the insulating film provided between the second silicon carbide semiconductor layer and the conductive film, and
the conductive film of the third cell is in contact with the conductive film of the second cell, is separated from the gate electrode and is not in contact with the upper electrode.

5. The semiconductor device of claim 1, further comprising:
a fourth cell provided between the first cell and the second cell, wherein the fourth cell includes
a first silicon carbide semiconductor layer,
a first region,
a second silicon carbide semiconductor layer,
an insulating film, and
a conductive film provided on the second silicon carbide semiconductor layer with the insulating film provided between the second silicon carbide semiconductor layer and the conductive film, and
the conductive film of the fourth cell is electrically connected to the conductive film of the second cell, is separated from the gate electrode and is in contact with the upper electrode.

6. The semiconductor device of claim 5, wherein
the first region of the fourth cell is integrated with the first region of the second cell adjacent to the fourth cell.

7. The semiconductor device of claim 5, further comprising:
a fifth cell provided between the first cell and the fourth cell, wherein
the fifth cell includes
a first silicon carbide semiconductor layer,
a second silicon carbide semiconductor layer, and
an insulating film, and
no conductive film is provided between the insulating film of the fifth cell and the upper electrode.

8. The semiconductor device of claim 7, wherein
the fourth cell includes the first region, and the fifth cell includes a first region, and
the first region of the fifth cell is integrated with the first region of the fourth cell adjacent to the fifth cell.

9. The semiconductor device of claim 5, wherein
the conductive film of the second cell is not in contact with the upper electrode.

10. The semiconductor device of claim 1, further comprising:
a second ohmic electrode facing the first ohmic electrode across the first silicon carbide semiconductor layer, wherein
letting Vds be an electric potential applied to the second ohmic electrode with reference to the first ohmic electrode, Vgs be a voltage applied to the gate electrode with reference to the first ohmic electrode, and Vth be a threshold voltage of the gate electrode, then
the threshold voltage Vth is higher than 0 V, and
when the voltage Vgs is less than the threshold voltage Vth, and the voltage Vds is less than 0 V, gradually reducing the voltage Vds allows a current to flow from the first ohmic electrode to the second ohmic electrode via the second silicon carbide semiconductor layer before the current starts flowing from the first region to the first silicon carbide semiconductor layer in each of the first cell and the second cell.

11. The semiconductor device of claim 10, wherein
when the voltage Vgs is greater than or equal to the threshold voltage Vth, and the voltage Vds is greater than 0, a current flows from the second ohmic electrode to the first ohmic electrode in the first cell, and no current flows in the second cell.

12. A semiconductor device comprising:
a first cell; and
a second cell, wherein
each of the first cell and the second cell includes:
a first silicon carbide semiconductor layer of a first conductivity type,
a first region of a second conductivity type provided in the first silicon carbide semiconductor layer,
a second region of the first conductivity type provided in the first region,
a second silicon carbide semiconductor layer which is provided on and in contact with the first silicon carbide semiconductor layer and is in contact with the first region and the second region,
a first ohmic electrode which is in ohmic contact with the second region,
an insulating film provided on the second silicon carbide semiconductor layer,
an interlayer insulating film provided on the second silicon carbide semiconductor layer,
an upper electrode provided on the interlayer insulating film, and
a conductive film provided on the second silicon carbide semiconductor layer with the insulating film provided between the second silicon carbide semiconductor layer and the conductive film,
wherein the upper electrode is electrically connected to the first ohmic electrode,
the conductive film of the first cell is a gate electrode,
the conductive film of the second cell is insulated from the gate electrode and the first ohmic electrode of the second cell, and
no portion of the conductive film of the second cell is in contact with the gate electrode.

13. The semiconductor device of claim 12, further comprising:
a sixth cell provided between the first cell and the second cell, and
the sixth cell includes
a first silicon carbide semiconductor layer including a first region and a second region,
a second silicon carbide semiconductor layer,
a first ohmic electrode, and
an insulating film, and
no conductive film is provided between the second silicon carbide semiconductor layer of the sixth cell and the upper electrode.

14. The semiconductor device of claim 12, further comprising:
a second ohmic electrode facing the first ohmic electrode across the first silicon carbide semiconductor layer, wherein
letting Vds be an electric potential applied to the second ohmic electrode with reference to the first ohmic electrode, Vgs be a voltage applied to the gate electrode with reference to the first ohmic electrode, and Vth be a threshold voltage of the gate electrode, then
the threshold voltage Vth is higher than 0 V, and
when the voltage Vgs is less than the threshold voltage Vth, and the voltage Vds is less than 0 V, gradually reducing the voltage Vds allows a current to flow from the first ohmic electrode to the second ohmic electrode via the second silicon carbide semiconductor layer before the current starts flowing from the first region to the first silicon carbide semiconductor layer in each of the first cell and the second cell.

15. The semiconductor device of claim 14, wherein
when the voltage Vgs is greater than or equal to the threshold voltage Vth, and the voltage Vds is greater than 0, a current flows from the second ohmic electrode to the first ohmic electrode in the first cell, and no current flows in the second cell.

16. The semiconductor device of claim 12, wherein
in operation, the first cell functions as a transistor and the second cell functions as a diode.

17. A semiconductor device comprising:
a first cell; and
a second cell, wherein
each of the first cell and the second cell includes:
- a first silicon carbide semiconductor layer of a first conductivity type,
- a first region of a second conductivity type provided in the first silicon carbide semiconductor layer,
- a second region of the first conductivity type provided in the first egion,
- a second silicon carbide semiconductor layer which is provided on and in contact with the first silicon carbide semiconductor layer and is in contact with the first region and the second region,
- a first ohmic electrode which is in ohmic contact with the second region,
- an insulating film provided on the second silicon carbide semiconductor layer,
- an interlayer insulating film provided on the second silicon carbide semiconductor layer, and
- an upper electrode provided on the interlayer insulating film, wherein the upper electrode is electrically connected to the first ohmic electrode,
the first cell includes a gate electrode on the second silicon carbide semiconductor layer with the insulating film provided between the second silicon carbide semiconductor layer and the gate electrode, and
no portion between the second silicon carbide semiconductor layer and the interlayer insulating film of the second cell includes a conductive film.

18. The semiconductor device of claim 17, further comprising:
a second ohmic electrode facing the first ohmic electrode across the first silicon carbide semiconductor layer, wherein
letting Vds be an electric potential applied to the second ohmic electrode with reference to the first ohmic electrode, Vgs be a voltage applied to the gate electrode with reference to the first ohmic electrode, and Vth be a threshold voltage of the gate electrode, then
the threshold voltage Vth is higher than 0 V, and
when the voltage Vgs is less than the threshold voltage Vth, and the voltage Vds is less than 0 V, gradually reducing the voltage Vds allows a current to flow from the first ohmic electrode to the second ohmic electrode via the second silicon carbide semiconductor layer before the current starts flowing from the first region to the first silicon carbide semiconductor layer in each of the first cell and the second cell.

19. The semiconductor device of claim 18, wherein
when the voltage Vgs is greater than or equal to the threshold voltage Vth, and the voltage Vds is greater than 0, a current flows from the second ohmic electrode to the first ohmic electrode in the first cell, and no current flows in the second cell.

* * * * *